US009228258B2

(12) United States Patent
Fukunaga et al.

(10) Patent No.: US 9,228,258 B2
(45) Date of Patent: Jan. 5, 2016

(54) HARD-COATED MEMBER AND ITS PRODUCTION METHOD, AND INDEXABLE ROTARY TOOL COMPRISING IT

(75) Inventors: Yuuzoh Fukunaga, Narita (JP); Kazuyuki Kubota, Narita (JP)

(73) Assignee: Hitachi Tool Engineering, Ltd., Tokyo (JP)

(*) Notice: Subject to any disclaimer, the term of this patent is extended or adjusted under 35 U.S.C. 154(b) by 105 days.

(21) Appl. No.: 14/008,463

(22) PCT Filed: Mar. 27, 2012

(86) PCT No.: PCT/JP2012/058015
§ 371 (c)(1),
(2), (4) Date: Sep. 27, 2013

(87) PCT Pub. No.: WO2012/133461
PCT Pub. Date: Oct. 4, 2012

(65) Prior Publication Data
US 2014/0017469 A1 Jan. 16, 2014

(30) Foreign Application Priority Data

Mar. 31, 2011 (JP) .................................. 2011-081223
Sep. 5, 2011 (JP) .................................. 2011-193352
Dec. 28, 2011 (JP) .................................. 2011-289249

(51) Int. Cl.
C23C 16/36 (2006.01)
C23C 16/02 (2006.01)
(Continued)

(52) U.S. Cl.
CPC . *C23C 16/36* (2013.01); *B05D 5/00* (2013.01); *C23C 16/029* (2013.01);
(Continued)

(58) Field of Classification Search
USPC ............ 51/307, 309; 428/216, 336, 697, 698,
428/699, 701, 702, 704; 427/255.19,
427/255.23, 255.28, 255.31, 255.39,
427/255.391, 255.394, 419.1, 419.2, 419.7
See application file for complete search history.

(56) References Cited

U.S. PATENT DOCUMENTS 5,310,607 A * 5/1994 Schulz et al. ................. 428/697
5,942,318 A * 8/1999 Soderberg et al. ............ 428/216
(Continued)

FOREIGN PATENT DOCUMENTS

JP 2000-158205 * 6/2000
JP 2000-158209 A 6/2000
(Continued)

OTHER PUBLICATIONS

Communication, dated Oct. 1, 2013, issued by the Japanese Patent Office, in counterpart Application No. 2013-507641.

Primary Examiner — Archene Turner
(74) Attorney, Agent, or Firm — Sughrue Mion, PLLC

(57) ABSTRACT

A hard-coated member comprising a substrate made of cemented carbide or high-speed steel and a titanium carbonitride layer formed on the substrate by a chemical vapor deposition method, the titanium carbonitride layer comprising first to third layers each having a columnar crystal structure in this order from the side of the substrate, the second layer being smaller than the first layer in carbon concentration, and the third layer being smaller than the second layer in carbon concentration, and an indexable rotary tool comprising it. The first layer is formed by using a starting material gas comprising a $TiCl_4$ gas, an $N_2$ gas, a $C_2$-$C_5$ hydrocarbon gas and an $H_2$ gas, the second layer is formed by using a starting material gas comprising a $TiCl_4$ gas, an $N_2$ gas, an organic cyanide gas, a $C_2$-$C_5$ hydrocarbon gas, and an $H_2$ gas, and the third layer is formed by using a starting material gas comprising a $TiCl_4$ gas, an $N_2$ gas, an organic cyanide gas, whose amount is smaller than in the second layer, and an $H_2$ gas.

16 Claims, 14 Drawing Sheets

(51) Int. Cl.
  *C23C 16/40* (2006.01)
  *C23C 28/04* (2006.01)
  *C23C 30/00* (2006.01)
  *B05D 5/00* (2006.01)
  *C23C 16/455* (2006.01)

(52) U.S. Cl.
  CPC ........ *C23C 16/403* (2013.01); *C23C 16/45523* (2013.01); *C23C 28/042* (2013.01); *C23C 28/044* (2013.01); *C23C 28/048* (2013.01); *C23C 30/005* (2013.01); *Y10T 428/24967* (2015.01); *Y10T 428/24975* (2015.01); *Y10T 428/25* (2015.01)

(56) References Cited

U.S. PATENT DOCUMENTS

| | | | |
|---|---|---|---|
| 6,767,627 B2 * | 7/2004 | Morikawa et al. | 428/336 |
| 7,172,807 B2 | 2/2007 | Fukano et al. | |
| 7,906,230 B2 | 3/2011 | Watanabe et al. | |
| 7,939,181 B2 * | 5/2011 | Ramm et al. | 428/701 |
| 8,323,738 B2 | 12/2012 | Watanabe et al. | |
| 8,741,428 B2 * | 6/2014 | Paseuth et al. | 428/698 |
| 2004/0161639 A1 | 8/2004 | Fukano et al. | |
| 2008/0057280 A1 | 3/2008 | Watanabe et al. | |
| 2011/0135822 A1 | 6/2011 | Watanabe et al. | |

FOREIGN PATENT DOCUMENTS

| | | |
|---|---|---|
| JP | 2001-170804 A | 6/2001 |
| JP | 2001-322008 A | 11/2001 |
| JP | 2005-118925 A | 5/2005 |
| JP | 2005-153098 A | 6/2005 |
| JP | 2005-212047 A | 8/2005 |
| JP | 2005-256095 A | 9/2005 |
| JP | 2006-205301 A | 8/2006 |
| JP | 2006-231433 A | 9/2006 |
| JP | 2006-315154 A | 11/2006 |
| JP | 2008-087150 A | 4/2008 |
| JP | 2008-105135 A | 5/2008 |
| JP | 2012-076155 A | 4/2012 |

* cited by examiner

Transverse Cross Section Diameter

HARD-COATED MEMBER AND ITS PRODUCTION METHOD, AND INDEXABLE ROTARY TOOL COMPRISING IT

CROSS REFERENCE TO RELATED APPLICATIONS

This is a National Stage of International Application No. PCT/JP2012/058015, filed Mar. 27, 2012 (claiming priority from Japanese Patent Application No. 2011-081223, filed Mar. 31, 2011, Japanese Patent Application No. 2011-193352, filed Sep. 5, 2011 and Japanese Patent Application No. 2011-289249, filed Dec. 28, 2011), the contents of which are incorporated herein by reference in their entirety.

FIELD OF THE INVENTION

The present invention relates to a hard-coated member comprising a hard coating having high hardness and wear resistance as well as high adhesion to a substrate of cemented carbide or high-speed steel and an upper layer, a method for producing such a hard-coated member by a chemical vapor deposition method, and an indexable rotary tool comprising such a hard-coated member.

BACKGROUND OF THE INVENTION

Surface-coated cutting tools having single-layer or multi-layer hard coatings of TiC, TiN, TiCN, $Al_2O_3$, etc. on the surfaces of substrates made of cemented carbides, cermets, ceramics, etc. have been conventionally used for the cutting of metals, etc. Because such surface-coated cutting tools are used under increasingly severer conditions (for example, those subject to large shock such as heavy, intermittent cutting, etc.), desire is mounting on cutting tools having hard coatings durable to large shock.

JP 2008-87150 A discloses a coated cutting tool comprising a TiN film, a columnar crystal TiCN film having an average grain size (measured in parallel to a substrate surface) of 0.05-0.5 μm, and a peak 2θ of the X-ray diffraction of a (422) plane measured using CuKα rays in a range of 121.5-122.6°, an aluminum oxide film and a TiN film, in this order on a substrate surface. In the columnar crystal TiCN film, C/(C+N) is 0.70-0.90. In JP 2008-87150 A, a starting material gas for the columnar crystal TiCN film comprises a $TiCl_4$ gas, a $CH_3CN$ gas, an $H_2$ gas, and a linear hydrocarbon gas having 2-20 carbon atoms excluding $CH_4$, such as $C_2H_6$, $C_2H_4$ or $C_3H_6$. Because the starting material gas contains a linear hydrocarbon gas, the columnar crystal TiCN film has as small an average grain size as 0.05-0.5 μm, and as high a carbon concentration [C/(C+N)] as 0.70-0.90, thereby having high hardness and excellent wear resistance. However, it has been found that because the columnar crystal TiCN film is a single layer having a high carbon concentration, it has insufficient adhesion to the aluminum oxide film.

JP 2005-212047 A discloses a surface-coated member having a fine titanium carbonitride layer, an upper titanium carbonitride layer, and an aluminum oxide layer formed in this order on a substrate by a chemical vapor deposition method. JP 2005-212047 A describes that by using a reaction gas comprising a $TiCl_4$ gas, a $CH_3CN$ gas, an $N_2$ gas and an $H_2$ gas to form the titanium carbonitride layer, and by making the proportion of a $CH_3CN$ gas higher in the reaction gas for the upper titanium carbonitride layer than in the reaction gas for the fine titanium carbonitride layer, the upper titanium carbonitride layer has larger crystal grain sizes than in the fine titanium carbonitride layer. However, because the method described in JP 2005-212047 A provides the upper titanium carbonitride layer with a higher carbon concentration than that of the lower titanium carbonitride layer, the upper titanium carbonitride layer has insufficient adhesion to the $Al_2O_3$ film. Accordingly, the surface-coated tool described in JP 2005-212047 A has a short life.

JP 2005-153098 A discloses a surface-coated cutting tool comprising at least a TiCN film of stripe-shaped crystals grown perpendicularly to the substrate, and an $Al_2O_3$ film, which are formed in this order on a substrate made of a hard alloy such as cemented carbide, the TiCN film comprising a carbon-rich TiCN film having a C/N ratio of 1.5-4 and in contact with the $Al_2O_3$ film, and a nitrogen-rich TiCN film below the carbon-rich TiCN film and having a C/N ratio of 0.2-0.7, and two or more peaks of the TiCN film existing in a range of a diffraction angle 2θ=60.4-61.5° in an X-ray diffraction pattern. JP 2005-153098 A describes that because the carbon-rich TiCN film exposed after the peeling of the $Al_2O_3$ layer has high wear resistance, the tool has stable wear resistance and breakage resistance without suffering rapid wear. JP 2005-153098 A also describes that stripe-shaped crystals in the carbon-rich TiCN film desirably have a larger average crystal width than that of stripe-shaped crystals in the nitrogen-rich TiCN film for higher adhesion in their interface. However, like JP 2005-212047 A, this surface-coated cutting tool comprises the carbon-rich TiCN film on the nitrogen-rich TiCN film, failing to have sufficient adhesion to the $Al_2O_3$ layer. In addition, it has poor wear resistance and thus a short life, because of the lack of a layer corresponding to the second layer in the present invention.

JP 2006-315154 A discloses a cutting tool of surface-coated cermet comprising a modified titanium carbonitride layer vapor-deposited on a tool substrate. The modified titanium carbonitride layer is formed by forming a conventional TiCN layer on a thin TiCN film having an average thickness of 0.02-0.5 μm. Because a starting material gas for the thin TiCN film comprises $TiCl_4$, $C_3H_6$, $N_2$ and $H_2$, the thin TiCN film corresponds to the first layer in the present invention. Also, the conventional TiCN layer formed by a starting material gas comprising $TiCl_4$, $CH_3CN$, $N_2$ and $H_2$ corresponds to the third layer in the present invention. Because the modified titanium carbonitride layer of JP 2006-315154 A comprises the conventional TiCN layer (corresponding to the third layer) directly formed on the thin TiCN film (corresponding to the first layer) without the second layer in the present invention, it has insufficient hardness and wear resistance. Accordingly, the cutting tool of JP 2006-315154 A has a short life.

OBJECTS OF THE INVENTION

Accordingly, an object of the present invention is to provide a hard-coated member having high hardness and wear resistance, which comprises a hard coating having high adhesion to a substrate made of cemented carbide or high-speed steel and an upper layer.

Another object of the present invention is to provide a method for producing such a hard-coated member.

A further object of the present invention is to provide an indexable rotary tool equipped with such a hard-coated member.

SUMMARY OF THE INVENTION

The hard-coated member of the present invention comprises a substrate made of cemented carbide or high-speed steel, and a hard coating formed on the substrate by a chemical vapor deposition method, the hard coating comprising a titanium carbonitride layer having first to third layers each having a columnar crystal structure and an upper layer in this order from the side of the substrate, (a) in the titanium carbonitride layer, the first layer having a carbon concentration of 13-22% by mass, the second layer having a carbon concentration of 12-21% by mass, the third layer having a carbon concentration of 9-15% by mass, the carbon concentration in the second layer being lower than the carbon concentration in the first layer by 0.1% or more by mass, and the carbon concentration in the third layer being lower than the carbon concentration in the second layer by 0.5% or more by mass, (b) the upper layer being (i) a bonding layer formed on the third layer, and a hard oxide layer of Al and/or Cr formed on the bonding layer, or (ii) a hard layer formed on the third layer and comprising Ti and/or Cr, and C and/or N as indispensable elements, and at least one element selected from the group consisting of Al, Si, B, Zr and V as an optional element. The first layer having a high carbon concentration has high adhesion to the substrate, the third layer having a low carbon concentration has high adhesion to the upper layer, and the second layer having an intermediate carbon concentration has high hardness and wear resistance.

Because the first and second layers have as high carbon concentrations as 13-22% by mass and 12-21% by mass, respectively, the titanium carbonitride layer has a fine columnar crystal structure having excellent wear resistance with high hardness. Also, because the carbon concentration in the first layer is higher by 0.1% or more by mass than the carbon concentration in the second layer, the first layer in the titanium carbonitride layer has high adhesion to the substrate. Further, because the carbon concentration in the third layer is 9-15% by mass, lower than in the second layer by 0.5% or more by mass, the third layer has high adhesion to the upper layer.

In an embodiment of the present invention, the first layer is made of titanium carbonitride comprising 68-84.5% by mass of titanium, 13-22% by mass of carbon and 2.5-10% by mass of nitrogen, the second layer is made of titanium carbonitride comprising 69-85.5% by mass of titanium, 12-21% by mass of carbon and 2.5-10% by mass of nitrogen, and the third layer is made of titanium carbonitride comprising 71-86% by mass of titanium, 9-15% by mass of carbon and 5-14% by mass of nitrogen.

An atomic ratio C/(C+N) of the carbon concentration (C) to the total (C+N) of the carbon concentration (C) and the nitrogen concentration (N) is preferably 0.65-0.9 in the first layer, 0.65-0.85 in the second layer, and 0.5-0.7 in the third layer.

Each of the second and third layers preferably has a thickness of 1 μm or more. Because the second layer is as thick as 1 μm or more, the hard-coated member of the present invention has sufficient life. Also, because the third layer is as thick as 1 μm or more, it has high hardness and high adhesion to the upper layer because of a columnar crystal structure continuous from the second layer.

The first layer preferably has a thickness of 0.01-2 μm. The second layer preferably has a thickness of 1-20 μm. The third layer preferably has a thickness of 1-10 μm. Accordingly, a thickness ratio to the thickness of the overall titanium carbonitride layer is preferably 0.5-8% in the first layer, 40-80% in the second layer, and 15-60% in the third layer. Because each layer is not necessarily completely flat, what is simply called "thickness" means "average thickness." This is true of the above upper layer.

Columnar crystals in each of the first to third layers preferably have an average transverse cross section diameter of 0.01-0.5 μm. Because the first to third layers have fine columnar crystals, the titanium carbonitride layer has excellent wear resistance.

Part of Ti in the second layer may be substituted by at least one metal element selected from the group consisting of Zr, V, Cr, Si, B and Al, in a proportion of 0.2-10% by mass to 100% by mass of the second layer. Also, part of Ti in the third layer may be substituted by at least one metal element selected from the group consisting of Zr, V, Cr, Si, B and Al, in a proportion of 0.2-10% by mass to 100% by mass of the third layer. When such second and/or third layers are formed, part of a $TiCl_4$ gas in each of their starting material gases is preferably substituted by a chloride gas of at least one metal element selected from the group consisting of Zr, V, Cr, Si, B and Al, in a proportion of 0.2-10% by volume to 100% by volume of the starting material gas.

Columnar crystals in the second layer preferably comprise, by mass ratio, crystal grains having a composition represented by $Ti_{a_1}(C_{x_1}N_{y_1})b_1$, wherein $a_1=0.55-0.85$, $a_1+b_1=1$, $x_1=0.5-0.8$, and $x_1+y_1=1$, and crystal grain boundaries having a composition represented by $Ti_{a_2}(C_{x_2}N_{y_2})b_2$, wherein $a_2=0.3-0.6$, $a_2+b_2=1$, $x_2=0.6-0.9$, and $x_2+y_2=1$, meeting $0.2 \leq x_1 b_1 / x_2 b_2 \leq 0.6$.

The bonding layer is preferably a single- or multi-layer hard coating indispensably comprising at least one element selected from the group consisting of Ti, Al, B and Zr, and at least one element selected from the group consisting of C, N and O. With this condition met, the bonding layer has high adhesion to the titanium carbonitride layer. The bonding layer preferably has a multi-layer structure comprising a layer having high adhesion to the third layer, and a layer having high adhesion to an oxide layer of Al and/or Cr.

The hard-coated member is suitable as an insert or a mold-constituting member, with high practical usefulness.

The method of the present invention for producing a hard-coated member by a chemical vapor deposition method, the hard-coated member comprising a substrate made of cemented carbide or high-speed steel, and a hard coating formed on the substrate and comprising a titanium carbonitride layer comprising first to third layers each having a columnar crystal structure in this order from the side of the substrate, the first layer having a carbon concentration of 13-22% by mass, the second layer having a carbon concentration of 12-21% by mass, the third layer having a carbon concentration of 9-15% by mass, the carbon concentration in the second layer being lower than the carbon concentration in the first layer by 0.1% or more by mass, and the carbon concentration in the third layer being lower than the carbon concentration in the second layer by 0.5% or more by mass, comprises the steps of (1) forming the first layer by using a starting material gas comprising a $TiCl_4$ gas, an $N_2$ gas, a $C_2$-$C_5$ hydrocarbon gas and an $H_2$ gas;

(2) forming the second layer by using a starting material gas comprising a $TiCl_4$ gas, an $N_2$ gas, an organic cyanide gas, a $C_2$-$C_5$ hydrocarbon gas which may contain a $CH_4$ gas in a proportion of less than 50% by volume, and an $H_2$ gas;

(3) forming the third layer by using a starting material gas comprising a $TiCl_4$ gas, an $N_2$ gas, an organic cyanide gas and an $H_2$ gas, the amount of the organic cyanide gas being smaller than in the step (2).

The organic cyanide is preferably $CH_3CN$.

The amount of the $C_2$-$C_5$ hydrocarbon gas used in the step (1) is preferably more than the amount of a $C_2$-$C_5$ hydrocarbon gas used in the step (2).

In the method of the present invention, it is preferable that (1) the first layer is formed by using a starting material gas comprising 0.2-1% by volume of a $TiCl_4$ gas, 20-60% by volume of an $N_2$ gas, and 0.8-3% by volume of a $C_2$-$C_5$ hydrocarbon gas, the balance being an $H_2$ gas, that (2) the second layer is formed by using a starting material gas comprising 1-3% by volume of a $TiCl_4$ gas, 10-30% by volume of an $N_2$ gas, 0.2-2% by volume of an organic cyanide gas, and 0.5-2.5% by volume of a $C_2$-$C_5$ hydrocarbon gas which may contain a $CH_4$ gas in a proportion of less than 50% by volume, the balance being an $H_2$ gas; and that (3) the third layer is formed by using a starting material gas comprising 0.8-3% by volume of a $TiCl_4$ gas, 10-30% by volume of an $N_2$ gas, and 0.1-1.2% by volume of an organic cyanide gas, which is less than in the step (2) by 0.1% or more by volume, the balance being an $H_2$ gas.

In the steps (1)-(3), the reaction temperature is preferably 700-900° C., more preferably 750-880° C., and most preferably 800-850° C. The reaction pressure is preferably 5-20 kPa in the step (1), 5-10 kPa in the step (2), and 5-10 kPa in the step (3).

Part of a $TiCl_4$ gas in a starting material gas for forming each of the second and/or third layers may be substituted by a chloride gas of at least one metal element selected from the group consisting of Zr, V, Cr, Si, B and Al, in a proportion of 0.2-10% by volume to 100% by volume of the starting material gas.

DESCRIPTION OF THE PREFERRED EMBODIMENTS

[1] Hard-Coated Member

Figure 1A:
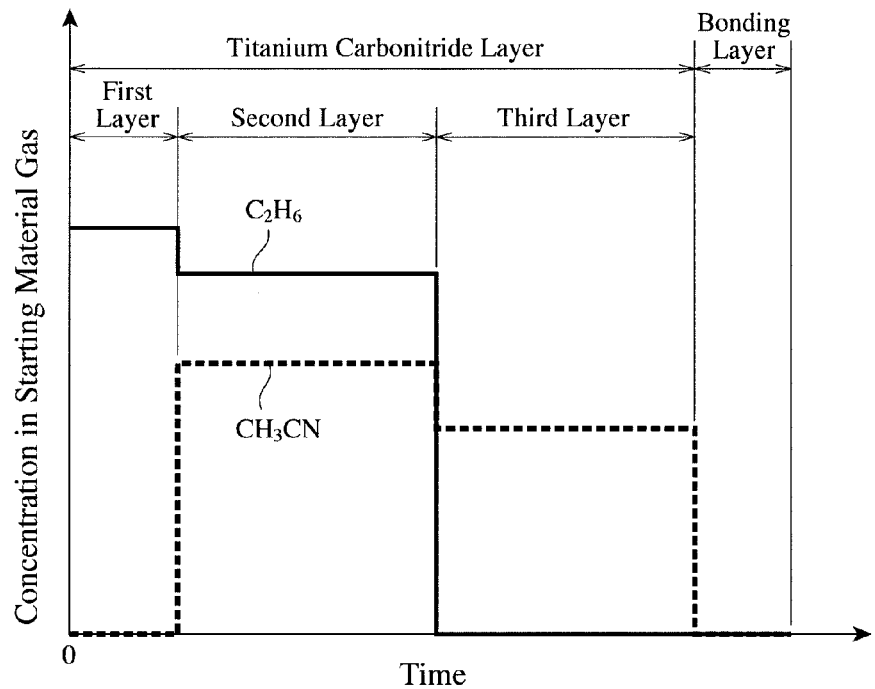
FIG. 1(a) is a graph schematically showing the concentration changes of a hydrocarbon ($C_2H_6$) gas and an organic cyanide ($CH_3CN$) gas in a starting material gas in the step of forming the titanium carbonitride layer according to the present invention.

The hard-coated member of the present invention comprises a substrate made of cemented carbide or high-speed steel, and a hard coating formed on the substrate by a chemical vapor deposition method, the hard coating comprising a titanium carbonitride layer comprising first to third layers each having a columnar crystal structure, and an upper layer in this order from the side of the substrate. In the titanium carbonitride layer, the carbon concentration in the second layer is lower than the carbon concentration in the first layer, and the carbon concentration in the third layer is lower than the carbon concentration in the second layer. Also, the upper layer is (i) a first upper layer comprising a bonding layer formed on the third layer, and a hard oxide layer of Al and/or Cr formed on the bonding layer, or (ii) a second upper layer constituted by a hard layer, which is formed on the third layer, and comprises Ti and/or Cr, and C and/or N as indispensable elements, and at least one element selected from the group consisting of Al, Si, B, Zr and V as an optional element.

The first layer should have excellent adhesion to the substrate made of cemented carbide or high-speed steel, the second layer should have excellent hardness and wear resistance, and the third layer should have excellent adhesion to the upper layer. Though the hard-coated members of the present invention include not only cutting tools but also various sliding members (molds, etc.), the following explanations will be made on cutting tools as an example.

(A) Substrate

The substrate is made of a material (cemented carbide or high-speed steel), on which a chemical vapor deposition method can be conducted at nearly 1000° C. Among them, the cemented carbide is preferable from the aspect of strength, hardness, wear resistance, toughness, etc. In the case of the cemented carbide, the hard coating according to the present invention can be formed on any of unground surfaces, ground surfaces and cutting edge surfaces after sintering. Though even hard coatings formed on the unground surfaces (as-sintered surfaces) of the substrates have sufficiently high hardness and wear resistance, those formed on the ground surfaces and cutting edge surfaces of the substrates have higher hardness and wear resistance because of finer crystal grains.

(B) Titanium Carbonitride Layer (1) First Layer

When the hard-coated member is used as a cutting tool of a cemented carbide substrate, a hard coating is likely to peel due to the adhesion of work chips. Accordingly, the hard coating should have high adhesion to the cemented carbide substrate. When a carbonitride film is formed by a chemical vapor deposition method, a primer layer of carbide or nitride has conventionally been formed to improve adhesion to the substrate. However, when a TiC layer is formed by using a $TiCl_4$ gas, a $CH_4$ gas, and an $H_2$ gas, or when a thick TiN layer is formed by using a $TiCl_4$ gas, an $N_2$ gas, and an $H_2$ gas, a decarburized layer is formed in an interface between the substrate and the primer layer, resulting in low adhesion of the primer layer to the substrate, because the substrate is subject to a higher temperature than 900° C. for a long period of time. In addition, Co diffuses from the cemented carbide to the primer layer, thereby reducing the hardness of the primer layer. This problem occurs in cutting tools of high-speed steel substrates.

Accordingly, the formation of a Ti(CN) film by using a $TiCl_4$ gas, a $CH_3CN$ gas and an $H_2$ gas was proposed. However, the Ti(CN) film has insufficient adhesion to the substrate because of a low carbon concentration. To increase adhesion to the substrate, a film-forming temperature should be higher than 900° C., causing the diffusion of Co. Therefore, in the present invention, a $C_2$-$C_5$ hydrocarbon gas having higher reactivity to a $TiCl_4$ gas and an $N_2$ gas is added at a relatively high ratio to a starting material gas, to form a titanium carbonitride layer having a high carbon concentration as a first layer having high adhesion to the substrate, as described later. Because the use of such starting material gas lowers the film-forming temperature, the diffusion of Co from the cemented carbide (substrate) to the first layer can be suppressed, providing the hard-coated member with high hardness and excellent wear resistance.

With the overall composition of the first layer expressed by Ti, which may contain the element Me, +C+N=100% by mass, the carbon concentration (carbon content) in the first layer is preferably 13-22% by mass, more preferably 14-21% by mass, and most preferably 14.5-20% by mass. The composition is determined from the measurement results of EPMA, EDS and AES as described later. The first layer having a carbon concentration of less than 13% by mass does not have sufficient adhesion to the substrate formed by cemented carbide or high-speed steel, failing to have sufficiently fine carbonitride crystal grains. Also, because the film-forming temperature cannot be low, it is impossible to suppress the diffusion of Co from the cemented carbide to the first layer. On the other hand, when the carbon concentration in the first layer is more than 22% by mass, free carbon is formed, resulting in low adhesion of the titanium carbonitride layer to the substrate.

The nitrogen concentration (nitrogen content) in the first layer is preferably 2.5-10% by mass, more preferably 3-9% by mass, and most preferably 3.5-8% by mass. The first layer has insufficient hardness at a nitrogen concentration of less than 2.5% by mass, while it is brittle at a nitrogen concentration of more than 10% by mass.

An atomic ratio C/(C+N) of the carbon concentration (C) to the total (C+N) of the carbon concentration (C) and the nitrogen concentration (N) in the first layer is preferably 0.65-0.9, more preferably 0.7-0.85. The C/(C+N) ratio of less than 0.65 provides low hardness and wear resistance. Those having a C/(C+N) ratio of more than 0.9 have poor industrial productivity. An atomic ratio N/(C+N) of the nitrogen concentration (N) to the total (C+N) of the carbon concentration (C) and the nitrogen concentration (N) in the first layer is preferably 0.35-0.1, more preferably 0.3-0.15.

The amount of Ti, which may contain the element Me, is preferably 68-84.5% by mass, more preferably 70-83 atomic %, and most preferably 72-82% by mass. With Ti outside the range of 68-84.5% by mass, the first layer has drastically reduced hardness and wear resistance. The element Me is at least one metal element selected from the group consisting of Zr, V, Cr, Si, B and Al. Among the elements Me, Zr, Cr, Si, V and Al improve the oxidation resistance of the first layer, and Zr, Si, V and B improve the hardness and wear resistance of the first layer. The amount of the element Me is preferably 0.2-10% by mass, with Ti+Me as 100% by mass.

The first layer has fine columnar crystals having a small average transverse cross section diameter. The term "average transverse cross section diameter" means an average diameter of cross sections of columnar crystals in a plane in parallel to a substrate surface. The average transverse cross section diameter of columnar crystals in the first layer is preferably 0.01-0.5 μm, more preferably 0.01-0.2 μm, and most preferably 0.01-0.1 μm. Those having an average transverse cross section diameter of less than 0.01 μm are difficult to produce industrially, and those of more than 0.5 μm have drastically reduced hardness.

Because the first layer functions to have sufficient adhesion to the substrate of cemented carbide or high-speed steel, its average thickness may be 0.01-2 μm, though it is preferably 0.05-1 μm, more preferably 0.1-0.8 μm. The average thickness of less than 0.01 μm or more than 2 μm provides low adhesion. When the first layer is as thick as more than 2 μm, the carbon concentration extremely increases as nearing the surface layer as shown in Comparative Example 1 below, so that the first layer is brittle on the surface side. Therefore, for example, a cutting tool having only a thick first layer formed on the substrate has a short life. Further, a ratio of the thickness of the first layer to the total thickness of the titanium carbonitride layer (the first layer+the second layer+the third layer) is preferably 0.5-8%, more preferably 1-7%.

(2) Second Layer

The second layer is a titanium carbonitride layer having high hardness and excellent wear resistance because of a relatively high carbon concentration. As in the first layer, the composition of the second layer is determined from the measurement results of EPMA, EDS and AES. With the overall composition of the second layer expressed by Ti, which may contain the element Me, +C+N=100% by mass, the carbon concentration (carbon content) in the second layer is preferably 12-21% by mass, more preferably 13.5-20% by mass, and most preferably 14-19% by mass. With the carbon concentration of less than 12% by mass, the second layer does not have sufficient hardness and wear resistance. On the other hand, when the carbon concentration in the second layer is more than 21% by mass, it has too high hardness, resulting in poor shock resistance.

The carbon concentration in the second layer is characterized by being lower than the carbon concentration in the first layer by 0.1% or more by mass. Because the first layer has a higher carbon concentration than that of the second layer, the first layer has sufficiently high adhesion to the substrate. A higher carbon concentration in the first layer than in the second layer appears to be due to the fact that a starting material gas for the first layer contains a hydrocarbon gas without an organic cyanide gas. The carbon concentration in the second layer is lower than the carbon concentration in the first layer preferably by 0.3-3% by mass, more preferably by 0.5-2.5% by mass.

The nitrogen concentration (nitrogen content) in the second layer is preferably 2.5-10% by mass, more preferably 3-9% by mass, and most preferably 4-8% by mass. The second layer does not have sufficient hardness at a nitrogen concentration of less than 2.5% by mass, while it is brittle at a nitrogen concentration of more than 10% by mass.

An atomic ratio C/(C+N) of the carbon concentration (C) to the total (C+N) of the carbon concentration (C) and the nitrogen concentration (N) in the second layer is preferably 0.65-0.85, more preferably 0.7-0.8. The C/(C+N) ratio of less than 0.65 provides low hardness and wear resistance, and the C/(C+N) ratio of more than 0.85 provides poor industrial productivity. The atomic ratio N/(C+N) of the nitrogen concentration (N) to the total (C+N) of the carbon concentration (C) and the nitrogen concentration (N) in the second layer is preferably 0.35-0.15, more preferably 0.3-0.2.

The amount of Ti, which may contain the element Me, is preferably 69-85.5% by mass, more preferably 71-83.5 atomic %, and most preferably 73-82% by mass. With Ti outside the range of 69-85.5% by mass, the second layer has drastically reduced hardness and wear resistance. Me is at least one metal element selected from the group consisting of Zr, V, Cr, Si, B and Al. Among the elements Me, Zr, Cr, Si, V and Al improve the oxidation resistance of the second layer, and Zr, Si, V and B improve the hardness and wear resistance of the second layer. The amount of the element Me is preferably 0.2-10% by mass, based on 100% by mass of Ti+Me.

It has been found that in the second layer, crystal grain boundaries a higher than crystal grains in carbon concentration. Specifically, the second layer comprises, by mass ratio, crystal grains having a composition represented by $Ti a_1(C x_1 N y_1) b_1$, wherein $a_1=0.55-0.85$, $a_1+b_1=1$, $x_1=0.5-0.8$, and $x_1+y_1=1$, and crystal grain boundaries having a composition represented by $Ti a_2(C x_2 N y_2) b_2$, wherein $a_2=0.3-0.6$, $a_2+b_2=1$, $x_2=0.6-0.9$, and $x_2+y_2=1$, meeting $0.2 \leq x_1 b_1 / x_2 b_2 \leq 0.6$.

In the composition (by mass ratio) of crystal grains in the second layer, which is represented by $Ti a_1(C x_1 N y_1) b_1$, wherein Ti may contain the element Me, the amount $a_1$ of Ti, which may contain the element Me, is preferably 0.55-0.85, the amount $b_1$ of CN is preferably 0.45-0.15, the amount $x_1 b_1$ of C is preferably 0.3-0.1, and the amount $y_1 b_1$ of N is preferably 0.15-0.05. Also, in the composition (by mass ratio) of crystal grain boundaries in the second layer, which is represented by $Ti a_2(C x_2 N y_2) b_2$, the amount $a_2$ of Ti, which may contain the element Me, is preferably 0.3-0.6, the amount $b_2$ of CN is preferably 0.7-0.4, the amount $x_2 b_2$ of C is preferably 0.5-0.3, and the amount $y_2 b_2$ of N is preferably 0.2-0.1. A ratio $(x_1 b_1 / x_2 b_2)$ of the C content in crystal grains to the C content in crystal grain boundaries in the second layer is preferably 0.2-0.6, more preferably 0.3-0.5.

When the second layer in the titanium carbonitride layer meets the above composition conditions of crystal grains and crystal grain boundaries, the hard-coated member of the present invention is remarkably higher in performance than those coated with titanium carbonitride layers by conventional chemical vapor deposition methods.

Because the second layer also has fine columnar crystals, it has high hardness and wear resistance. The average transverse cross section diameter of columnar crystals in the second layer is preferably 0.01-0.5 µm, more preferably 0.01-0.2 µm, and most preferably 0.01-0.1 µm. Those having an average transverse cross section diameter of less than 0.01 µm are difficult to industrially produce, and those of more than 0.5 µm have drastically reduced hardness.

The average thickness of the second layer having high hardness and wear resistance as well as sufficient shock resistance is preferably 1-20 µm, more preferably 1.5-15 µm, and most preferably 2-10 µm. The average thickness of less than 1 µm provides a short life, while the average thickness of more than 20 µm drastically reduces adhesion. Because a thicker first layer provides a higher carbon concentration on the surface side, resulting in lower adhesion, it is preferable that the first layer is sufficiently thinner than the second layer (the second layer is sufficiently thicker than the first layer). A ratio of the thickness of the second layer to the thickness of the overall titanium carbonitride layer (the first layer+the second layer+the third layer) is preferably 40-80%, more preferably 45-80%.

The hardness of the second layer measured by a nanoindentation method is preferably 30-40 GPa, more preferably 32-40 GPa. The second layer has low wear resistance at hardness of less than 30 GPa, and too high carbon concentration at hardness of more than 40 GPa, resulting in being brittle.

(3) Third Layer

The third layer is a titanium carbonitride layer with a reduced carbon concentration to have high adhesion to the upper layer. Like the first and second layers, the composition of the third layer is determined from the measurement results of EPMA, EDS and AES. With the overall composition of the third layer expressed by Ti, which may contain the element Me, +C+N=100% by mass, the carbon concentration (carbon content) in the third layer is preferably 9-15% by mass, more preferably 10-14% by mass, and most preferably 11-14% by mass. The third layer has insufficient hardness and wear resistance at a carbon concentration of less than 9% by mass. On the other hand, the third layer has insufficient adhesion to the upper layer at a carbon concentration of more than 15% by mass.

The third layer is lower than the second layer in carbon concentration preferably by 0.5% or more by mass, more preferably by 1-7% by mass, and most preferably by 1.5-6.5% by mass. Having a lower carbon concentration than that of the second layer having high hardness and wear resistance, the third layer has improved adhesion to the upper layer with sufficient hardness and wear resistance maintained.

The nitrogen concentration (nitrogen content) in the third layer is preferably 5-14% by mass, more preferably 6-12% by mass, and most preferably 8-11% by mass. The third layer does not have sufficient hardness at a nitrogen concentration of less than 5% by mass, and is brittle at a nitrogen concentration of more than 14% by mass.

An atomic ratio C/(C+N) of the carbon concentration (C) to the total (C+N) of the carbon concentration (C) and the nitrogen concentration (N) in the third layer is preferably 0.5-0.7, more preferably 0.55-0.65. The C/(C+N) ratio of less than 0.5 provides low hardness and wear resistance. On the other hand, the C/(C+N) ratio of more than 0.7 provides low adhesion to the upper layer. The third layer is smaller than the second layer in C/(C+N) preferably by 0.05-0.3, more preferably by 0.1-0.25. An atomic ratio N/(C+N) of the nitrogen concentration (N) to the total (C+N) of the carbon concentration (C) and the nitrogen concentration (N) in the third layer is preferably 0.5-0.3, more preferably 0.45-0.35.

The amount of Ti, which may contain the element Me, is preferably 71-86% by mass, more preferably 74-84% by mass, and most preferably 75-81% by mass. The element Me, which may substitute part of Ti, is preferably at least one metal element selected from the group consisting of Zr, V, Cr, Si, B and Al. Among the element Me, Zr, Cr, Si, V and Al improve the oxidation resistance of the third layer, and Zr, Si, V and B improve the hardness and wear resistance of the third layer. The amount of the element Me is preferably 0.2-10% by mass, based on 100% by mass of Ti+Me.

Though the third layer has a lower carbon concentration than those of the first and second layers, a film-forming speed in a direction perpendicular to the substrate is sufficiently larger than a film-forming speed in a direction parallel to the substrate, so that fine columnar crystals are also formed in the third layer. The average transverse cross section diameter of columnar crystals in the third layer is preferably 0.01-0.5 μm, more preferably 0.01-0.2 μm, and most preferably 0.01-0.1 μm. Those having an average transverse cross section diameter of less than 0.01 μm are difficult to industrially produce, while those having an average transverse cross section diameter of more than 0.5 μm have drastically reduced hardness. Thus, the average transverse cross section diameter of columnar crystals is substantially the same in the first to third layers.

To sufficiently exhibit adhesion to the upper layer, the average thickness of the third layer is preferably 1-10 μm, more preferably 1.5-8 μm, and most preferably 1.5-6 μm. The average thickness of less than 1 μm provides a short life, and the average thickness of more than 10 μm provides drastically reduced adhesion. Further, a thickness ratio of the third layer to the overall titanium carbonitride layer (the first layer+the second layer+the third layer) is preferably 15-60%, more preferably 17-50%.

The hardness of the third layer measured by a nanoindentation method is preferably 30-40 GPa, more preferably 32-40 GPa. The third layer having hardness of less than 30 GPa has low wear resistance, while the third layer having hardness of more than 40 GPa has too high carbon concentration, resulting in being brittle.

(C) Upper Layer

The upper layer is (i) a first upper layer comprising a bonding layer formed on the third layer, and a hard oxide layer of Al and/or Cr formed on the bonding layer, or (ii) a hard layer (second upper layer) formed on the third layer, and comprising Ti and/or Cr, and C and/or N as indispensable elements, and at least one element selected from the group consisting of Al, Si, B, Zr and V as an optional element.

(1) First Upper Layer (a) Bonding Layer

The bonding layer formed immediately on the third layer by a chemical vapor deposition method is a single- or multi-layer hard coating indispensably comprising at least one element selected from the group consisting of Ti, Al, B and Zr, and at least one element selected from the group consisting of C, N and O. To exhibit high adhesion to the third layer and the oxide layer, the bonding layer preferably has a multi-layer structure comprising a Ti(CN) layer having the same crystal structure as that of the third layer, and a Ti(CNO) layer, a Ti(CO) layer, a (TiAl)(CNO) layer or a (TiB)(CNO) layer having high adhesion to the oxide layer.

(b) Oxide Layer of Al and/or Cr

Figure 2A:
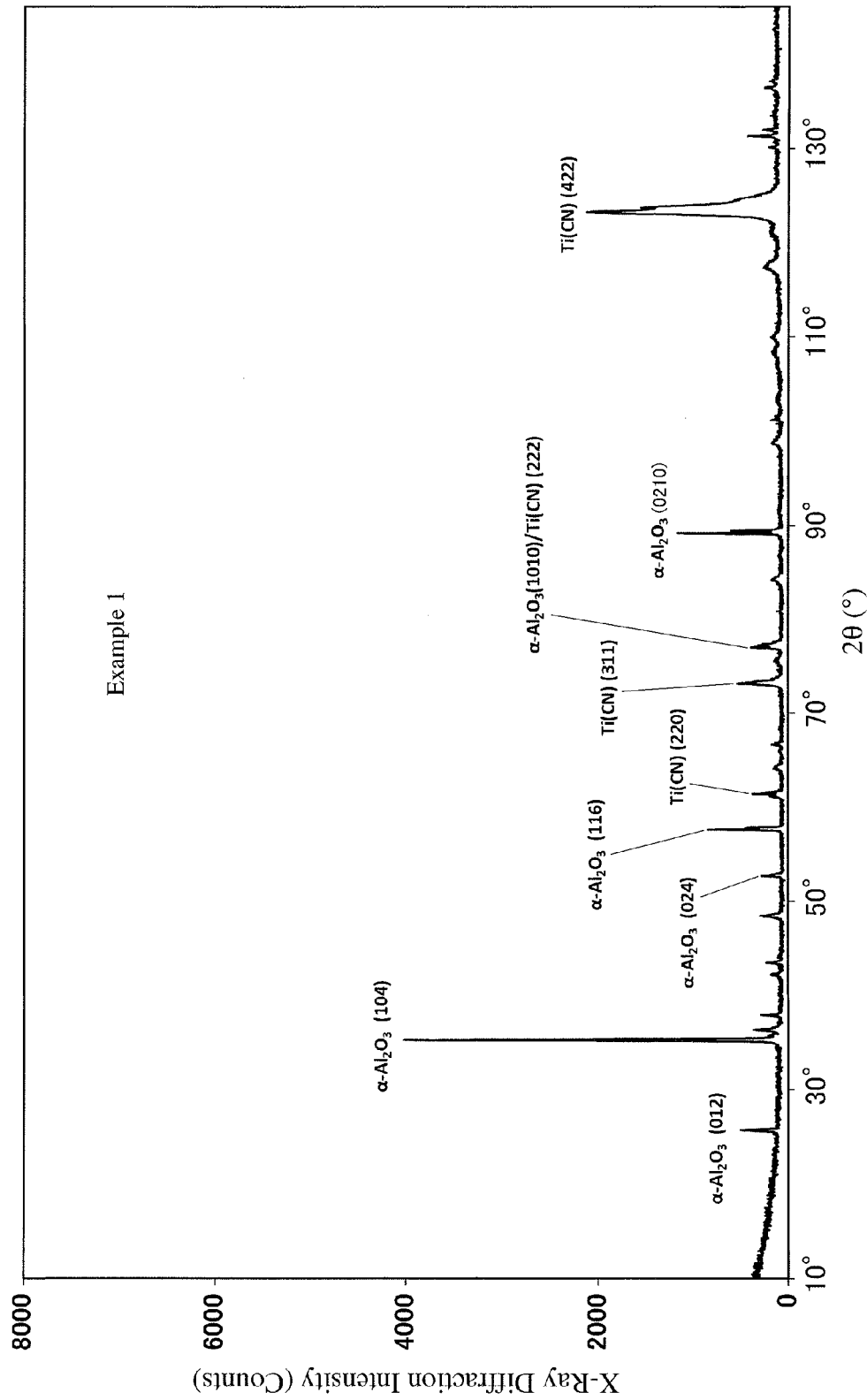
FIG. 2(a) is a graph showing an X-ray diffraction pattern of the hard coating of Example 1 comprising a titanium carbonitride layer, a bonding layer and an aluminum oxide layer.
Figure 2B:
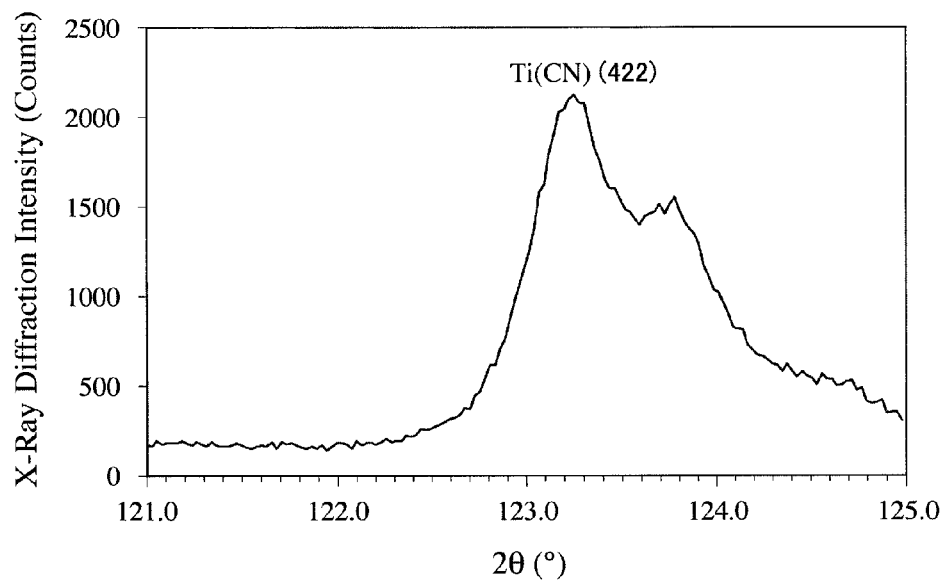
FIG. 2(b) is a graph enlargedly showing a part of the X-ray diffraction pattern of FIG. 2(a) in a range of 2θ from 121.0° to 125.0°.

The oxide layer of Al and/or Cr (aluminum oxide layer, chromium oxide layer or aluminum chromium oxide layer) formed on the bonding layer by a chemical vapor deposition method may contain Zr and/or Ti, if necessary. The oxide layer of Al and/or Cr is preferably based on an α-structure, more preferably has only an α-structure (only an X-ray diffraction pattern of the α type is observed as shown in FIG. 2). To exhibit heat resistance and oxidation resistance sufficiently, the average thickness of the oxide layer is preferably 0.5-12 μm, more preferably 1-10 μm, and most preferably 2-8 μm. The average thickness of less than 0.5 μm provides the oxide layer with a short life, and the average thickness of more than 12 μm provides drastically reduced adhesion.

(2) Second Upper Layer

The second upper layer formed on the third layer is a hard layer comprising Ti and/or Cr, and C and/or N as indispensable elements, and at least one element selected from the group consisting of Al, Si, B, Zr and V as an optional element. The second upper layer preferably has a face-centered cubic (FCC) structure like the third layer. Specifically, the second upper layer preferably has a single- or multi-layer structure, selected from the group consisting of a TiC film, a TiN film, a (TiAl)N film, a (TiSi)N film, a (TiB)N film, a TiZr(CN) film, a TiAl(CN) film, a TiSi(CN) film, a TiCr(CN) film, a TiV(CN) film, a TiAlSi(CN) film, a TiB(CN) film and a CrC film.

To obtain high hardness and wear resistance as well as a long life, the average thickness of the second upper layer is preferably 0.5-10 μm, more preferably 1-8 μm, and most preferably 2-5 μm. The average thickness of less than 0.5 μm provides a short life, and the average thickness of more than 10 μm provides too low adhesion.

[2] Production Method

The hard coating according to the present invention can be formed by a chemical vapor deposition method using a thermal chemical vapor deposition apparatus or a plasma-assisted chemical vapor deposition apparatus, which are simply called "CVD chambers." Taking the thermal chemical vapor deposition method for example, the method of the present invention will be explained below. It should be noted, however, that the present invention is not restricted thereto, but other chemical vapor deposition methods may be used.

(A) Starting Material Gas for Titanium Carbonitride Layer

As schematically shown in FIG. 1(a), the concentrations of a $C_2$-$C_5$ hydrocarbon gas and an organic cyanide gas vary in starting material gases for forming the first to third layers in the titanium carbonitride layer. For simplicity, FIG. 1(a) illustrates $C_2H_6$ as the $C_2$-$C_5$ hydrocarbon gas, and $CH_3CN$ as the organic cyanide gas.

The $C_2$-$C_5$ hydrocarbon gas include alkanes or alkenes gas such as ethane ($C_2H_6$), propane ($C_3H_8$), butane ($C_4H_{10}$), pentane ($C_5H_{12}$), ethylene ($C_2H_4$), propylene ($C_3H_6$), butene ($C_4H_8$), and pentene ($C_5H_{10}$). Among them, an ethane gas is preferable. The hydrocarbon gas may contain a $CH_4$ gas in a proportion of less than 50% by volume. The lower the proportion of a $CH_4$ gas in the hydrocarbon gas, the higher hardness or wear resistance the resultant titanium carbonitride layer tends to have. Accordingly, the proportion of the $CH_4$ gas in the hydrocarbon gas is preferably 30% or less by volume, more preferably 20% or less by volume, and most preferably substantially 0% by volume.

The organic cyanides include acetonitrile ($CH_3CN$), propanenitrile ($CH_3CH_2CN$), benzonitrile ($C_6H_5CN$), etc., and acetonitrile is preferable from the aspect of cost.

(B) Formation of Titanium Carbonitride Layer (1) Formation of First Layer

After the temperature in a CVD chamber, in which a substrate of cemented carbide or high-speed steel is disposed, is elevated to a film-forming temperature while flowing an $H_2$ gas, an $N_2$ gas and an Ar gas into the CVD chamber, a starting material gas comprising a $TiCl_4$ gas, an $N_2$ gas, a $C_2$-$C_5$ hydrocarbon gas, and an $H_2$ gas is supplied to the CVD chamber. An organic cyanide gas is not used for the formation of the first layer, because the inclusion of the organic cyanide gas in a gas for forming the first layer reduces the adhesion of the first layer to the substrate.

(a) Starting Material Gas

Specifically, the composition of a starting material gas for the first layer preferably comprises 0.2-1% by volume of a $TiCl_4$ gas, 20-60% by volume of an $N_2$ gas, and 0.8-3% by volume of a $C_2$-$C_5$ hydrocarbon gas, the balance being an $H_2$ gas, based on the total amount (100% by volume) of the $TiCl_4$ gas, the $N_2$ gas, the hydrocarbon gas, and the $H_2$ gas. When the $TiCl_4$ gas is less than 0.2% by volume, a uniform titanium carbonitride layer is not formed, resulting in poor adhesion to the substrate of cemented carbide or high-speed steel. On the other hand, when the $TiCl_4$ gas exceeds 1% by volume, the starting material gas excessively reacts with the substrate, forming a brittle layer between the first layer and the substrate, which leads to low adhesion to the substrate. The $TiCl_4$ gas is more preferably 0.3-0.8% by volume, and most preferably 0.4-0.8% by volume.

When the $N_2$ gas is less than 20% by volume, the starting material gas excessively reacts with the substrate, forming a brittle layer between the first layer and the substrate, which leads to low adhesion to the substrate. On the other hand, when the $N_2$ gas exceeds 60% by volume, reactive components are diluted accordingly, failing to obtain a uniform titanium carbonitride layer, and resulting in low adhesion to the substrate. The $N_2$ gas is more preferably 30-50% by volume, and most preferably 30-40% by volume.

When the $C_2$-$C_5$ hydrocarbon gas is less than 0.8% by volume, the first layer has an insufficient carbon concentration, resulting in poor adhesion to the substrate. On the other hand, when the $C_2$-$C_5$ hydrocarbon gas exceeds 3% by volume, the starting material gas excessively reacts with the substrate, forming a brittle layer between the first layer and the substrate, which leads to low adhesion to the substrate. The $C_2$-$C_5$ hydrocarbon gas is more preferably 0.8-2.5% by volume, and most preferably 1-2% by volume.

(b) Film-Forming Conditions

The temperature for forming the first layer is preferably 700-900° C., more preferably 750-880° C., and most preferably 800-850° C. The film-forming temperature of lower than 700° C. provides too low a film-forming speed. On the other hand, when the film-forming temperature exceeds 900° C., the starting material gas excessively reacts with the substrate, forming a brittle layer between the first layer and the substrate, which leads to low adhesion to the substrate.

The pressure for forming the first layer is preferably 5-20 kPa, more preferably 10-15 kPa. The film-forming pressure of less than 5 kPa does not form a titanium carbonitride layer having high adhesion to the substrate. On the other hand, when the film-forming pressure exceeds 20 kPa, the starting material gas excessively reacts with the substrate, forming a brittle layer between the first layer and the substrate, which leads to low adhesion to the substrate.

Because the reaction of a $TiCl_4$ gas with a $C_2$-$C_5$ hydrocarbon gas is more active than the reaction of a $TiCl_4$ gas with an $N_2$ gas at the above temperature and pressure, a titanium carbonitride layer having a high carbon concentration is formed, and the starting material gas reacts with the substrate to provide the titanium carbonitride layer with high adhesion to the substrate.

(2) Formation of Second Layer (a) Starting Material Gas

After the first layer is formed, the starting material gas for the first layer is preferably switched to a starting material gas for the second layer, to continuously form the second layer. Thus, fine columnar crystals grow continuously, forming a titanium carbonitride layer having high adhesion between the first layer and the second layer. The starting material gas for the second layer comprises a $TiCl_4$ gas, an $N_2$ gas, an organic cyanide gas, a $C_2$-$C_5$ hydrocarbon gas, which may contain a $CH_4$ gas in a proportion of less than 50% by volume, and an $H_2$ gas. As shown in FIG. 1(a), the concentration of the $C_2$-$C_5$ hydrocarbon gas in the starting material gas for the second layer is preferably lower than that in the starting material gas for the first layer.

Specifically, the composition of the starting material gas for the second layer preferably comprises 1-3% by volume of a $TiCl_4$ gas, 10-30% by volume of an $N_2$ gas, 0.2-2% by volume of an organic cyanide gas, and 0.5-2.5% by volume of a $C_2$-$C_5$ hydrocarbon gas, which may contain a $CH_4$ gas in a proportion of less than 50% by volume, the balance being an $H_2$ gas, based on the total amount (100% by volume) of the $TiCl_4$ gas, the $N_2$ gas, the organic cyanide gas, the hydrocarbon gas, and the $H_2$ gas. When the $TiCl_4$ gas is less than 1% by volume, a uniform titanium carbonitride layer is not formed. On the other hand, when the $TiCl_4$ gas exceeds 3% by volume, there is small difference in carbon concentration between crystal grains and crystal grain boundaries, failing to form fine columnar crystals, which leads to low hardness and wear resistance. The $TiCl_4$ gas is more preferably 1-2.7% by volume, and most preferably 1.2-2.5% by volume.

When the $N_2$ gas is less than 10% by volume, the reaction is too accelerated, resulting in too low a nitrogen concentration in the second layer. As a result, the second layer has too high a carbon concentration, resulting in low adhesion. On the other hand, when the $N_2$ gas exceeds 30% by volume, a uniform reaction does not occur, resulting in an uneven film-growing speed and thus low adhesion. Further, the higher nitrogen concentration the second layer has, the lower carbon concentration it has, resulting in lower hardness and wear resistance. The $N_2$ gas is more preferably 10-25% by volume, and most preferably 10-20% by volume.

The organic cyanide gas of less than 0.2% by volume provides a low film-forming speed, failing to form a uniform titanium carbonitride layer. On the other hand, the organic cyanide gas exceeding 2% by volume provides too large a film-forming speed, resulting in small difference in carbon concentration between crystal grains and crystal grain boundaries. As a result, coarse columnar crystals are formed, resulting in low hardness and wear resistance. The organic cyanide gas is more preferably 0.2-1.5% by volume, and most preferably 0.2-1.2% by volume.

When the $C_2$-$C_5$ hydrocarbon gas is less than 0.5% by volume, there is small difference in carbon concentration between crystal grains and crystal grain boundaries, resulting in coarse columnar crystals, which leads to low hardness and wear resistance. On the other hand, when the $C_2$-$C_5$ hydrocarbon gas exceeds 2.5% by volume, the second layer has too high a carbon concentration, resulting in low shock resistance. The $C_2$-$C_5$ hydrocarbon gas is more preferably 0.6-2.2% by volume, and most preferably 0.8-2% by volume.

(b) Film-Forming Conditions

The temperature for forming the second layer is preferably 700-900° C., more preferably 750-880° C., and most preferably 800-850° C. The film-forming temperature of lower than 700° C. provides too slow a film-forming speed. On the other hand, when the film-forming temperature is higher than 900° C., the starting material gas excessively reacts with the substrate, forming coarse crystal grains, and thus resulting in low hardness and wear resistance.

The pressure for forming the second layer is preferably 5-10 kPa, more preferably 7-9 kPa. When the film-forming pressure is less than 5 kPa, a uniform titanium carbonitride layer cannot be obtained. On the other hand, when the film-forming pressure is higher than 10 kPa, coarse crystal grains are formed, resulting in low hardness and wear resistance.

(3) Formation of Third Layer
(a) Starting Material Gas

Figure 1B:
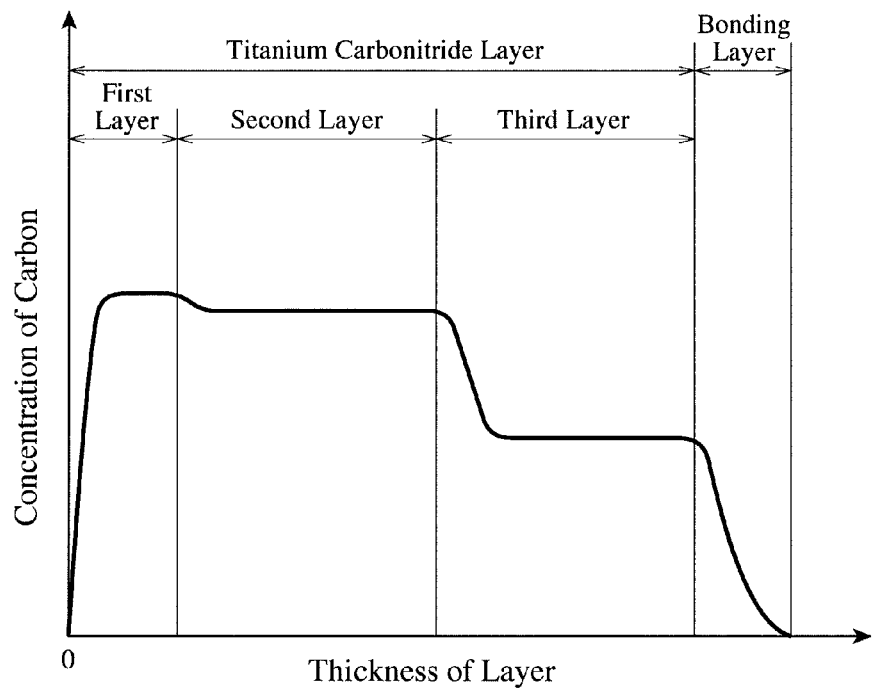
FIG. 1(b) is a graph schematically showing the concentration distribution of carbon in a thickness direction in a titanium carbonitride layer obtained by using the starting material gas shown in FIG. 1(a).

After the second layer is formed, the third layer is preferably formed continuously by switching the starting material gas for the second layer to a starting material gas for the third layer. As a result, fine columnar crystals continuously grow, resulting in a titanium carbonitride layer having high adhesion among the first to third layers. The starting material gas for the third layer comprises a $TiCl_4$ gas, an $N_2$ gas, an organic cyanide gas, and an $H_2$ gas. Because the starting material gas for the third layer does not contain a $C_2$-$C_5$ hydrocarbon gas as shown in FIG. 1(a), the carbon concentration in the third layer is lower than the carbon concentration in the second layer as shown in FIG. 1(b). As a result, the third layer has high adhesion to the upper layer. With the starting material gas for the third layer containing a smaller amount of an organic cyanide gas than in the step (2) for forming the second layer, the formation of coarser columnar crystals can be suppressed, thereby improving adhesion to the upper layer while keeping high hardness and wear resistance.

Specifically, the composition of the starting material gas for the third layer preferably comprises 0.8-3% by volume of a $TiCl_4$ gas, 10-30% by volume of an $N_2$ gas, and 0.1-1.2% by volume (smaller than in the step (2) by 0.1% or more by volume) of an organic cyanide gas, the balance being an $H_2$ gas, based on the total amount (100% by volume) of the $TiCl_4$ gas, the $N_2$ gas, the organic cyanide gas and the $H_2$ gas. Less than 0.8% by volume of the $TiCl_4$ gas provides the resultant titanium carbonitride layer with too high a carbon concentration, resulting in low adhesion to the upper layer. On the other hand, more than 3% by volume of the $TiCl_4$ gas forms coarse columnar crystals, resulting in reduced hardness and wear resistance. The $TiCl_4$ gas is more preferably 1-2.7% by volume, and most preferably 1-2.5% by volume.

Less than 10% by volume of the $N_2$ gas provides the titanium carbonitride layer with too low a nitrogen concentration (relatively, too high a carbon concentration), resulting in low adhesion to the upper layer. On the other hand, when the $N_2$ gas is more than 30% by volume, a uniform titanium carbonitride layer cannot be obtained. The $N_2$ gas is more preferably 10-25% by volume, and most preferably 12-25% by volume.

Less than 0.1% by volume of the organic cyanide gas provides too low a film-forming speed, and fails to form a uniform titanium carbonitride layer. On the other hand, more than 1.2% by volume of the organic cyanide gas not only forms coarse columnar crystals, resulting in reduced hardness and wear resistance, but also provides the titanium carbonitride layer with too high a carbon concentration, resulting in low adhesion to the upper layer. The organic cyanide gas is more preferably 0.1-1% by volume, and most preferably 0.1-0.8% by volume.

The concentration of the organic cyanide gas in the starting material gas for the third layer is preferably lower by 0.1% or more by volume than the concentration of the organic cyanide gas in the starting material gas for the second layer [step (2)]. With the same organic cyanide gas concentration as in the starting material gas for the second layer, columnar crystals in the third layer formed by using the starting material gas containing no $C_2$-$C_5$ hydrocarbon gas tend to become coarser. To prevent it, the concentration of the organic cyanide gas in the starting material gas for the third layer is preferably lowered by 0.1% or more by volume. The concentration of the organic cyanide gas in the starting material gas for the third layer is smaller than the concentration of the organic cyanide gas in the starting material gas for the second layer, more preferably by 0.1-0.7% by volume, and most preferably by 0.2-0.6% by volume.

(b) Film-Forming Conditions

The temperature for forming the third layer is preferably 700-900° C., more preferably 750-880° C., and most preferably 800-850° C. The film-forming temperature of lower than 700° C. provides too low a film-forming speed. On the other hand, when the film-forming temperature exceeds 900° C., the starting material gas excessively reacts with the substrate, forming coarse crystal grains, and thus low hardness and wear resistance.

The pressure for forming the third layer is preferably 5-10 kPa, more preferably 7-9 kPa. When the film-forming pressure is less than 5 kPa, a uniform titanium carbonitride layer is not formed. On the other hand, when the film-forming pressure exceeds 10 kPa, crystal grains become coarser, resulting in low hardness and wear resistance.

(C) Formation of Upper Layer
(1) Formation of First Upper Layer
(a) Formation of Bonding Layer Because the third layer in the titanium carbonitride layer does not have sufficient adhesion to the above oxide layer, a bonding layer is formed to increase the adhesion of both layers. The bonding layer is preferably a multi-layer film comprising at least a layer having high adhesion to the third layer in the titanium carbonitride layer, and a layer having high adhesion to the above oxide layer. Both layers can be formed by a known chemical vapor deposition method. The temperature for forming the bonding layer may be 950-1050° C., for example, about 1000° C.

The layers having high adhesion to the third layer include a Ti(CN) film, a TiN film, a TiC film, etc. The Ti(CN) film can be formed by using, for example, a starting material gas comprising a $TiCl_4$ gas, an $N_2$ gas, and a $CH_4$ gas, the balance being an $H_2$ gas. The TiN film can be formed by using a starting material gas comprising a $TiCl_4$ gas, an $N_2$ gas and an $H_2$ gas. The TiC film can be formed by using a starting material gas comprising a $TiCl_4$ gas, a $CH_4$ gas and an $H_2$ gas.

The layers having high adhesion to the above oxide layer include a Ti(NO) film, a Ti(CO) film, a Ti(CNO) film, a (TiAl)(CNO) film, a (TiB)(CNO) film, etc. The Ti(NO) film can be formed by using a starting material gas comprising a $TiCl_4$ gas, an $N_2$ gas, a CO gas, a $CO_2$ gas, and an $H_2$ gas. The Ti(CO) film can be formed by using a starting material gas comprising a $TiCl_4$ gas, a $CH_4$ gas, a CO gas, a $CO_2$ gas, and an $H_2$ gas. The Ti(CNO) film can be formed by using a starting material gas comprising a $TiCl_4$ gas, a $CH_4$ gas, an $N_2$ gas, a CO gas, a $CO_2$ gas, and an $H_2$ gas. The (TiAl)(CNO) film can be formed by using a starting material gas comprising a $TiCl_4$ gas, an $AlCl_3$ gas, a $CH_4$ gas, an $N_2$ gas, a CO gas, a $CO_2$ gas, and an $H_2$ gas. The (TiB)(CNO) film can be formed by using a starting material gas comprising a $TiCl_4$ gas, a $BCl_3$ gas, a $CH_4$ gas, an $N_2$ gas, a CO gas, a $CO_2$ gas, and an $H_2$ gas.

Each of the layer having high adhesion to the third layer and the layer having high adhesion to the above oxide layer may be as thick as 0.1-2 μm, preferably 0.3-1 μm. With less than 0.1 μm thickness, they have a short life, and with more than 2 μm thickness, their adhesion is extremely low.

(b) Formation of Oxide Layer

An aluminum oxide layer, a chromium oxide layer and an aluminum chromium oxide layer can be formed by a known chemical vapor deposition method. For example, the aluminum oxide layer is formed on the bonding layer by a chemical vapor deposition method, by supplying an $AlCl_3$ gas generated by flowing an HCl gas and an $H_2$ gas onto a metallic aluminum piece kept at 335° C., a $CO_2$ gas, an $H_2S$ gas, an HCl gas and an $H_2$ gas, to a CVD chamber kept at 800-1050° C. (for example, about 1000° C.).

(2) Formation of Second Upper Layer

The second upper layer having high adhesion to the third layer can be formed by a known chemical vapor deposition method. The film-forming temperature may be 750-1150° C., for example, 800° C. Examples of starting material gases usable for forming the second upper layer are as follows:
(a) TiC film $TiCl_4$ gas, $CH_4$ gas, and $H_2$ gas.
(b) TiN film $TiCl_4$ gas, $N_2$ gas, and $H_2$ gas.
(c) (TiAl)N film $TiCl_4$ gas, $AlCl_3$ gas, $N_2$ gas, and $NH_3$ gas.
(d) (TiSi)N film $TiCl_4$ gas, $SiCl_4$ gas, $N_2$ gas, and $NH_3$ gas.
(e) (TiB)N film $TiCl_4$ gas, $N_2$ gas, and $BCl_3$ gas.
(f) TiZr(CN) film $TiCl_4$ gas, $ZrCl_4$ gas, $N_2$ gas, $CH_4$ gas, and $H_2$ gas, or $TiCl_4$ gas, $ZrCl_4$ gas, $N_2$ gas, $CH_3CN$ gas, and $H_2$ gas.
(g) TiAl(CN) film $TiCl_4$ gas, $AlCl_3$ gas, $N_2$ gas, $CH_4$ gas, $NH_3$ gas, and $H_2$ gas, or $TiCl_4$ gas, $AlCl_3$ gas, $N_2$ gas, $CH_3CN$ gas, and $H_2$ gas.
(h) TiSi(CN) film $TiCl_4$ gas, $SiCl_4$ gas, $N_2$ gas, $CH_4$ gas, $NH_3$ gas, and $H_2$ gas, or $TiCl_4$ gas, $SiCl_4$ gas, $N_2$ gas, $CH_3CN$ gas, and $H_2$ gas.
(i) TiCr(CN) film $TiCl_4$ gas, $CrCl_3$ gas, $N_2$ gas, $CH_4$ gas, $NH_3$ gas, and $H_2$ gas, or $TiCl_4$ gas, $CrCl_3$ gas, $N_2$ gas, $CH_3CN$ gas, and $H_2$ gas.
(j) TiV(CN) film $TiCl_4$ gas, $VCl_3$ gas, $N_2$ gas, $CH_4$ gas, $NH_3$ gas, and $H_2$ gas, or $TiCl_4$ gas, $VCl_3$ gas, $N_2$ gas, $CH_3CN$ gas, and $H_2$ gas.
(k) TiAlSi(CN) film $TiCl_4$ gas, $AlCl_3$ gas, $SiCl_4$ gas, $N_2$ gas, $CH_4$ gas, $NH_3$ gas, and $H_2$ gas, or $TiCl_4$ gas, $AlCl_3$ gas, $SiCl_4$ gas, $N_2$ gas, $CH_3CN$ gas, and $H_2$ gas.
(l) TiB(CN) film $TiCl_4$ gas, $BCl_3$ gas, $N_2$ gas, $CH_4$ gas, $NH_3$ gas, and $H_2$ gas, or $TiCl_4$ gas, $BCl_3$ gas, $N_2$ gas, $CH_3CN$ gas, and $H_2$ gas.
(m) CrC film $CrCl_3$ gas, $CH_4$ gas, and $H_2$ gas.

The present invention will be explained in further detail by Examples below, without intention of restricting the present invention thereto. In Examples and Comparative Examples below, the flow rate (ml/minute) means ml per minute at 25° C. and 1 atom, and the thickness is an averaged value.

EXAMPLE 1

Figure 3A:
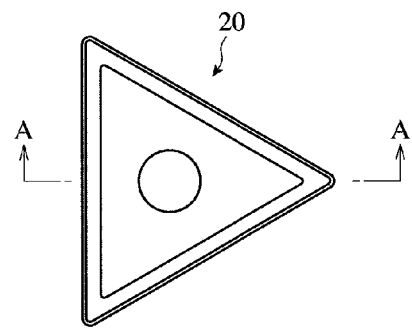
FIG. 3(a) is a plan view schematically showing an turning insert substrate.
Figure 3B:
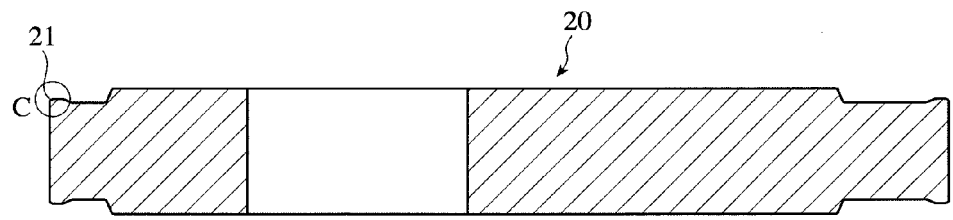
FIG. 3(b) is a cross-sectional view taken along the line A-A in FIG. 3(a).
Figure 3C:
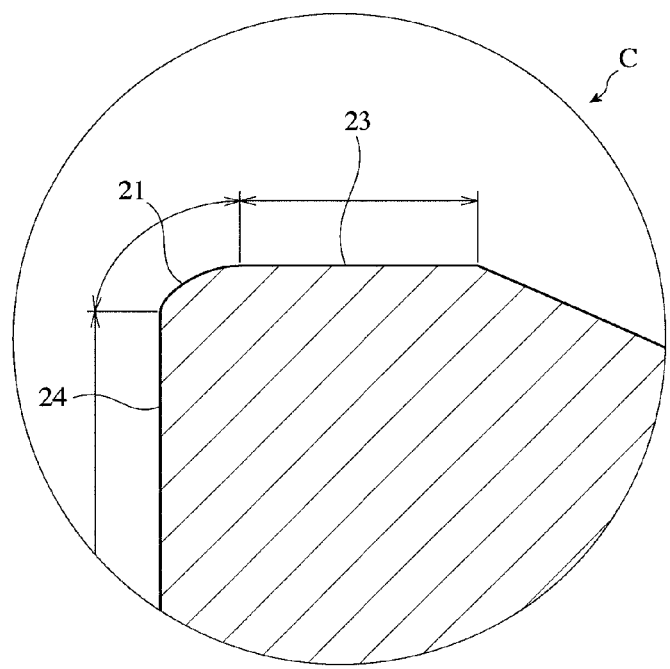
FIG. 3(c) is an enlarged cross-sectional view showing a portion C of the turning insert substrate of FIG. 3(b).

(1) Formation of Hard Coating Comprising Titanium Carbonitride Layer, Bonding Layer and Oxide Layer Cutting edge portions 21 of a turning insert substrate (TNMG160408) 20 made of cemented carbide comprising 6% by mass of Co, the balance being WC and inevitable impurities, which is schematically shown in FIGS. 3(*a*)-3(*c*), were honed by a diamond brush. Incidentally, 23 represents a land, and 24 represents a flank.

With this insert substrate (TNMG160408) disposed in a CVD chamber, the temperature in the CVD chamber was elevated to 850° C. while flowing an $H_2$ gas. First, with a starting material gas at 850° C. and 10 kPa, which comprised 66.0% by volume of an $H_2$ gas, 32.2% by volume of an $N_2$ gas, 0.5% by volume of a $TiCl_4$ gas, and 1.3% by volume of a $C_2H_6$ gas, supplied to the CVD chamber at a flow rate of 6100 ml/minute, a 0.5-μm-thick first layer was formed as a titanium carbonitride layer by a chemical vapor deposition method. With a starting material gas at 850° C. and 8 kPa, which comprised 81.3% by volume of an $H_2$ gas, 15.0% by volume of an $N_2$ gas, 1.5% by volume of a $TiCl_4$ gas, 1.0% by volume of a $CH_3CN$ gas, and 1.2% by volume of a $C_2H_6$ gas, continuously supplied to the CVD chamber at a flow rate of 6700 ml/minute, an 8-μm-thick second layer was then formed by a chemical vapor deposition method. Further, with a starting material gas at 850° C. and 8 kPa, which comprised 83.0% by volume of an $H_2$ gas, 15.0% by volume of an $N_2$ gas, 1.5% by volume of a $TiCl_4$ gas, and 0.5% by volume of a $CH_3CN$ gas, continuously supplied to the CVD chamber at a flow rate of 6600 ml/minute, a 2-μm-thick third layer was formed by a chemical vapor deposition method.

To form a bonding layer comprising a Ti(CN) layer and a Ti(CNO) layer, a starting material gas at 1000° C. and 20 kPa, which comprised 63.5% by volume of an $H_2$ gas, 32.0% by volume of an $N_2$ gas, 3.2% by volume of a $CH_4$ gas, and 1.3% by volume of a $TiCl_4$ gas, was first supplied to the CVD chamber at a flow rate of 6300 ml, to form a Ti(CN) layer having a thickness of 0.5 μm. A starting material gas at 1000° C. and 20 kPa, which comprised 61.3% by volume of an $H_2$ gas, 30.7% by volume of an $N_2$ gas, 3.0% by volume of a $CH_4$ gas, 1.2% by volume of a $TiCl_4$ gas, 3.0% by volume of a CO gas, and 0.8% by volume of a $CO_2$ gas, was continuously supplied to the CVD chamber at a flow rate of 6500 ml/minute, to form a Ti(CNO) layer having a thickness of 0.5 μm.

Further, a starting material gas at 1010° C. and 10 kPa, which comprised 9.2% by volume of an $AlCl_3$ gas, 85.3% by volume of an $H_2$ gas, 4.3% by volume of a $CO_2$ gas, 0.2% by volume of an $H_2S$ gas, and 1.0% by volume of an HCl gas, was supplied to the CVD chamber at a flow rate of 4700 ml, to form an α-aluminum oxide layer having a thickness of 6 μm, thereby obtaining a hard-coated turning insert.

(2) Measurement of Thickness

The average thickness of each of the first to third layers, the bonding layer and the α-aluminum oxide layer was determined by etching a film surface slantingly lapped at an angle of 2° with a Murakami reagent, observing five arbitrary portions in the etched surface by an optical microscope (magnification: 1000 times) to measure their thicknesses with respect to each layer, and averaging them. FIG. 4(*b*) shows one example of their optical photomicrographs. As is clear from FIG. 4(*b*), the first to third layers can be discerned by brightness differences corresponding to structural differences, which occurred due to the differences of starting material gases.

(3) Measurement of Crystal Structure

To identify the crystal structure of the hard coating, the hard coating surface was irradiated with CuKα1 rays having a wavelength λ of 0.15405 nm at an X-ray tube voltage of 45 kV and an X-ray tube current of 40 mA, by an X-ray diffraction apparatus (EMPYREAN available from PANalytical). FIG. 2 shows an X-ray diffraction pattern in a 2θ range of 9° to 145°. In the X-ray diffraction pattern shown in FIG. 2, diffraction peaks of the Ti(CN) film and diffraction peaks of α-aluminum oxide were observed.

FIG. 2(*b*) enlargedly shows a 2θ range of 121.0° to 125.0° in FIG. 2(*a*). As is clear from FIG. 2(*b*), the columnar crystalline Ti(CN) film formed on the insert in this Example had an X-ray diffraction peak of its (422) plane in a 2θ range of 122.7° to 124.0°, different from the columnar crystalline Ti(CN) film of JP 2008-87150 A having an X-ray diffraction peak of a (422) plane in a 2θ range of 121.5° to 122.6°. This difference appears to be mainly due to the differences between this Example and Patent Reference 1 in the compositions of starting material gases for their Ti(CN) films and their layer structures. Also, the segregation of carbon in the columnar crystalline Ti(CN) film of JP 2008-87150 A affects the above difference.

Figure 4A:
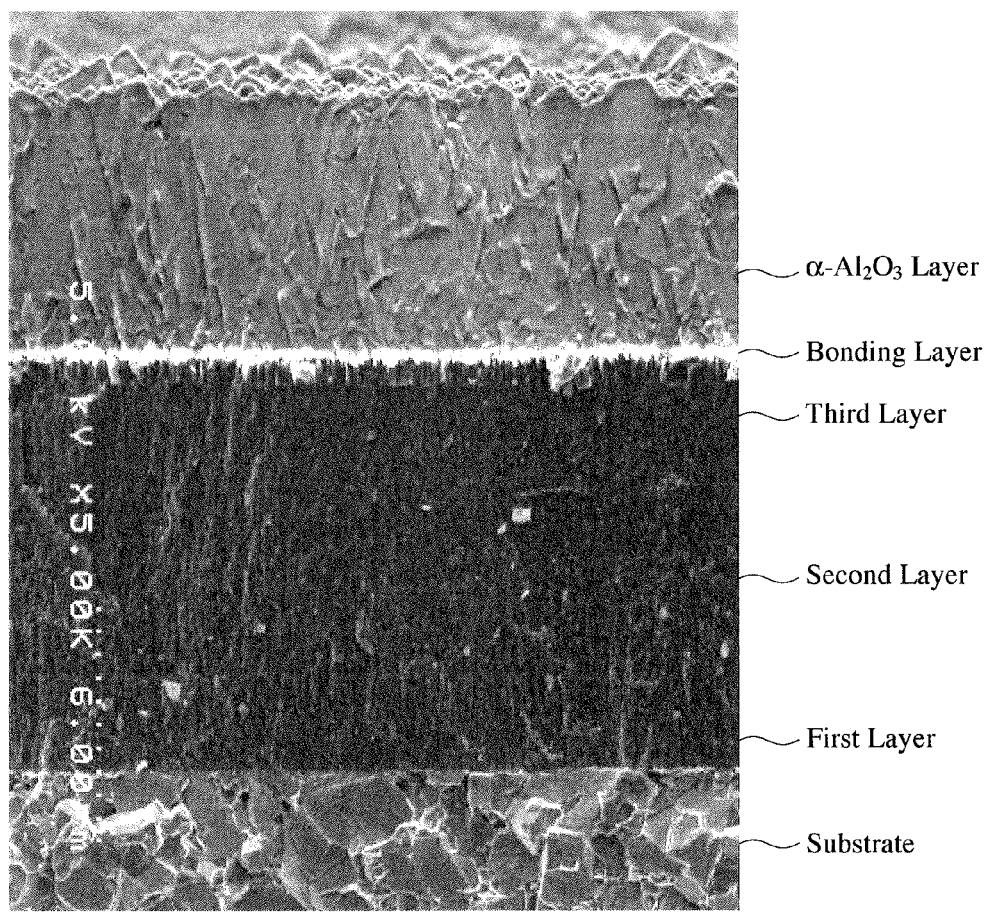
FIG. 4(a) is a scanning electron photomicrograph (magnification: 5000 times) showing a fracture surface structure of the hard-coated insert of Example 1.
Figure 4B:
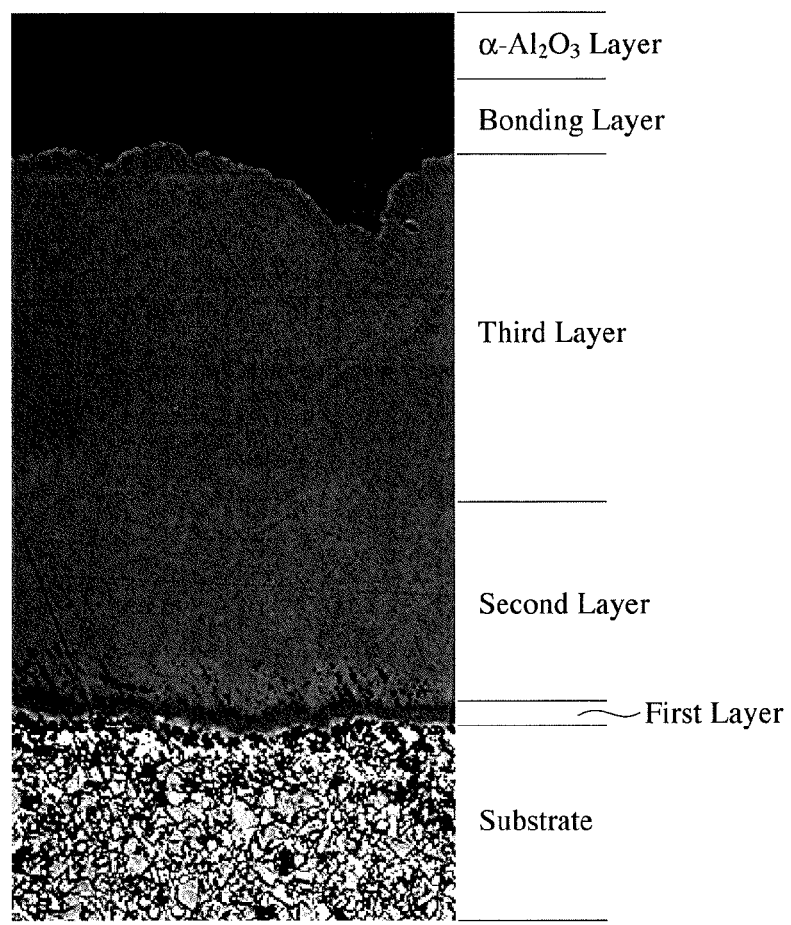
FIG. 4(b) is an optical photomicrograph (magnification: 1000 times) showing a slantingly lapped surface of the hard coating in the hard-coated insert of Example 1.
Figure 5:
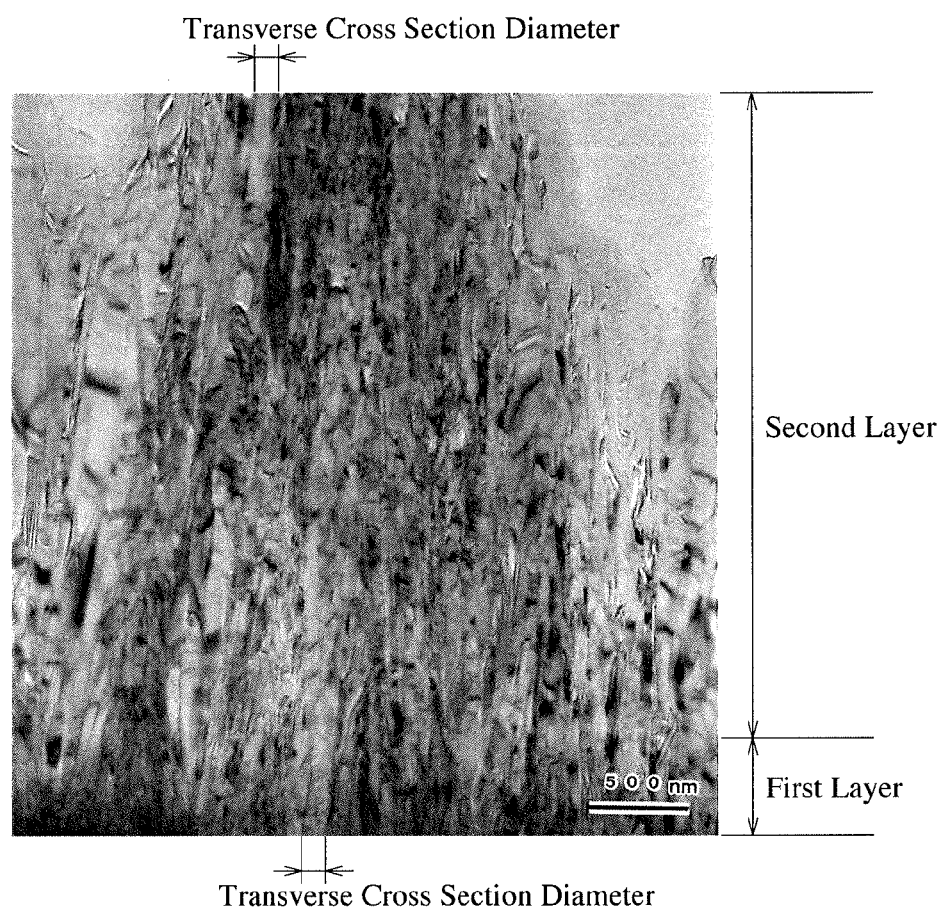
FIG. 5 is a transmission electron photomicrograph showing a fracture surface structure of the titanium carbonitride layer in the hard-coated insert of Example 1.

(4) Observation of Crystal Structure of Titanium Carbonitride Layer, and Measurement of Average Transverse Cross Section Diameter of Columnar Crystal Grains The observation of a fracture surface of the hard coating in a honed cutting edge portion by a scanning electron microscope (SEM, S-4200 available from Hitachi, Ltd., magnification: 5000 times) revealed that the titanium carbonitride layer (first to third layers) had a columnar crystal structure as shown in FIG. 4(a). Further, a fracture surface of the hard coating was observed by a transmission electron microscope. The results are shown in FIG. 5. As is clear from FIGS. 4(a) and 5, the titanium carbonitride layer (first to third layers) in the hard coating of Example 1 was composed of extremely fine crystal grains. The average transverse cross section diameter d of the titanium carbonitride crystal grains, which was determined from FIG. 4(a), was 0.07 µm, 0.07 µm and 0.08 µm, respectively, in the first to third layers.

(5) Measurement of Composition

Figure 6:
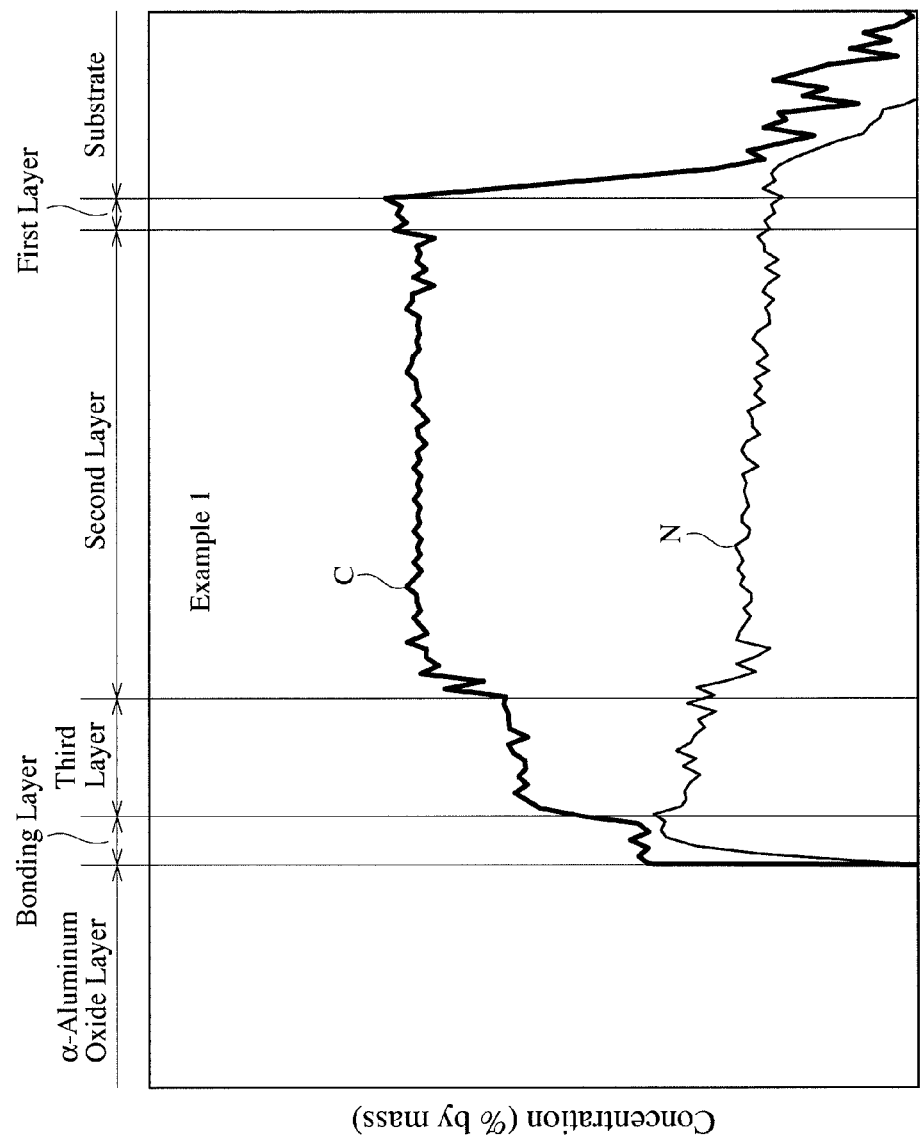
FIG. 6 is a graph showing the concentration distributions of C and N in a thickness direction in the titanium carbonitride layer of Example 1.

The amounts of Ti, C, N, and an element Me, if any, in the titanium carbonitride layer were measured by an electron probe microanalyzer (EPMA, JXA-8500F available from JEOL Ltd.), at acceleration voltage of 10 kV, irradiation current of 0.05 A, and a beam diameter of 0.5 µm. The compositions of the first thin layer, crystal grain boundaries and crystal grains were analyzed by an energy-dispersive X-ray spectrometer (EDS) attached to a field emission transmission electron microscope (TEM, JEM-2010F available from JEOL Ltd.), and a scanning Auger electron microscope (SMART-200 available from PHI, accelerating voltage: 10 kV, sample current: 10 nA, and electron probe diameter: 0.1 µm or less). The composition analysis of each of the first to third layers by EPMA, EDS and the Auger electron spectroscopy (AES) was conducted at a center position in a thickness direction. The ratio $(x_1 b_1 / x_2 b_2)$ of the C content in crystal grains to the C content in crystal grain boundaries in the second layer was 0.30. The concentration distributions of C and N in a thickness direction in the titanium carbonitride layer (the first to third layers) are shown in FIG. 6. As shown in Tables 1-3, the ratio of C/(C+N) was 0.70 in the first layer, 0.69 in the second layer, and 0.58 in the third layer.

(6) Measurement of Hardness

Using a nanoindenter system (ENT-1100 available from Elionix Inc.) using a single crystal of Si as a standard sample, the hardness of the second and third layers was measured at five center points in a thickness direction by a nanoindentation method, and averaged. The measurement conditions were a maximum load of 4900 mN, a load speed of 49 mN/second, a load-releasing speed of 49 mN/second, and a holding time of 1 second. The results are shown in Tables 1 to 3.

(7) Evaluation of Performance

Each hard coating formed on the turning insert was evaluated with respect to peeling and tool life by the following turning conditions. The peeling of the hard coating was evaluated by observing the presence of peeled portions by an optical microscope (magnification: 100 times) after cutting for 2 minutes. The tool life was defined as a time period of machining conducted until the maximum wear width of a flank exceeded 0.350 mm, until the hard coating peeled, or until the hard coating was chipped.

Work: SUS316L,
Machining method: Continuous turning,
Tool shape: TNMG160408,
Cutting speed: 200 m/minute,
Feed: 0.30 mm/revolution,
Cutting depth: 1.2 mm, and
Cutting fluid: Aqueous cutting liquid.

EXAMPLES 2-31

Figure 7:
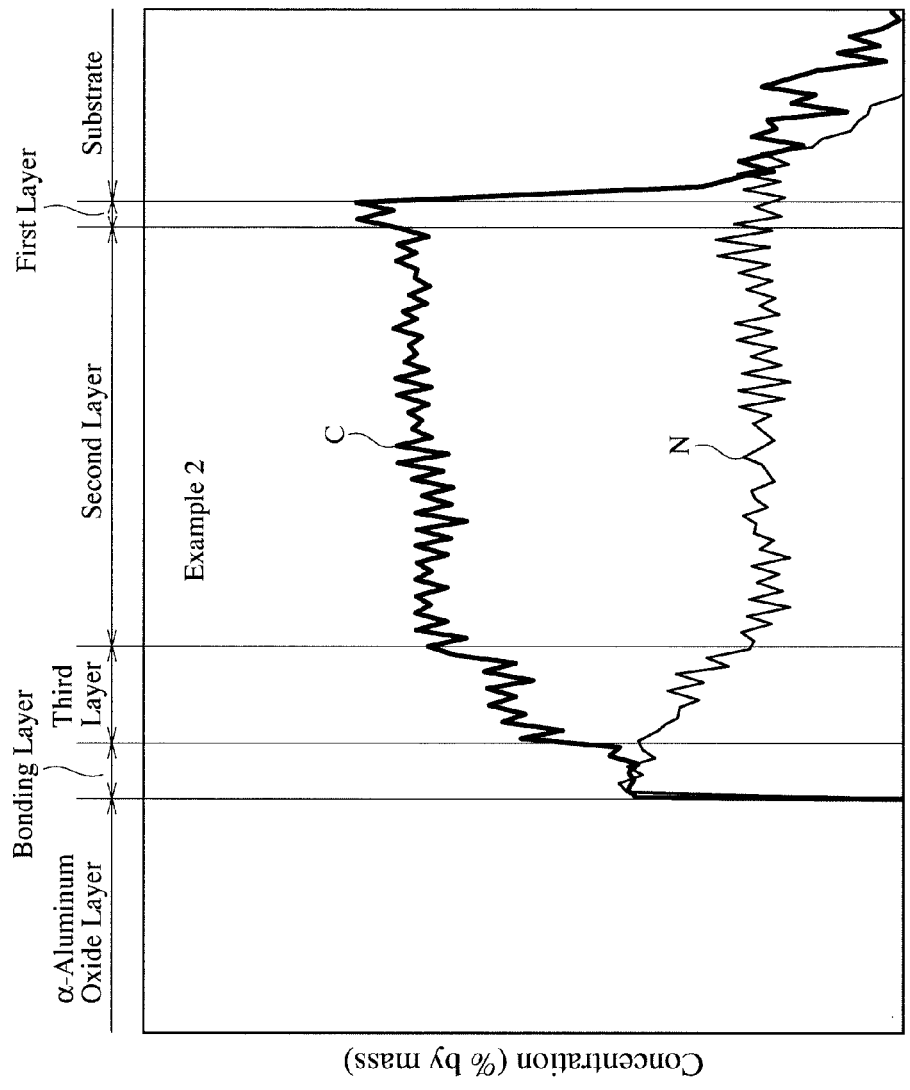
FIG. 7 is a graph showing the concentration distributions of C and N in a thickness direction in the titanium carbonitride layer of Example 2.

The titanium carbonitride layers, bonding layers and oxide layers of Examples 2-31 were formed in the same manner as in Example 1, except for changing the film-forming conditions of the first to third layers and the compositions of the bonding layers as shown in Tables 1-4, and their properties and performance were evaluated in the same manner as in Example 1. The concentration distributions of C and N in a thickness direction in the titanium carbonitride layer (first to third layers) of Example 2 are shown in FIG. 7.

COMPARATIVE EXAMPLES 1-8

The hard coatings of Comparative Examples 1-8 were formed in the same manner as in Example 1, except for changing the film-forming conditions of the first to third layers and the compositions of the bonding layers as shown in Tables 5-9, and the properties and performance of the resultant hard-coated cutting inserts were evaluated in the same manner as in Example 1. In Comparative Example 1, a single layer of titanium carbonitride, which corresponded to the first layer, was formed using a starting material gas containing a $C_2H_6$ gas without a $CH_3CN$ gas. In Comparative Example 2, a single layer of titanium carbonitride, which corresponded to the third layer, was formed using a starting material gas containing a $CH_3CN$ gas without a $C_2H_6$ gas. In Comparative Example 3, a single layer of titanium carbonitride was formed by the method described in JP 2008-87150 A using a starting material gas containing no $N_2$ gas. In Comparative Example 4, a $CH_4$ gas was used to form the first to third layers. In Comparative Examples 5 and 6, the same TiN layer and Ti(CN) layer as in JP 2005-153098 A were formed. In Comparative Example 7, the same TiN layer and Ti(CN) layer as in JP 2006-315154 A were formed. The Ti(CN) layer in Comparative Example 7 was constituted by the first and third layers in the present invention. In Comparative Example 8, the same hard coating as in Comparative Example 7 except for the absence of a TiN layer, which comprised a Ti(CN) layer having the first and third layers, a bonding layer and an alumina layer, was formed.

Figure 8:
FIG. 8 is a transmission electron photomicrograph showing a fracture surface structure of the titanium carbonitride layer in the hard-coated insert of Comparative Example 3.
Figure 9:
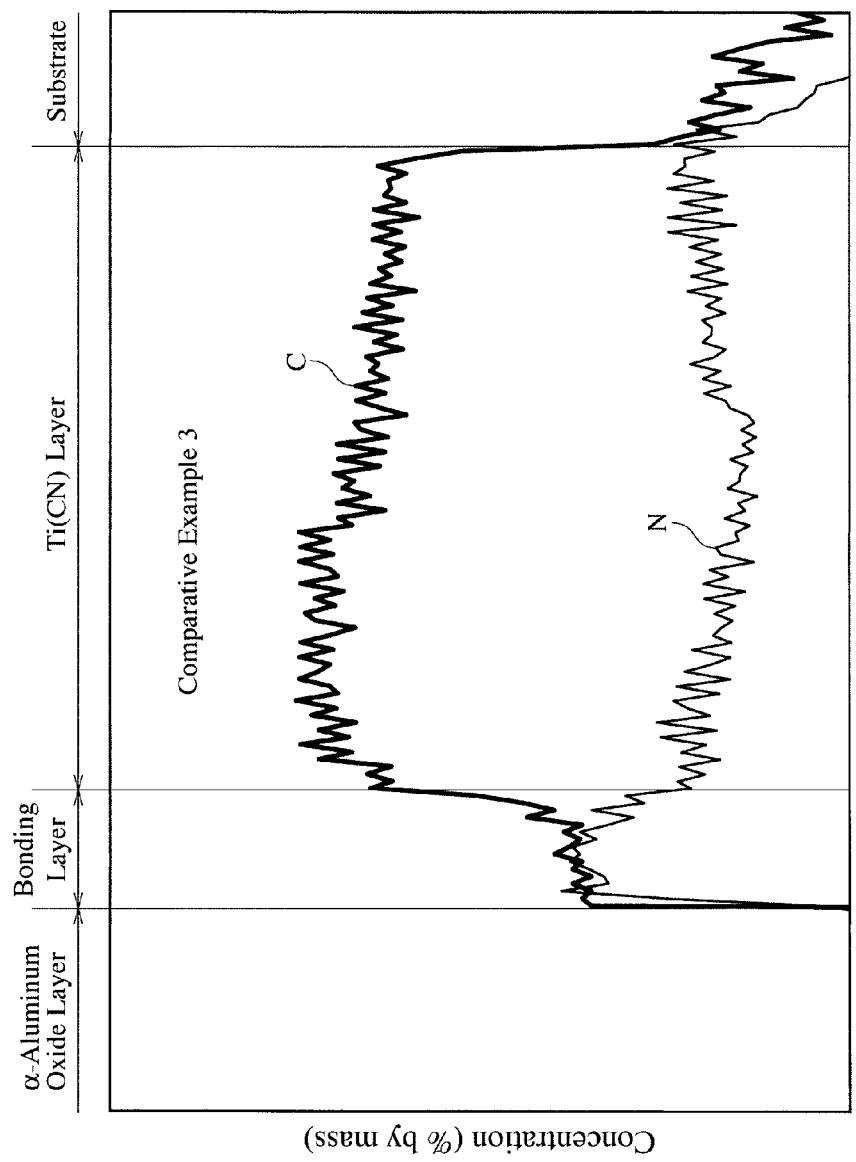
FIG. 9 is a graph showing the concentration distributions of C and N in a thickness direction in the titanium carbonitride layer of Comparative Example 3.

FIG. 8 is a transmission electron photomicrograph showing a cross section structure of the titanium carbonitride layer (single layer) of Comparative Example 3. The average transverse cross section diameter d of titanium carbonitride crystal grains in Comparative Example 3, which was measured in FIG. 8, was 0.5 µm. The $(x_1 b_1 / x_2 b_2)$ of Comparative Example 3 measured at a depth position (distance from the substrate) in the titanium carbonitride layer, which corresponded to the measurement position of the ratio $(x_1 b_1 / x_2 b_2)$ of the C content in crystal grains to the C content in crystal grain boundaries in the second layer of Example 1, was 1.00. FIG. 9 shows the concentration distributions of C and N in a thickness direction in the hard coating of Comparative Example 3.

With respect to each of Examples 1-31, the film-forming conditions and properties (composition, structure and thickness) of the first layer are shown in Table 1, the film-forming conditions, properties (composition, structure and thickness) and crystal composition of the second layer are shown in Table 2, the film-forming conditions and properties (composition, structure and thickness) of the third layer are shown in Table 3, and the composition of the bonding layer and the cutting evaluation results are shown in Table 4. With respect to each of Comparative Examples 1-8, the film-forming conditions and properties (composition, structure and thickness) of the first layer are shown in Tables 5 and 7, the film-forming conditions, properties (composition, structure and thickness) and crystal composition of the second layer are shown in Table 8, the film-forming conditions and properties (composition, structure and thickness) of the third layer are shown in Table 9, and the composition of the bonding layer and the cutting evaluation results are shown in Table 10. Incidentally, the composition of the Ti(CN) layer of each Comparative Example 1, 3, which was a single layer, was measured at a position corresponding to the thickness-direction center of each of the first to third layers in Example 1.

TABLE 1-1

| | Film-Forming Conditions of First Layer [Ti(CN)] | | | | | | |
|---|---|---|---|---|---|---|---|
| | Film-Forming Temperature | Film-Forming Pressure | Composition of Starting Material Gas (% by volume) | | | | Hydrocarbon |
| No. | (°C.) | (kPa) | $H_2$ | $N_2$ | $TiCl_4$ | $CH_3CN$ | Gas/Conc |
| Ex. 1 | 850 | 10 | 66.0 | 32.2 | 0.5 | 0.0 | $C_2H_6$/1.3 |
| Ex. 2 | 880 | 10 | 65.9 | 32.3 | 0.5 | 0.0 | $C_2H_6$/1.3 |
| Ex. 3 | 800 | 10 | 65.9 | 32.3 | 0.5 | 0.0 | $C_2H_6$/1.3 |
| Ex. 4 | 750 | 10 | 65.9 | 32.3 | 0.5 | 0.0 | $C_2H_6$/1.3 |
| Ex. 5 | 850 | 5 | 65.9 | 32.3 | 0.5 | 0.0 | $C_2H_6$/1.3 |
| Ex. 6 | 850 | 15 | 65.9 | 32.3 | 0.5 | 0.0 | $C_2H_6$/1.3 |
| Ex. 7 | 850 | 10 | 78.2 | 20.0 | 0.5 | 0.0 | $C_2H_6$/1.3 |
| Ex. 8 | 850 | 10 | 59.0 | 39.2 | 0.5 | 0.0 | $C_2H_6$/1.3 |
| Ex. 9 | 850 | 10 | 66.1 | 32.3 | 0.3 | 0.0 | $C_2H_6$/1.3 |
| Ex. 10 | 850 | 10 | 66.0 | 32.2 | 0.5 | 0.0 | $C_2H_6$/1.3 |
| Ex. 11 | 850 | 10 | 65.6 | 32.3 | 0.8 | 0.0 | $C_2H_6$/1.3 |
| Ex. 12-1 | 850 | 10 | 65.9 | 32.3 | 0.5 | 0.0 | $C_2H_6$/1.3 |
| Ex. 12-2 | 850 | 10 | 65.9 | 32.3 | 0.5 | 0.0 | $C_2H_6$/1.3 |
| Ex. 13 | 850 | 10 | 65.0 | 33.2 | 0.8 | 0.0 | $C_2H_6$/1.3 |
| Ex. 14 | 850 | 10 | 65.0 | 33.2 | 0.5 | 0.0 | $C_2H_6$/1.3 |
| Ex. 15 | 850 | 10 | 66.4 | 32.3 | 0.5 | 0.0 | $C_2H_6$/0.8 |
| Ex. 16 | 850 | 10 | 65.7 | 32.3 | 0.5 | 0.0 | $C_2H_6$/1.5 |
| Ex. 17 | 850 | 10 | 65.2 | 32.3 | 0.5 | 0.0 | $C_2H_6$/2.0 |
| Ex. 18 | 850 | 10 | 65.9 | 32.3 | 0.5 | 0.0 | $C_2H_6$/1.3 |
| Ex. 19 | 850 | 10 | 65.9 | 32.3 | 0.5 | 0.0 | $C_2H_6$/1.3 |
| Ex. 20 | 850 | 10 | 65.9 | 32.3 | 0.5 | 0.0 | $C_2H_6$/1.3 |
| Ex. 21 | 850 | 10 | 65.9 | 32.3 | 0.5 | 0.0 | $C_2H_6$/1.3 |
| Ex. 22 | 850 | 10 | 65.9 | 32.3 | 0.5 | 0.0 | $C_3H_8$/1.3 |
| Ex. 23 | 850 | 10 | 65.9 | 32.3 | 0.5 | 0.0 | $C_4H_{10}$/1.3 |
| Ex. 24 | 850 | 10 | 65.9 | 32.3 | 0.5 | 0.0 | $C_2H_4$/1.3 |
| Ex. 25 | 850 | 10 | 65.0 | 33.2 | 0.5 | 0.0 | $C_2H_6$/1.3 |
| Ex. 26 | 850 | 10 | 65.0 | 33.2 | 0.5 | 0.0 | $C_2H_6$/1.3 |
| Ex. 27 | 850 | 10 | 65.0 | 33.2 | 0.5 | 0.0 | $C_2H_6$/1.3 |
| Ex. 28 | 850 | 10 | 65.0 | 33.2 | 0.5 | 0.0 | $C_2H_6$/1.3 |
| Ex. 29 | 850 | 10 | 65.0 | 33.2 | 0.5 | 0.0 | $C_2H_6$/1.3 |
| Ex. 30 | 850 | 10 | 65.0 | 33.2 | 0.5 | 0.0 | $C_2H_6$/1.3 |
| Ex. 31 | 850 | 10 | 65.0 | 33.2 | 0.5 | 0.0 | $C_2H_6$/1.3 |

TABLE 1-2

| | First Layer [Ti(CN)] | | | | | | |
|---|---|---|---|---|---|---|---|
| | Composition (% by mass) | | | | | Thickness | $d^{(1)}$ |
| No. | Ti | C | N | C/(C + N) | Structure | (µm) | (µm) |
| Ex. 1 | 78.3 | 15.2 | 6.5 | 0.70 | Columnar | 0.5 | 0.07 |
| Ex. 2 | 78.2 | 15.6 | 6.2 | 0.72 | Columnar | 0.5 | 0.20 |
| Ex. 3 | 78.1 | 15.0 | 6.9 | 0.68 | Columnar | 0.5 | 0.10 |
| Ex. 4 | 78.0 | 14.8 | 7.2 | 0.67 | Columnar | 0.5 | 0.11 |
| Ex. 5 | 78.2 | 15.4 | 6.4 | 0.71 | Columnar | 0.5 | —$^{(2)}$ |
| Ex. 6 | 78.1 | 15.2 | 6.7 | 0.69 | Columnar | 0.5 | —$^{(2)}$ |
| Ex. 7 | 78.6 | 15.2 | 6.2 | 0.71 | Columnar | 0.5 | —$^{(2)}$ |
| Ex. 8 | 78.2 | 14.5 | 7.3 | 0.66 | Columnar | 0.5 | 0.20 |
| Ex. 9 | 78.3 | 14.8 | 6.9 | 0.68 | Columnar | 0.5 | —$^{(2)}$ |
| Ex. 10 | 78.4 | 15.5 | 6.1 | 0.72 | Columnar | 0.5 | —$^{(2)}$ |
| Ex. 11 | 78.3 | 15.2 | 6.5 | 0.70 | Columnar | 0.5 | —$^{(2)}$ |
| Ex. 12-1 | 78.1 | 15.2 | 6.7 | 0.69 | Columnar | 0.5 | —$^{(2)}$ |
| Ex. 12-2 | 78.2 | 15.1 | 6.7 | 0.69 | Columnar | 0.5 | —$^{(2)}$ |
| Ex. 13 | 78.3 | 15.3 | 6.4 | 0.71 | Columnar | 0.5 | 0.12 |
| Ex. 14 | 78.2 | 15.5 | 6.3 | 0.71 | Columnar | 0.5 | 0.24 |
| Ex. 15 | 79.0 | 14.5 | 6.5 | 0.69 | Columnar | 0.5 | —$^{(2)}$ |
| Ex. 16 | 76.2 | 17.2 | 6.6 | 0.72 | Columnar | 0.5 | —$^{(2)}$ |
| Ex. 17 | 75.2 | 18.3 | 6.5 | 0.74 | Columnar | 0.5 | —$^{(2)}$ |
| Ex. 18 | 78.3 | 15.8 | 5.9 | 0.73 | Columnar | 0.01 | —$^{(2)}$ |
| Ex. 19 | 78.3 | 15.9 | 5.8 | 0.73 | Columnar | 0.1 | —$^{(2)}$ |
| Ex. 20 | 76.2 | 17.2 | 6.6 | 0.72 | Columnar | 1.0 | 0.11 |
| Ex. 21 | 76.4 | 17.5 | 6.1 | 0.74 | Columnar | 2.0 | 0.12 |

TABLE 1-2-continued

| | First Layer [Ti(CN)] | | | | | | |
|---|---|---|---|---|---|---|---|
| | Composition (% by mass) | | | | | Thickness | d[(1)] |
| No. | Ti | C | N | C/(C + N) | Structure | (μm) | (μm) |
| Ex. 22 | 76.2 | 18.5 | 5.3 | 0.78 | Columnar | 0.5 | —[(2)] |
| Ex. 23 | 76.4 | 20.0 | 3.6 | 0.85 | Columnar | 0.5 | —[(2)] |
| Ex. 24 | 76.0 | 19.5 | 4.5 | 0.81 | Columnar | 0.5 | —[(2)] |
| Ex. 25 | 78.1 | 15.5 | 6.4 | 0.71 | Columnar | 0.5 | —[(2)] |
| Ex. 26 | 78.0 | 15.4 | 6.6 | 0.70 | Columnar | 0.5 | —[(2)] |
| Ex. 27 | 78.3 | 15.5 | 6.2 | 0.71 | Columnar | 0.5 | —[(2)] |
| Ex. 28 | 78.0 | 15.4 | 6.6 | 0.70 | Columnar | 0.5 | —[(2)] |
| Ex. 29 | 78.2 | 15.4 | 6.4 | 0.71 | Columnar | 0.5 | —[(2)] |
| Ex. 30 | 78.1 | 15.5 | 6.4 | 0.71 | Columnar | 0.5 | —[(2)] |
| Ex. 31 | 78.0 | 15.3 | 6.7 | 0.70 | Columnar | 0.5 | —[(2)] |

Note:
[(1)]Average transverse cross section diameter.
[(2)]Not measured.

TABLE 2-1

| | Film-Forming Conditions of Second Layer [Ti(CN)] | | | | | |
|---|---|---|---|---|---|---|
| | Film-Forming | Film-Forming | Composition of Starting Material Gas (% by volume) | | | |
| No. | Temperature (°C.) | Pressure (kPa) | $H_2$ | $N_2$ | $TiCl_4$ | $CH_3CN$ | Hydrocarbon Gas/Conc. |
| Ex. 1 | 850 | 8 | 81.3 | 15.0 | 1.5 | 1.0 | $C_2H_6$/1.2 |
| Ex. 2 | 880 | 8 | 81.3 | 15.0 | 1.5 | 1.0 | $C_2H_6$/1.2 |
| Ex. 3 | 800 | 8 | 81.3 | 15.0 | 1.5 | 1.0 | $C_2H_6$/1.2 |
| Ex. 4 | 750 | 8 | 81.3 | 15.0 | 1.5 | 1.0 | $C_2H_6$/1.2 |
| Ex. 5 | 850 | 5 | 81.3 | 15.0 | 1.5 | 1.0 | $C_2H_6$/1.2 |
| Ex. 6 | 850 | 9 | 81.3 | 15.0 | 1.5 | 1.0 | $C_2H_6$/1.2 |
| Ex. 7 | 850 | 8 | 86.3 | 10.0 | 1.5 | 1.0 | $C_2H_6$/1.2 |
| Ex. 8 | 850 | 8 | 75.0 | 21.3 | 1.5 | 1.0 | $C_2H_6$/1.2 |
| Ex. 9 | 850 | 8 | 81.8 | 15.0 | 1.0 | 1.0 | $C_2H_6$/1.2 |
| Ex. 10 | 850 | 8 | 79.0 | 16.8 | 2.0 | 1.0 | $C_2H_6$/1.2 |
| Ex. 11 | 850 | 8 | 80.3 | 15.0 | 2.5 | 1.0 | $C_2H_6$/1.2 |
| Ex. 12-1 | 850 | 8 | 82.1 | 15.0 | 1.5 | 0.2 | $C_2H_6$/1.2 |
| Ex. 12-2 | 850 | 8 | 81.7 | 15.0 | 1.5 | 0.6 | $C_2H_6$/1.2 |
| Ex. 13 | 850 | 8 | 81.9 | 14.5 | 1.5 | 0.9 | $C_2H_6$/1.2 |
| Ex. 14 | 850 | 8 | 81.6 | 14.5 | 1.5 | 1.2 | $C_2H_6$/1.2 |
| Ex. 15 | 850 | 8 | 81.7 | 15.0 | 1.5 | 1.0 | $C_2H_6$/0.8 |
| Ex. 16 | 850 | 8 | 81.0 | 15.0 | 1.5 | 1.0 | $C_2H_6$/1.5 |
| Ex. 17 | 850 | 8 | 80.5 | 15.0 | 1.5 | 1.0 | $C_2H_6$/2.0 |
| Ex. 18 | 850 | 8 | 81.3 | 15.0 | 1.5 | 1.0 | $C_2H_6$/1.2 |
| Ex. 19 | 850 | 8 | 81.3 | 15.0 | 1.5 | 1.0 | $C_2H_6$/1.2 |
| Ex. 20 | 850 | 8 | 81.3 | 15.0 | 1.5 | 1.0 | $C_2H_6$/1.2 |
| Ex. 21 | 850 | 8 | 81.3 | 15.0 | 1.5 | 1.0 | $C_2H_6$/1.2 |
| Ex. 22 | 850 | 8 | 81.3 | 15.0 | 1.5 | 1.0 | $C_3H_8$/1.2 |
| Ex. 23 | 850 | 8 | 81.3 | 15.0 | 1.5 | 1.0 | $C_4H_{10}$/1.2 |
| Ex. 24 | 850 | 8 | 81.3 | 15.0 | 1.5 | 1.0 | $C_2H_4$/1.2 |
| Ex. 25 | 850 | 10 | 81.1 | 15.2 | 1.5 | 1.0 | $C_2H_6$/1.2 |
| Ex. 26 | 850 | 10 | 81.1 | 15.2 | 1.5 | 1.0 | $C_2H_6$/1.2 |
| Ex. 27 | 850 | 10 | 81.1 | 15.2 | 1.5 | 1.0 | $C_2H_6$/1.2 |
| Ex. 28 | 850 | 10 | 81.1 | 15.2 | 1.5 | 1.0 | $C_2H_6$/1.2 |
| Ex. 29 | 850 | 10 | 81.1 | 15.2 | 1.5 | 1.0 | $C_2H_6$/1.2 |
| Ex. 30 | 850 | 10 | 81.1 | 15.2 | 1.5 | 1.0 | $C_2H_6$/1.2 |
| Ex. 31 | 850 | 10 | 81.1 | 15.2 | 1.5 | 1.0 | $C_2H_6$/1.2 |

TABLE 2-2

| | Second Layer [Ti(CN)] | | | | | | | |
|---|---|---|---|---|---|---|---|---|
| | Composition (% by mass) | | | | | Thickness | | |
| No. | Ti | C | N | C/(C + N) | Structure | (μm) | d[(1)] (μm) | Hardness (GPa) |
| Ex. 1 | 78.3 | 14.9 | 6.8 | 0.69 | Columnar | 8 | 0.07 | 38 |
| Ex. 2 | 78.8 | 14.8 | 6.4 | 0.70 | Columnar | 8 | 0.20 | 33 |
| Ex. 3 | 78.5 | 14.7 | 6.8 | 0.68 | Columnar | 8 | 0.10 | 37 |
| Ex. 4 | 78.9 | 14.3 | 6.8 | 0.68 | Columnar | 8 | 0.12 | 34 |
| Ex. 5 | 78.3 | 14.5 | 7.2 | 0.67 | Columnar | 8 | —[(2)] | —[(2)] |
| Ex. 6 | 78.2 | 14.8 | 7.0 | 0.68 | Columnar | 8 | —[(2)] | —[(2)] |
| Ex. 7 | 78.5 | 14.2 | 7.3 | 0.66 | Columnar | 8 | —[(2)] | —[(2)] |
| Ex. 8 | 78.3 | 14.2 | 7.2 | 0.66 | Columnar | 8 | 0.20 | 33 |
| Ex. 9 | 78.3 | 14.4 | 7.3 | 0.66 | Columnar | 8 | —[(2)] | —[(2)] |
| Ex. 10 | 78.4 | 15.2 | 6.4 | 0.70 | Columnar | 8 | —[(2)] | —[(2)] |

TABLE 2-2-continued

| | Second Layer [Ti(CN)] | | | | | | | |
|---|---|---|---|---|---|---|---|---|
| | Composition (% by mass) | | | | | Thickness | | |
| No. | Ti | C | N | C/(C + N) | Structure | (μm) | $d^{(1)}$ (μm) | Hardness (GPa) |
| Ex. 11 | 78.3 | 15.1 | 6.6 | 0.70 | Columnar | 8 | —$^{(2)}$ | —$^{(2)}$ |
| Ex. 12-1 | 78.0 | 17.0 | 5.0 | 0.77 | Columnar | 8 | —$^{(2)}$ | —$^{(2)}$ |
| Ex. 12-2 | 78.5 | 15.0 | 6.5 | 0.70 | Columnar | 8 | —$^{(2)}$ | —$^{(2)}$ |
| Ex. 13 | 78.2 | 15.0 | 6.8 | 0.69 | Columnar | 8 | 0.13 | 39 |
| Ex. 14 | 78.3 | 15.1 | 6.6 | 0.70 | Columnar | 8 | 0.25 | 33 |
| Ex. 15 | 78.5 | 13.4 | 8.5 | 0.61 | Columnar | 8 | —$^{(2)}$ | —$^{(2)}$ |
| Ex. 16 | 76.5 | 16.0 | 7.5 | 0.68 | Columnar | 8 | —$^{(2)}$ | —$^{(2)}$ |
| Ex. 17 | 75.0 | 17.2 | 7.8 | 0.69 | Columnar | 8 | —$^{(2)}$ | —$^{(2)}$ |
| Ex. 18 | 78.0 | 15.0 | 7.0 | 0.68 | Columnar | 1 | —$^{(2)}$ | —$^{(2)}$ |
| Ex. 19 | 78.2 | 15.3 | 6.5 | 0.70 | Columnar | 2 | —$^{(2)}$ | —$^{(2)}$ |
| Ex. 20 | 78.1 | 15.7 | 6.2 | 0.72 | Columnar | 10 | —$^{(2)}$ | —$^{(2)}$ |
| Ex. 21 | 78.0 | 15.5 | 6.5 | 0.70 | Columnar | 20 | —$^{(2)}$ | —$^{(2)}$ |
| Ex. 22 | 76.3 | 18.2 | 5.5 | 0.77 | Columnar | 8 | —$^{(2)}$ | —$^{(2)}$ |
| Ex. 23 | 76.2 | 18.4 | 5.4 | 0.77 | Columnar | 8 | —$^{(2)}$ | —$^{(2)}$ |
| Ex. 24 | 78.1 | 18.1 | 3.8 | 0.83 | Columnar | 8 | —$^{(2)}$ | —$^{(2)}$ |
| Ex. 25 | 78.0 | 15.1 | 6.9 | 0.69 | Columnar | 8 | —$^{(2)}$ | —$^{(2)}$ |
| Ex. 26 | 78.2 | 15.0 | 6.8 | 0.69 | Columnar | 8 | —$^{(2)}$ | —$^{(2)}$ |
| Ex. 27 | 78.3 | 15.1 | 6.6 | 0.70 | Columnar | 8 | —$^{(2)}$ | —$^{(2)}$ |
| Ex. 28 | 78.1 | 15.0 | 6.9 | 0.69 | Columnar | 8 | —$^{(2)}$ | —$^{(2)}$ |
| Ex. 29 | 78.2 | 15.1 | 6.7 | 0.69 | Columnar | 8 | —$^{(2)}$ | —$^{(2)}$ |
| Ex. 30 | 78.1 | 14.9 | 7.0 | 0.68 | Columnar | 8 | —$^{(2)}$ | —$^{(2)}$ |
| Ex. 31 | 78.2 | 14.9 | 6.9 | 0.68 | Columnar | 8 | —$^{(2)}$ | —$^{(2)}$ |

Note:
$^{(1)}$Average transverse cross section diameter.
$^{(2)}$Not measured.

TABLE 2-3

| | Crystal Composition of Second Layer [Ti(CN)] (by mass ratio) | | | | | | | | |
|---|---|---|---|---|---|---|---|---|---|
| | Composition of Crystal Grains $[Ti_{a_1}(C_{x_1}N_{y_1})_{b_1}]$ | | | | Composition of Crystal Grain Boundaries $[Ti_{a_2}(C_{x_2}N_{y_2})_{b_2}]$ | | | | |
| No | $a_1$ | $b_1$ | $x_1$ | $y_1$ | $a_2$ | $b_2$ | $x_2$ | $y_2$ | $x_1 b_1 / x_2 b_2^{(1)}$ |
| Ex. 1 | 0.79 | 0.21 | 0.64 | 0.36 | 0.48 | 0.52 | 0.82 | 0.18 | 0.30 |
| Ex. 2 | 0.78 | 0.22 | 0.66 | 0.34 | 0.45 | 0.55 | 0.81 | 0.19 | 0.33 |
| Ex. 3 | 0.79 | 0.21 | 0.67 | 0.33 | 0.44 | 0.56 | 0.82 | 0.18 | 0.30 |
| Ex. 4 | 0.80 | 0.20 | 0.68 | 0.32 | 0.46 | 0.54 | 0.83 | 0.17 | 0.31 |
| Ex. 5 | 0.78 | 0.22 | 0.65 | 0.35 | 0.43 | 0.57 | 0.88 | 0.12 | 0.28 |
| Ex. 6 | 0.75 | 0.25 | 0.68 | 0.32 | 0.45 | 0.55 | 0.85 | 0.15 | 0.36 |
| Ex. 7 | 0.79 | 0.21 | 0.68 | 0.32 | 0.46 | 0.54 | 0.78 | 0.22 | 0.33 |
| Ex. 8 | 0.78 | 0.22 | 0.65 | 0.35 | 0.44 | 0.56 | 0.86 | 0.14 | 0.30 |
| Ex. 9 | 0.78 | 0.22 | 0.61 | 0.39 | 0.49 | 0.51 | 0.75 | 0.25 | 0.34 |
| Ex. 10 | 0.79 | 0.21 | 0.67 | 0.33 | 0.47 | 0.53 | 0.76 | 0.24 | 0.35 |
| Ex. 11 | 0.76 | 0.24 | 0.64 | 0.36 | 0.46 | 0.54 | 0.73 | 0.27 | 0.38 |
| Ex. 12-1 | 0.70 | 0.30 | 0.66 | 0.34 | 0.47 | 0.53 | 0.84 | 0.16 | 0.44 |
| Ex. 12-2 | 0.69 | 0.31 | 0.64 | 0.36 | 0.48 | 0.52 | 0.78 | 0.22 | 0.49 |
| Ex. 13 | 0.74 | 0.26 | 0.64 | 0.36 | 0.42 | 0.58 | 0.82 | 0.18 | 0.35 |
| Ex. 14 | 0.78 | 0.22 | 0.63 | 0.37 | 0.44 | 0.56 | 0.82 | 0.18 | 0.30 |
| Ex. 15 | 0.73 | 0.27 | 0.66 | 0.34 | 0.49 | 0.51 | 0.76 | 0.24 | 0.46 |
| Ex. 16 | 0.76 | 0.24 | 0.65 | 0.35 | 0.43 | 0.57 | 0.82 | 0.18 | 0.34 |
| Ex. 17 | 0.72 | 0.28 | 0.66 | 0.34 | 0.44 | 0.56 | 0.81 | 0.19 | 0.40 |
| Ex. 18 | 0.79 | 0.21 | 0.68 | 0.32 | 0.42 | 0.58 | 0.82 | 0.18 | 0.29 |
| Ex. 19 | 0.78 | 0.22 | 0.64 | 0.36 | 0.40 | 0.60 | 0.80 | 0.20 | 0.29 |
| Ex. 20 | 0.76 | 0.24 | 0.63 | 0.37 | 0.47 | 0.53 | 0.79 | 0.21 | 0.36 |
| Ex. 21 | 0.77 | 0.23 | 0.64 | 0.36 | 0.46 | 0.54 | 0.80 | 0.20 | 0.35 |
| Ex. 22 | 0.75 | 0.25 | 0.64 | 0.36 | 0.42 | 0.58 | 0.85 | 0.15 | 0.33 |
| Ex. 23 | 0.72 | 0.28 | 0.64 | 0.36 | 0.41 | 0.59 | 0.86 | 0.14 | 0.35 |
| Ex. 24 | 0.71 | 0.29 | 0.64 | 0.36 | 0.40 | 0.60 | 0.88 | 0.12 | 0.36 |
| Ex. 25 | 0.77 | 0.23 | 0.61 | 0.39 | 0.48 | 0.52 | 0.81 | 0.19 | 0.33 |
| Ex. 26 | 0.79 | 0.21 | 0.60 | 0.40 | 0.48 | 0.52 | 0.71 | 0.29 | 0.34 |
| Ex. 27 | 0.78 | 0.22 | 0.61 | 0.39 | 0.48 | 0.52 | 0.72 | 0.28 | 0.36 |
| Ex. 28 | 0.79 | 0.21 | 0.60 | 0.38 | 0.48 | 0.52 | 0.71 | 0.29 | 0.34 |
| Ex. 29 | 0.76 | 0.24 | 0.59 | 0.41 | 0.48 | 0.52 | 0.71 | 0.29 | 0.38 |
| Ex. 30 | 0.77 | 0.23 | 0.62 | 0.38 | 0.48 | 0.52 | 0.70 | 0.30 | 0.39 |
| Ex. 31 | 0.79 | 0.21 | 0.61 | 0.39 | 0.48 | 0.52 | 0.69 | 0.31 | 0.36 |

Note:
$^{(1)}$A ratio of the carbon content ($x_1 b_1$) in crystal grains to the carbon content ($x_2 b_2$) in crystal grain boundaries.

TABLE 3-1

| | Film Forming | | Composition of Starting Material Gas (% by volume) | | | | |
|---|---|---|---|---|---|---|---|
| No. | Temperature (° C.) | Film-Forming Pressure (kPa) | H₂ | N₂ | TiCl₄ | CH₃CN | Hydrocarbon Gas/Conc. |
| Ex. 1 | 850 | 8 | 83.0 | 15.0 | 1.5 | 0.5 | — |
| Ex. 2 | 880 | 8 | 83.0 | 15.0 | 1.5 | 0.5 | — |
| Ex. 3 | 800 | 8 | 83.0 | 15.0 | 1.5 | 0.5 | — |
| Ex. 4 | 750 | 8 | 83.0 | 15.0 | 1.5 | 0.5 | — |
| Ex. 5 | 850 | 5 | 83.0 | 15.0 | 1.5 | 0.5 | — |
| Ex. 6 | 850 | 9 | 83.0 | 15.0 | 1.5 | 0.5 | — |
| Ex. 7 | 850 | 8 | 88.0 | 10.0 | 1.5 | 0.5 | — |
| Ex. 8 | 850 | 8 | 78.2 | 19.8 | 1.5 | 0.5 | — |
| Ex. 9 | 850 | 8 | 83.5 | 15.0 | 1 | 0.5 | — |
| Ex. 10 | 850 | 8 | 82.4 | 15.1 | 2 | 0.5 | — |
| Ex. 11 | 850 | 8 | 82.0 | 15.0 | 2.5 | 0.5 | — |
| Ex. 12-1 | 850 | 8 | 83.4 | 15.0 | 1.5 | 0.1 | — |
| Ex. 12-2 | 850 | 8 | 83.2 | 15.0 | 1.5 | 0.3 | — |
| Ex. 13 | 850 | 8 | 82.5 | 15.4 | 1.5 | 0.6 | — |
| Ex. 14 | 850 | 8 | 82.2 | 15.4 | 1.5 | 0.9 | — |
| Ex. 15 | 850 | 8 | 83.0 | 15.0 | 1.5 | 0.5 | — |
| Ex. 16 | 850 | 8 | 83.0 | 15.0 | 1.5 | 0.5 | — |
| Ex. 17 | 850 | 8 | 83.0 | 15.0 | 1.5 | 0.5 | — |
| Ex. 18 | 850 | 8 | 83.0 | 15.0 | 1.5 | 0.5 | — |
| Ex. 19 | 850 | 8 | 83.0 | 15.0 | 1.5 | 0.5 | — |
| Ex. 20 | 850 | 8 | 83.0 | 15.0 | 1.5 | 0.5 | — |
| Ex. 21 | 850 | 8 | 83.0 | 15.0 | 1.5 | 0.5 | — |
| Ex. 22 | 850 | 8 | 83.0 | 15.0 | 1.5 | 0.5 | — |
| Ex. 23 | 850 | 8 | 83.0 | 15.0 | 1.5 | 0.5 | — |
| Ex. 24 | 850 | 8 | 83.0 | 15.0 | 1.5 | 0.5 | — |
| Ex. 25 | 850 | 8 | 82.0 | 16.0 | 1.5 | 0.5 | — |
| Ex. 26 | 850 | 8 | 82.0 | 16.0 | 1.5 | 0.5 | — |
| Ex. 27 | 850 | 8 | 82.0 | 16.0 | 1.5 | 0.5 | — |
| Ex. 28 | 850 | 8 | 82.0 | 16.0 | 1.5 | 0.5 | — |
| Ex. 29 | 850 | 8 | 82.0 | 16.0 | 1.5 | 0.5 | — |
| Ex. 30 | 850 | 8 | 82.0 | 16.0 | 1.5 | 0.5 | — |
| Ex. 31 | 850 | 8 | 82.0 | 16.0 | 1.5 | 0.5 | — |

TABLE 3-2

Third Layer [Ti(CN)]

| | Composition (% by mass) | | | | | Thickness | | Hardness |
|---|---|---|---|---|---|---|---|---|
| No. | Ti | C | N | C/(C + N) | Structure | (μm) | $d^{(1)}$ (μm) | (GPa) |
| Ex. 1 | 78.2 | 12.6 | 9.2 | 0.58 | Columnar | 2 | 0.08 | 37 |
| Ex. 2 | 78.1 | 12.3 | 9.6 | 0.56 | Columnar | 2 | 0.20 | 33 |
| Ex. 3 | 78.2 | 12.4 | 9.4 | 0.57 | Columnar | 2 | 0.11 | 36 |
| Ex. 4 | 78.3 | 12.5 | 9.2 | 0.58 | Columnar | 2 | 0.13 | 33 |
| Ex. 5 | 78.1 | 12.3 | 9.6 | 0.56 | Columnar | 2 | —$^{(2)}$ | —$^{(2)}$ |
| Ex. 6 | 78.3 | 12.4 | 9.3 | 0.57 | Columnar | 2 | —$^{(2)}$ | —$^{(2)}$ |
| Ex. 7 | 78.1 | 12.2 | 9.7 | 0.56 | Columnar | 2 | —$^{(2)}$ | —$^{(2)}$ |
| Ex. 8 | 78.4 | 11.8 | 9.8 | 0.54 | Columnar | 2 | 0.19 | 34 |
| Ex. 9 | 78.4 | 12.9 | 8.7 | 0.60 | Columnar | 2 | —$^{(2)}$ | —$^{(2)}$ |
| Ex. 10 | 78.2 | 12.3 | 9.5 | 0.56 | Columnar | 2 | —$^{(2)}$ | —$^{(2)}$ |
| Ex. 11 | 78.4 | 12.8 | 8.8 | 0.59 | Columnar | 2 | —$^{(2)}$ | —$^{(2)}$ |
| Ex. 12-1 | 78.8 | 12.4 | 8.8 | 0.58 | Columnar | 2 | —$^{(2)}$ | —$^{(2)}$ |
| Ex. 12-2 | 77.9 | 13.2 | 8.9 | 0.60 | Columnar | 2 | —$^{(2)}$ | —$^{(2)}$ |
| Ex. 13 | 78.0 | 13.2 | 8.8 | 0.60 | Columnar | 2 | 0.13 | 38 |
| Ex. 14 | 78.1 | 12.6 | 9.3 | 0.58 | Columnar | 2 | 0.25 | 33 |
| Ex. 15 | 77.8 | 12.4 | 9.8 | 0.56 | Columnar | 2 | —$^{(2)}$ | —$^{(2)}$ |
| Ex. 16 | 78.2 | 12.8 | 9.0 | 0.59 | Columnar | 2 | —$^{(2)}$ | —$^{(2)}$ |
| Ex. 17 | 78.3 | 12.2 | 9.5 | 0.56 | Columnar | 2 | —$^{(2)}$ | —$^{(2)}$ |
| Ex. 18 | 78.2 | 12.1 | 9.7 | 0.56 | Columnar | 1 | —$^{(2)}$ | —$^{(2)}$ |
| Ex. 19 | 78.1 | 12.2 | 9.7 | 0.56 | Columnar | 1.5 | —$^{(2)}$ | —$^{(2)}$ |
| Ex. 20 | 78.0 | 12.3 | 9.7 | 0.56 | Columnar | 5 | —$^{(2)}$ | —$^{(2)}$ |
| Ex. 21 | 78.2 | 12.2 | 9.6 | 0.56 | Columnar | 10 | —$^{(2)}$ | —$^{(2)}$ |
| Ex. 22 | 78.1 | 12.1 | 9.8 | 0.55 | Columnar | 2 | —$^{(2)}$ | —$^{(2)}$ |
| Ex. 23 | 78.0 | 12.0 | 10.0 | 0.55 | Columnar | 2 | —$^{(2)}$ | —$^{(2)}$ |
| Ex. 24 | 78.2 | 12.2 | 9.6 | 0.56 | Columnar | 2 | —$^{(2)}$ | —$^{(2)}$ |
| Ex. 25 | 78.2 | 12.2 | 9.6 | 0.56 | Columnar | 2 | —$^{(2)}$ | —$^{(2)}$ |
| Ex. 26 | 78.3 | 12.2 | 9.5 | 0.56 | Columnar | 2 | —$^{(2)}$ | —$^{(2)}$ |
| Ex. 27 | 78.2 | 12.0 | 9.8 | 0.55 | Columnar | 2 | —$^{(2)}$ | —$^{(2)}$ |
| Ex. 28 | 78.0 | 12.1 | 9.9 | 0.55 | Columnar | 2 | —$^{(2)}$ | —$^{(2)}$ |

TABLE 3-2-continued

| | Third Layer [Ti(CN)] | | | | | | | |
|---|---|---|---|---|---|---|---|---|
| | Composition (% by mass) | | | | | Thickness | | Hardness |
| No. | Ti | C | N | C/(C + N) | Structure | (μm) | d[1] (μm) | (GPa) |
| Ex. 29 | 78.4 | 12.2 | 9.4 | 0.56 | Columnar | 2 | —[2] | —[2] |
| Ex. 30 | 78.0 | 12.3 | 9.7 | 0.56 | Columnar | 2 | —[2] | —[2] |
| Ex. 31 | 78.2 | 12.2 | 9.6 | 0.56 | Columnar | 2 | —[2] | —[2] |

Note:
[1] Average transverse cross section diameter.
[2] Not measured.

TABLE 4

| | Bonding Layer | | Evaluation of Cutting | |
|---|---|---|---|---|
| No. | Third Layer Side | Al$_2$O$_3$ Layer Side | Peeling[1] | Life[2] (minute) |
| Ex. 1 | Ti(CN) | Ti(CNO) | No | 20 |
| Ex. 2 | Ti(CN) | Ti(CNO) | No | 16 |
| Ex. 3 | Ti(CN) | Ti(CNO) | No | 18 |
| Ex. 4 | Ti(CN) | Ti(CNO) | No | 14 |
| Ex. 5 | Ti(CN) | Ti(CNO) | No | 18 |
| Ex. 6 | Ti(CN) | Ti(CNO) | No | 18 |
| Ex. 7 | Ti(CN) | Ti(CNO) | No | 18 |
| Ex. 8 | Ti(CN) | Ti(CNO) | No | 17 |
| Ex. 9 | Ti(CN) | Ti(CNO) | No | 18 |
| Ex. 10 | Ti(CN) | Ti(CNO) | No | 17 |
| Ex. 11 | Ti(CN) | Ti(CNO) | No | 16 |
| Ex. 12-1 | Ti(CN) | Ti(CNO) | No | 13 |
| Ex. 12-2 | Ti(CN) | Ti(CNO) | No | 16 |
| Ex. 13 | Ti(CN) | Ti(CNO) | No | 13 |
| Ex. 14 | Ti(CN) | Ti(CNO) | No | 11 |
| Ex. 15 | Ti(CN) | Ti(CNO) | No | 12 |
| Ex. 16 | Ti(CN) | Ti(CNO) | No | 18 |
| Ex. 17 | Ti(CN) | Ti(CNO) | No | 16 |
| Ex. 18 | Ti(CN) | Ti(CNO) | No | 8 |
| Ex. 19 | Ti(CN) | Ti(CNO) | No | 10 |
| Ex. 20 | Ti(CN) | Ti(CNO) | No | 14 |
| Ex. 21 | Ti(CN) | Ti(CNO) | No | 8 |
| Ex. 22 | Ti(CN) | Ti(CNO) | No | 18 |
| Ex. 23 | Ti(CN) | Ti(CNO) | No | 12 |
| Ex. 24 | Ti(CN) | Ti(CNO) | No | 14 |
| Ex. 25 | TiN | Ti(CNO) | No | 15 |
| Ex. 26 | TiC | Ti(CNO) | No | 15 |
| Ex. 27 | Ti(CNO) | — | No | 14 |
| Ex. 28 | (TiB)N | Ti(CNO) | No | 13 |
| Ex. 29 | Ti(CN) | Ti(CO) | No | 15 |
| Ex. 30 | Ti(CN) | (TiAl)(CNO) | No | 17 |
| Ex. 31 | Ti(CN) | (TiB)(CNO) | No | 13 |

Note:
[1] Peeled or not after cutting for 2 minutes.
[2] Tool life.

TABLE 5-1

| | Film-Forming Conditions of Ti(CN) Layer | | | | | | |
|---|---|---|---|---|---|---|---|
| | Film-Forming Temperature | Film-Forming Pressure | Composition of Starting Material Gas (% by volume) | | | | |
| No. | (° C.) | (kPa) | H$_2$ | N$_2$ | TiCl$_4$ | CH$_3$CN | Hydrocarbon Gas/Conc. |
| Com. Ex. 1 | 850 | 10 | 66.0 | 32.2 | 0.5 | 0.0 | C$_2$H$_6$/1.3 |
| Com. Ex. 2 | 850 | 8 | 83.0 | 15.0 | 1.5 | 0.5 | — |
| Com. Ex. 3 | 880 | 8 | 95.0 | 0 | 1.5 | 0.3 | C$_2$H$_6$/3.2 |

TABLE 5-2

| | Properties of Ti(CN) Layer | | | | | | | |
|---|---|---|---|---|---|---|---|---|
| | Composition (% by mass)[1] | | | | | Thickness | d[2] | Hardness |
| No. | Ti | C | N | C/(C + N) | Structure | (μm) | (μm) | (GPa) |
| Com. Ex. 1 | 78.4 | 15.1 | 6.5 | 0.70 | Columnar | 10.5 | 0.07 | 34 |
| | 78.5 | 15.4 | 6.1 | 0.72 | | | | |
| | 78.3 | 16.4 | 5.3 | 0.76 | | | | |
| Com. Ex. 2 | 78.0 | 12.7 | 9.3 | 0.58 | Columnar | 10.5 | —[3] | —[3] |
| Com. Ex. 3 | 78.1 | 14.2 | 7.7 | 0.65 | Columnar | 10.3 | 0.5 | 28 |
| | 78.4 | 14.8 | 6.8 | 0.69 | | | | |
| | 78.0 | 15.8 | 6.2 | 0.72 | | | | |

Note:
[1] In Comparative Examples 1 and 3, an upper row shows the composition measured at a position corresponding to the first layer of Example 1, an immediate row shows the composition measured at a position corresponding to the second layer of Example 1, and a lower row shows the composition measured at a position corresponding to the third layer of Example 1.
[2] Average transverse cross section diameter.
[3] Not measured.

TABLE 6

| | Film-Forming Conditions of TiN Layer | | | | | Properties of TiN Layer | | | |
|---|---|---|---|---|---|---|---|---|---|
| | Film-Forming Temperature | Film-Forming Pressure | Starting Material Gas (% by volume) | | | Composition (% by mass) | | | Thickness |
| No. | (° C.) | (kPa) | H$_2$ | N$_2$ | TiCl$_4$ | Ti | N | Structure | (μm) |
| Com. Ex. 5 | 900 | 16 | 66.5 | 33.0 | 0.5 | 78.1 | 21.9 | Granular | 0.5 |
| Com. Ex. 6 | 900 | 16 | 66.5 | 33.0 | 0.5 | 78.2 | 21.8 | Granular | 0.4 |
| Com. Ex. 7 | 900 | 30 | 65.8 | 30.0 | 4.2 | 78.0 | 22.0 | Granular | 1.0 |
| Com. Ex. 8 | — | — | — | — | — | — | — | — | — |

TABLE 7-1

| | Film-Forming Conditions of First Layer [Ti(CN)] | | | | | | |
|---|---|---|---|---|---|---|---|
| | Film-Forming Temperature | Film-Forming Pressure | Composition of Starting Material Gas (% by volume) | | | | Hydrocarbon |
| No. | (° C.) | (kPa) | H$_2$ | N$_2$ | TiCl$_4$ | CH$_3$CN | Gas/Conc. |
| Com. Ex. 4 | 950 | 10 | 50.5 | 45.0 | 1.5 | 0.0 | CH$_4$/3.0 |
| Com. Ex. 5 | 870 | 10 | 58.4 | 40.0 | 1.0 | 0.6 | — |
| Com. Ex. 6 | 1010 | 50 | 68.0 | 30.0 | 1.0 | 1.0 | — |
| Com. Ex. 7 | 750 | 7 | 75.5 | 20.0 | 0.5 | — | C$_3$H$_6$/4.0 |
| Com. Ex. 8 | 750 | 7 | 75.5 | 20.0 | 0.5 | — | C$_3$H$_6$/4.0 |

TABLE 7-2

| | First Layer [Ti(CN)] | | | | | | |
|---|---|---|---|---|---|---|---|
| | Composition (% by mass) | | | | | Thickness | d$^{(1)}$ |
| No. | Ti | C | N | C/(C + N) | Structure | (μm) | (μm) |
| Com. Ex. 4 | 78.0 | 12.0 | 10.0 | 0.55 | Granular | 1.0 | —$^{(2)}$ |
| Com. Ex. 5 | 78.2 | 12.3 | 9.5 | 0.56 | Columnar | 4 | —$^{(2)}$ |
| Com. Ex. 6 | 78.2 | 12.8 | 9.0 | 0.59 | Columnar | 2 | —$^{(2)}$ |
| Com. Ex. 7 | 77.7 | 16.3 | 5.5 | 0.73 | Columnar | 0.5 | 0.08 |
| Com. Ex. 8 | 77.7 | 16.3 | 5.5 | 0.73 | Columnar | 0.5 | 0.08 |

Note:
$^{(1)}$Average transverse cross section diameter.
$^{(2)}$Not measured.

Table 8-1

| | Film-Forming Conditions of Second Layer [Ti(CN)] | | | | | | |
|---|---|---|---|---|---|---|---|
| | Film-Forming Temperature | Film-Forming Pressure | Composition of Starting Material Gas (% by volume) | | | | Hydrocarbon Gas/ |
| No. | (° C.) | (kPa) | H$_2$ | N$_2$ | TiCl$_4$ | CH$_3$CN | Conc. |
| Com. Ex. 4 | 950 | 10 | 50.5 | 45.0 | 1.5 | 0.0 | CH$_4$/3.0 |
| Com. Ex. 5$^{(1)}$ | — | — | — | — | — | — | — |
| Com. Ex. 6$^{(1)}$ | — | — | — | — | — | — | — |
| Com. Ex. 7$^{(1)}$ | — | — | — | — | — | — | — |
| Com. Ex. 8$^{(1)}$ | — | — | — | — | — | — | — |

Note:
$^{(1)}$The second layer was not formed.

Table 8-2

| | Second Layer [Ti(CN)] | | | | | | | |
|---|---|---|---|---|---|---|---|---|
| | Composition (% by mass) | | | | | Thickness | d$^{(1)}$ | Hardness |
| No. | Ti | C | N | C/(C + N) | Structure | (μm) | (μm) | (GPa) |
| Com. Ex. 4 | 68.2 | 15.2 | 16.6 | 0.48 | Granular | 8 | —$^{(2)}$ | —$^{(2)}$ |
| Com. Ex. 5$^{(3)}$ | — | — | — | — | — | — | — | — |
| Com. Ex. 6$^{(3)}$ | — | — | — | — | — | — | — | — |

| No. | | | | | | | | |
|---|---|---|---|---|---|---|---|---|
| Com. Ex. 7[3] | — | — | — | — | — | — | — | — |
| Com. Ex. 8[3] | — | — | — | — | — | — | — | — |

Note:
[1] Average transverse cross section diameter.
[2] Not measured.
[3] The second layer was not formed.

Table 8-3

Crystal Composition of Second Layer [Ti(CN)] (by mass ratio)

| No. | Composition of Crystal Grains [Tia$_1$(Cx$_1$Ny$_1$)b$_1$] | | | | Composition of Crystal Grain Boundaries [Tia$_2$(Cx$_2$Ny$_2$)b$_2$] | | | | x$_1$b$_1$/x$_2$b$_2$[1] |
|---|---|---|---|---|---|---|---|---|---|
| | a$_1$ | b$_1$ | x$_1$ | y$_1$ | a$_2$ | b$_2$ | x$_2$ | y$_2$ | |
| Com. Ex. 4 | 0.78 | 0.22 | 0.57 | 0.43 | 0.78 | 0.22 | 0.57 | 0.43 | 1.00 |
| Com. Ex. 5[2] | — | — | — | — | — | — | — | — | — |
| Com. Ex. 6[2] | — | — | — | — | — | — | — | — | — |
| Com. Ex. 7[2] | — | — | — | — | — | — | — | — | — |
| Com. Ex. 8[2] | — | — | — | — | — | — | — | — | — |

Note:
[1] A ratio of the carbon content (x$_1$b$_1$) in crystal grains to the carbon content (x$_2$b$_2$) in crystal grain boundaries.
[2] The second layer was not formed.

Table 9-1

Film-Forming Conditions of Third Layer [Ti(CN)]

| No. | Film-Forming Temperature (°C.) | Film-Forming Pressure (kPa) | Composition of Starting Material Gas (% by volume) | | | | Hydrocarbon Gas/Conc. |
|---|---|---|---|---|---|---|---|
| | | | H$_2$ | N$_2$ | TiCl$_4$ | CH$_3$CN | |
| Com. Ex. 4 | 950 | 10 | 50.5 | 45.0 | 1.5 | 0.0 | CH$_4$/3.0 |
| Com. Ex. 5 | 1010 | 50 | 68.0 | 30.0 | 1.0 | 1.0 | — |
| Com. Ex. 6 | 870 | 10 | 58.4 | 40.0 | 1.0 | 0.6 | — |
| Com. Ex. 7 | 850 | 12 | 74.8 | 20.0 | 4.2 | 1.0 | — |
| Com. Ex. 8 | 850 | 12 | 74.8 | 20.0 | 4.2 | 1.0 | — |

Table 9-2

Third Layer [Ti(CN)]

| No. | Composition (% by mass) | | | | Structure | Thickness (μm) | d[1] (μm) | Hardness (GPa) |
|---|---|---|---|---|---|---|---|---|
| | Ti | C | N | C/(C + N) | | | | |
| Com. Ex. 4 | 78.1 | 13.0 | 8.9 | 0.59 | Granular | 2 | —[2] | —[2] |
| Com. Ex. 5 | 78.2 | 12.8 | 9.0 | 0.59 | Columnar | 4 | —[2] | —[2] |
| Com. Ex. 6 | 78.1 | 12.3 | 9.6 | 0.56 | Columnar | 3.5 | —[2] | —[2] |
| Com. Ex. 7 | 78.2 | 12.4 | 9.4 | 0.57 | Columnar | 9 | 0.30 | 28 |
| Com. Ex. 8 | 78.2 | 12.4 | 9.4 | 0.57 | Columnar | 9 | 0.30 | 28 |

Note:
[1] Average transverse cross section diameter.
[2] Not measured.

TABLE 10

| No. | Bonding Layer | | Evaluation of Cutting | | |
|---|---|---|---|---|---|
| | Titanium Carbonitride Layer Side | Al$_2$O$_3$ Layer Side | Peeling[1] | Peeled Portion | Tool Life[2] (minute) |
| Com. Ex. 1 | Ti(CN) | Ti(CNO) | Yes | Titanium Carbonitride Layer/Bonding Layer | 2.0 |
| Com. Ex. 2 | Ti(CN) | Ti(CNO) | Yes | Substrate/Titanium Carbonitride Layer | 1.0 |
| Com. Ex. 3 | Ti(CO) | — | Yes | Titanium Carbonitride Layer/Bonding Layer | 2.0 |

TABLE 10-continued

| | Bonding Layer | | Evaluation of Cutting | | |
| | Titanium | | | | |
| No. | Carbonitride Layer Side | Al$_2$O$_3$ Layer Side | Peeling[1] | Peeled Portion | Tool Life[2] (minute) |
| --- | --- | --- | --- | --- | --- |
| Com. Ex. 4 | Ti(CN) | — | Yes | Substrate/Titanium Carbonitride Layer | 1.0 |
| Com. Ex. 5 | Ti(CNO) | — | No | — | 4.0 |
| Com. Ex. 6 | Ti(CN) | Ti(CNO) | No | — | 3.5 |
| Com. Ex. 7 | | Ti(CNO) | No | — | 4.0 |
| Com. Ex. 8 | | Ti(CNO) | No | — | 3.8 |

Note:
[1]Peeled or not after cutting for 2 minutes.

Any of the hard-coated inserts of Examples 1-31 had as long a tool life as 8 minutes or more, 2 times or more longer than those of Comparative Examples 1-8. This is because each hard-coated insert of Examples 1-31 comprised a titanium carbonitride layer comprising a first layer having high adhesion to a cemented carbide substrate, a second layer having excellent hardness and wear resistance, and a third layer having high adhesion to an aluminum oxide layer via a bonding layer.

In Comparative Examples 1 and 3 each having a single layer of titanium carbonitride, however, a carbon concentration in the titanium carbonitride layer increased as nearing the surface, so that peeling occurred between the titanium carbonitride layer and the bonding layer, resulting in a short tool life. In the hard-coated insert of Comparative Example 2 having a single layer of titanium carbonitride, peeling did not occur between the titanium carbonitride layer and the bonding layer because of a low carbon concentration, but peeling occurred between the substrate and the titanium carbonitride layer, also resulting in a short tool life. In Comparative Example 4, in which a CH$_4$ gas was used without CH$_3$CN in starting material gases for the first to third layers, the cemented carbide substrate became brittle because of the formation of a decarburized layer, so that peeling occurred between the substrate and the titanium carbonitride layer, resulting in a short tool life. The hard-coated inserts of Comparative Examples 5-8 had poor wear resistance because of the absence of the second layer, also resulting in a short tool life.

EXAMPLE 32

After the first layer in the titanium carbonitride layer was formed on the same substrate with honed cutting edges as in Example 1 under the conditions shown in Table 11, an 8-μm-thick second layer having a composition of (TiZr)(CN) was continuously formed by supplying a starting material gas at 850° C. and 10 kPa, which comprised 80.3% by volume of an H$_2$ gas, 15.0% by volume of an N$_2$ gas, 1.5% by volume of a TiCl$_4$ gas, 1.0% by volume of a CH$_3$CN gas, 1.2% by volume of a C$_2$H$_6$ gas, and 1.0% by volume of a ZrCl$_4$ gas, at a flow rate of 6700 ml/minute to the CVD chamber. A 2-μm-thick third layer having a composition of (TiZr)(CN) was then continuously formed by supplying a starting material gas at 850° C. and 10 kPa, which comprised 82.0% by volume of an H$_2$ gas, 15.0% by volume of an N$_2$ gas, 1.5% by volume of a TiCl$_4$ gas, 0.5% by volume of a CH$_3$CN gas, and 1.0% by volume of a ZrCl$_4$ gas, at a flow rate of 6600 ml/minute to the CVD chamber. A bonding layer and an α-aluminum oxide film were further continuously formed in the same manner as in Example 1.

EXAMPLE 33

After the first layer in the titanium carbonitride layer was formed on the same substrate with honed cutting edges as in Example 1 under the conditions shown in Table 11, an 8-μm-thick second layer having a composition of (TiSi)(CN) was continuously formed by supplying a starting material gas at 850° C. and 10 kPa, which comprised 80.3% by volume of an H$_2$ gas, 15.0% by volume of an N$_2$ gas, 1.5% by volume of a TiCl$_4$ gas, 1.0% by volume of a CH$_3$CN gas, 1.2% by volume of a C$_2$H$_6$ gas, and 1.0% by volume of an SiCl$_4$ gas, at a flow rate of 6700 ml/minute to the CVD chamber. A 2-μm-thick third layer having a composition of (TiSi)(CN) was then continuously formed by supplying a starting material gas at 850° C. and 10 kPa, which comprised 82.0% by volume of an H$_2$ gas, 15.0% by volume of an N$_2$ gas, 1.5% by volume of a TiCl$_4$ gas, 0.5% by volume of a CH$_3$CN gas, and 1.0% by volume of an SiCl$_4$ gas, at a flow rate of 6600 ml/minute to the CVD chamber. A bonding layer and an α-aluminum oxide film were further continuously formed in the same manner as in Example 1.

EXAMPLE 34

After the first layer in the titanium carbonitride layer was formed on the same substrate with honed cutting edges as in Example 1 under the conditions shown in Table 11, an 8-μm-thick second layer having a composition of (TiV)(CN) was continuously formed by supplying a starting material gas at 850° C. and 10 kPa, which comprised 80.3% by volume of an H$_2$ gas, 15.0% by volume of an N$_2$ gas, 1.5% by volume of a TiCl$_4$ gas, 1.0% by volume of a CH$_3$CN gas, 1.2% by volume of a C$_2$H$_6$ gas, and 1.0% by volume of VCl$_3$ gas, at a flow rate of 6700 ml/minute to the CVD chamber. A 2-μm-thick third layer having a composition of (TiV)(CN) was then continuously formed by supplying a starting material gas at 850° C. and 10 kPa, which comprised 82.0% by volume of an H$_2$ gas, 15.0% by volume of an N$_2$ gas, 1.5% by volume of a TiCl$_4$ gas, 0.5% by volume of a CH$_3$CN gas, and 1.0% by volume of VCl$_3$ gas, at a flow rate of 6600 ml/minute to the CVD chamber. A bonding layer and an α-aluminum oxide film were further continuously formed in the same manner as in Example 1.

EXAMPLE 35

After the first layer in the titanium carbonitride layer was formed on the same substrate with honed cutting edges as in Example 1 under the conditions shown in Table 11, an 8-μm-thick second layer having a composition of (TiCr)(CN) was continuously formed by supplying a starting material gas at 850° C. and 10 kPa, which comprised 80.3% by volume of an $H_2$ gas, 15.0% by volume of an $N_2$ gas, 1.5% by volume of a $TiCl_4$ gas, 1.0% by volume of a $CH_3CN$ gas, 1.2% by volume of a $C_2H_6$ gas, and 1.0% by volume of $CrCl_3$ gas, at a flow rate of 6700 ml/minute to the CVD chamber. A 2-μm-thick third layer having a composition of (TiCr)(CN) was then continuously formed by supplying a starting material gas at 850° C. and 10 kPa, which comprised 82.0% by volume of an $H_2$ gas, 15.0% by volume of an $N_2$ gas, 1.5% by volume of a $TiCl_4$ gas, 0.5% by volume of a $CH_3CN$ gas, and 1.0% by volume of $CrCl_3$ gas, at a flow rate of 6600 ml/minute to the CVD. A bonding layer and an α-aluminum oxide film were further continuously formed in the same manner as in Example 1.

EXAMPLE 36

After the first layer in the titanium carbonitride layer was formed on the same substrate with honed cutting edges as in Example 1 under the conditions shown in Table 11, an 8-μm-thick second layer having a composition of (TiB)(CN) was continuously formed by supplying a starting material gas at 850° C. and 5 kPa, which comprised 80.3% by volume of an $H_2$ gas, 15.0% by volume of an $N_2$ gas, 1.5% by volume of a $TiCl_4$ gas, 1.0% by volume of a $CH_3CN$ gas, 1.2% by volume of a $C_2H_6$ gas, and 1.0% by volume of $BCl_3$ gas, at a flow rate of 6700 ml/minute to the CVD chamber. A 2-μm-thick third layer having a composition of (TiB)(CN) was then continuously formed by supplying a starting material gas at 850° C. and 5 kPa, which comprised 82.0% by volume of an $H_2$ gas, 15.0% by volume of an $N_2$ gas, 1.5% by volume of a $TiCl_4$ gas, 0.5% by volume of a $CH_3CN$ gas, and 1.0% by volume of $BCl_3$ gas, at a flow rate of 6600 ml/minute to the CVD chamber. A bonding layer and an α-aluminum oxide film were further continuously formed in the same manner as in Example 1.

EXAMPLE 37

After the first layer in the titanium carbonitride layer was formed on the same substrate with honed cutting edges as in Example 1 under the conditions shown in Table 11, an 8-μm-thick second layer having a composition of (TiAl)(CN) was continuously formed by supplying a starting material gas at 750° C. and 5 kPa, which comprised 80.3% by volume of an $H_2$ gas, 15.0% by volume of an $N_2$ gas, 1.5% by volume of a $TiCl_4$ gas, 1.0% by volume of a $CH_3CN$ gas, 1.2% by volume of a $C_2H_6$ gas, and 1.0% by volume of an $AlCl_3$ gas, at a flow rate of 6700 ml/minute to the CVD chamber. A 2-μm-thick third layer having a composition of (TiAl)(CN) was then continuously formed by supplying a starting material gas at 750° C. and 5 kPa, which comprised 82.0% by volume of an $H_2$ gas, 15.0% by volume of an $N_2$ gas, 1.5% by volume of a $TiCl_4$ gas, 0.5% by volume of a $CH_3CN$ gas, and 1.0% by volume of an $AlCl_3$ gas, at a flow rate of 6600 ml/minute to the CVD chamber. A bonding layer and an α-aluminum oxide film were further continuously formed in the same manner as in Example 1.

With respect to Examples 32-37, the film-forming conditions and properties (composition, structure and thickness) of the first layers are shown in Table 11, the film-forming conditions, properties (composition, structure and thickness) and crystal compositions of the second layers are shown in Table 12, the film-forming conditions and properties (composition, structure and thickness) of the third layers are shown in Table 13, and the compositions of the bonding layers and the evaluation results of cutting are shown in Table 14.

TABLE 11-1

| | Film-Forming Conditions of First Layer | | | | | | |
|---|---|---|---|---|---|---|---|
| | Film-Forming | Film-Forming | Composition of Starting Material Gas (% by volume) | | | | |
| No. | Temperature (° C.) | Pressure (kPa) | $H_2$ | $N_2$ | $TiCl_4$ | $CH_3CN$ | Hydrocarbon Gas/ Conc. |
| Ex. 32 | 850 | 18 | 66.0 | 32.2 | 0.5 | 0.0 | $C_2H_6$/1.3 |
| Ex. 33 | 850 | 18 | 65.9 | 32.3 | 0.5 | 0.0 | $C_2H_6$/1.3 |
| Ex. 34 | 850 | 18 | 65.9 | 32.3 | 0.5 | 0.0 | $C_2H_6$/1.3 |
| Ex. 35 | 850 | 18 | 65.9 | 32.3 | 0.5 | 0.0 | $C_2H_6$/1.3 |
| Ex. 36 | 850 | 18 | 65.9 | 32.3 | 0.5 | 0.0 | $C_2H_6$/1.3 |
| Ex. 37 | 850 | 18 | 65.9 | 32.3 | 0.5 | 0.0 | $C_2H_6$/1.3 |

TABLE 11-2

| | Properties of First Layer | | | | | | |
|---|---|---|---|---|---|---|---|
| | | Composition (% by mass) | | | | Thickness | |
| No. | Type | Ti | C | N | C/(C + N) | Structure | (μm) | $d^{(1)}$ (μm) |
| Ex. 32 | Ti(CN) | 77.3 | 15.2 | 7.5 | 0.67 | Columnar | 0.5 | 0.11 |
| Ex. 33 | Ti(CN) | 77.2 | 15.6 | 7.2 | 0.68 | Columnar | 0.5 | —[2] |
| Ex. 34 | Ti(CN) | 77.1 | 15.0 | 7.9 | 0.66 | Columnar | 0.5 | —[2] |
| Ex. 35 | Ti(CN) | 78.2 | 14.8 | 7.0 | 0.68 | Columnar | 0.5 | —[2] |
| Ex. 36 | Ti(CN) | 78.1 | 15.4 | 6.5 | 0.70 | Columnar | 0.5 | —[2] |
| Ex. 37 | Ti(CN) | 77.1 | 15.2 | 7.7 | 0.66 | Columnar | 0.5 | —[2] |

Note:
[1] Average transverse cross section diameter.
[2] Not measured.

TABLE 12-1

Film-Forming Conditions of Second Layer

| | | | Composition of Starting Material Gas (% by volume) | | | | | |
|---|---|---|---|---|---|---|---|---|
| No. | Temp. (° C.)[1] | Pressure (kPa)[2] | $H_2$ | $N_2$ | $TiCl_4$ | $CH_3CN$ | Hydrocarbon Gas/Conc. | Metal Chloride Gas/Conc. |
| Ex. 32 | 850 | 10 | 80.3 | 15.0 | 1.5 | 1.0 | $C_2H_6$/1.2 | $ZrCl_4$/1.0 |
| Ex. 33 | 850 | 10 | 80.3 | 15.0 | 1.5 | 1.0 | $C_2H_6$/1.2 | $SiCl_4$/1.0 |
| Ex. 34 | 850 | 10 | 80.3 | 15.0 | 1.5 | 1.0 | $C_2H_6$/1.2 | $VCl_3$/1.0 |
| Ex. 35 | 850 | 10 | 80.3 | 15.0 | 1.5 | 1.0 | $C_2H_6$/1.2 | $CrCl_3$/1.0 |
| Ex. 36 | 850 | 5 | 80.3 | 15.0 | 1.5 | 1.0 | $C_2H_6$/1.2 | $BCl_3$/1.0 |
| Ex. 37 | 750 | 5 | 80.3 | 15.0 | 1.5 | 1.0 | $C_2H_6$/1.2 | $AlCl_3$/1.0 |

Note:
[1] Film-forming temperature.
[2] Film-forming pressure.

TABLE 12-2

| | | Properties of Second Layer | | | | | | | |
|---|---|---|---|---|---|---|---|---|---|
| | | Composition (% by mass) | | | | | | Thickness | $d^{(2)}$ | Hardness |
| No. | Type | Ti | Me[1] | C | N | C/(C + N) | Structure | (μm) | (μm) | (GPa) |
| Ex. 32 | (TiZr)(CN) | 74.1 | 4.5 | 14.8 | 6.8 | 0.69 | Columnar | 8 | 0.12 | 37 |
| Ex. 33 | (TiSi)(CN) | 70.8 | 8.0 | 14.9 | 6.4 | 0.70 | Columnar | 8 | —[3] | —[3] |
| Ex. 34 | (TiV)(CN) | 71.7 | 7.0 | 14.6 | 6.8 | 0.68 | Columnar | 8 | —[3] | —[3] |
| Ex. 35 | (TiCr)(CN) | 70.4 | 8.5 | 14.2 | 6.8 | 0.68 | Columnar | 8 | —[3] | —[3] |
| Ex. 36 | (TiB)(CN) | 77.1 | 1.2 | 14.5 | 7.2 | 0.67 | Columnar | 8 | —[3] | —[3] |
| Ex. 37 | (TiAl)(CN) | 77.7 | 0.5 | 14.7 | 7.1 | 0.67 | Columnar | 8 | —[3] | —[3] |

Note:
[1] Zr, Si, V, Cr, B or Al.
[2] Average transverse cross section diameter.
[3] Not measured.

TABLE 12-3

Crystal Composition of Second Layer (by mass ratio)

| | Composition of Crystal Grains $[(TiMe)a_1(C_{x_1}N_{y_1})b_1]$ | | | | Composition of Crystal Grain Boundaries $[(TiMe)a_2(C_{x_2}N_{y_2})b_2]$ | | | | |
|---|---|---|---|---|---|---|---|---|---|
| No. | $a_1$ | $b_1$ | $x_1$ | $y_1$ | $a_2$ | $b_2$ | $x_2$ | $y_2$ | $x_1b_1/x_2b_2$[1] |
| Ex. 32 | 0.79 | 0.21 | 0.64 | 0.36 | 0.48 | 0.52 | 0.82 | 0.18 | 0.30 |
| Ex. 33 | 0.78 | 0.22 | 0.66 | 0.34 | 0.45 | 0.55 | 0.81 | 0.19 | 0.33 |
| Ex. 34 | 0.80 | 0.20 | 0.67 | 0.33 | 0.44 | 0.56 | 0.82 | 0.18 | 0.28 |
| Ex. 35 | 0.79 | 0.21 | 0.68 | 0.32 | 0.46 | 0.54 | 0.83 | 0.17 | 0.31 |
| Ex. 36 | 0.78 | 0.22 | 0.65 | 0.35 | 0.43 | 0.57 | 0.88 | 0.12 | 0.28 |
| Ex. 37 | 0.77 | 0.23 | 0.68 | 0.32 | 0.45 | 0.55 | 0.85 | 0.15 | 0.34 |

Note
[1] A ratio of the carbon content ($x_1b_1$) in crystal grains to the carbon content ($x_2b_2$) in crystal grain boundaries.

TABLE 13-1

Film-Forming Conditions of Third Layer

| | | | Composition of Starting Material Gas (% by volume) | | | | | |
|---|---|---|---|---|---|---|---|---|
| No. | Temp. (° C.)[1] | Pressure (kPa)[2] | $H_2$ | $N_2$ | $TiCl_4$ | $CH_3CN$ | Hydrocarbon Gas/Conc. | Metal Chloride Gas/Conc. |
| Ex. 32 | 850 | 10 | 82.0 | 15.0 | 1.5 | 0.5 | — | $ZrCl_4$/1.0 |
| Ex. 33 | 850 | 10 | 82.0 | 15.0 | 1.5 | 0.5 | — | $SiCl_4$/1.0 |
| Ex. 34 | 850 | 10 | 82.0 | 15.0 | 1.5 | 0.5 | — | $VCl_3$/1.0 |
| Ex. 35 | 850 | 10 | 82.0 | 15.0 | 1.5 | 0.5 | — | $CrCl_3$/1.0 |
| Ex. 36 | 850 | 5 | 82.0 | 15.0 | 1.5 | 0.5 | — | $BCl_3$/1.0 |
| Ex. 37 | 750 | 5 | 82.0 | 15.0 | 1.5 | 0.5 | — | $AlCl_3$/1.0 |

Note:
[1] Film-forming temperature.
[2] Film-forming pressure.

TABLE 13-2

| | | Properties of Third Layer | | | | | | | |
|---|---|---|---|---|---|---|---|---|---|
| | | Composition (% by mass) | | | | | Thickness | d$^{(2)}$ | Hardness |
| No. | Type | Ti | Me$^{(1)}$ | C | N | C/(C + N) | Structure | (μm) | (μm) | (GPa) |
| Ex. 32 | (TiZr)(CN) | 70.7 | 7.5 | 12.6 | 9.2 | 0.58 | Columnar | 2 | 0.13 | 38 |
| Ex. 33 | (TiSi)(CN) | 71.3 | 6.8 | 12.3 | 9.6 | 0.56 | Columnar | 2 | —$^{(3)}$ | —$^{(3)}$ |
| Ex. 34 | (TiV)(CN) | 70.1 | 8.1 | 12.4 | 9.4 | 0.57 | Columnar | 2 | —$^{(3)}$ | —$^{(3)}$ |
| Ex. 35 | (TiCr)(CN) | 72.1 | 6.2 | 12.5 | 9.2 | 0.58 | Columnar | 2 | —$^{(3)}$ | —$^{(3)}$ |
| Ex. 36 | (TiB)(CN) | 77.1 | 1.0 | 12.3 | 9.6 | 0.56 | Columnar | 2 | —$^{(3)}$ | —$^{(3)}$ |
| Ex. 37 | (TiAl)(CN) | 78.0 | 0.3 | 12.4 | 9.3 | 0.57 | Columnar | 2 | —$^{(3)}$ | —$^{(3)}$ |

Note:
$^{(1)}$Zr, Si, V, Cr, B or Al.
$^{(2)}$Average transverse cross section diameter.
$^{(3)}$Not measured.

TABLE 14

| | Bonding Layer | | | Evaluation of Cutting | |
|---|---|---|---|---|---|
| No. | Third Layer Side | Al$_2$O$_3$ Layer Side | Peeling$^{(1)}$ | Life$^{(2)}$ (minute) | |
| Ex. 32 | Ti(CN) | Ti(CNO) | No | 14 |
| Ex. 33 | Ti(CN) | Ti(CNO) | No | 10 |
| Ex. 34 | Ti(CN) | Ti(CNO) | No | 12 |
| Ex. 35 | Ti(CN) | Ti(CNO) | No | 8 |
| Ex. 36 | Ti(CN) | Ti(CNO) | No | 9 |
| Ex. 37 | Ti(CN) | Ti(CNO) | No | 9 |

Note:
$^{(1)}$Peeled or not after cutting for 2 minutes.
$^{(2)}$Tool life.

As is clear from Tables 11-14, even when part of Ti was substituted by at least one metal element selected from the group consisting of Zr, V, Cr, Si, B and Al, the tool lives were 8 minutes or more.

EXAMPLE 38

After the first to third layers made of titanium carbonitride and the bonding layer were formed on a cemented carbide insert substrate with honed cutting edges (TNMG160408) under the same conditions as in Example 1, a starting material gas at 1010° C. and 10 kPa, which comprised 9.2% by volume of a CrCl$_3$ gas, 85.3% by volume of an H$_2$ gas, 4.3% by volume of a CO$_2$ gas, 0.2% by volume of an H$_2$S gas, and 1.0% by volume of an HCl gas, was supplied to the CVD chamber at a flow rate of 4700 ml, to form an α-chromium oxide layer having a thickness of 6 μm. The cutting performance of the resultant hard-coated insert was evaluated in the same manner as in Example 1. The results are shown in Table 15.

EXAMPLE 39

After the first to third layers made of titanium carbonitride and the bonding layer were formed on a cemented carbide insert substrate with honed cutting edges (TNMG160408) under the same conditions as in Example 1, a starting material gas at 1010° C. and 10 kPa, which comprised 4.6% by volume of an AlCl$_3$ gas, 4.6% by volume of a CrCl$_3$ gas, 85.3% by volume of an H$_2$ gas, 4.3% by volume of a CO$_2$ gas, 0.2% by volume of an H$_2$S gas, and 1.0% by volume of an HCl gas, was supplied to the CVD chamber at a flow rate of 4700 ml, to form a 6-μm-thick α-aluminum chromium oxide layer having a composition of (Al$_{0.5}$Cr$_{0.5}$)$_2$O$_3$ by atomic ratio. The cutting performance of the resultant hard-coated insert was evaluated in the same manner as in Example 1. The results are shown in Table 15.

TABLE 15

| | | Evaluation of Cutting | |
|---|---|---|---|
| No. | Type of Oxide Layer | Peeling$^{(1)}$ | Life$^{(2)}$ (minute) |
| Ex. 1 | α-Aluminum Oxide | No | 20 |
| Ex. 38 | α-Chromium Oxide | No | 15 |
| Ex. 39 | α-Aluminum Chromium Oxide | No | 17 |

Note:
$^{(1)}$ Peeled or not after cutting for 2 minutes.
$^{(2)}$ Tool life.

It is clear from Table 15 that the hard-coated insert of the present invention exhibited good cutting performance, regardless of whether the oxide layer was an α-chromium oxide layer (Example 38) or an α-aluminum chromium oxide layer (Example 39).

EXAMPLE 40

A hard-coated insert was produced in the same manner as in Example 1, except that 25% by volume of a C$_2$H$_6$ gas as a hydrocarbon gas for the second layer was substituted by a CH$_4$ gas as shown in Table 16, and subjected to cutting evaluation. The results are shown in Table 16.

EXAMPLE 41

A hard-coated insert was produced in the same manner as in Example 1, except that 45% by volume of a C$_2$H$_6$ gas as a hydrocarbon gas for the second layer was substituted by a CH$_4$ gas as shown in Table 16, and subjected to cutting evaluation. The results are shown in Table 16.

COMPARATIVE EXAMPLE 9

A hard-coated insert was produced in the same manner as in Example 1 except for changing the hydrocarbon gas for the second layer to a CH$_4$ gas as shown in Table 16, and subjected to cutting evaluation. The results are shown in Table 16.

TABLE 16

| No. | Composition of Starting Material Gas for Second Layer (% by volume) | | | | | | Hydrocarbon Gas/ Conc. | Evaluation of Cutting | Life[2] |
|---|---|---|---|---|---|---|---|---|---|
| | $H_2$ | $N_2$ | $TiCl_4$ | $CH_3CN$ | $C_2H_6$ | $CH_4$ | Peeling[1] | (minute) | |
| Ex. 1 | 81.3 | 15.0 | 1.5 | 1.0 | 1.2 | — | No | 20 | |
| Ex. 40 | 81.3 | 15.0 | 1.5 | 1.0 | 0.9 | 0.3 | No | 16 | |
| Ex. 41 | 81.3 | 15.0 | 1.5 | 1.0 | 0.6 | 0.6 | No | 11 | |
| Com. Ex. 9 | 81.3 | 15.0 | 1.5 | 1.0 | — | 1.2 | Yes | 1 | |

Note:
[1]Peeled or not after cutting for 2 minutes.
[2]Tool life.

As is clear from Table 16, the hard-coated inserts of Examples 40 and 41 produced with a $C_2H_6$ gas substituted by a $CH_4$ gas by 25% by volume and 45% by volume, respectively, in the hydrocarbon gas for the second layer, had good cutting performance. On the other hand, the hard-coated insert of Comparative Example 9 produced with a $CH_4$ gas 100% by volume as a hydrocarbon gas in the starting material gas for the second layer had a short life.

EXAMPLE 42

Figure 10A:
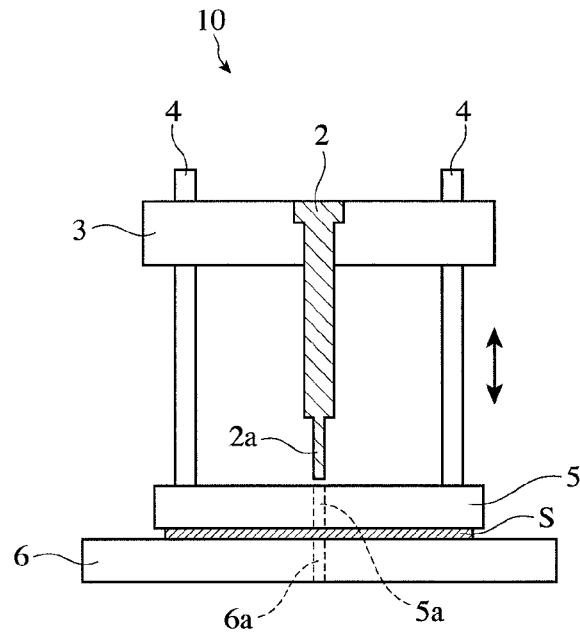
FIG. 10(a) is a schematic view showing one example of the hard-coated mold of the present invention, in which a punch is in a lifted state.
Figure 10B:
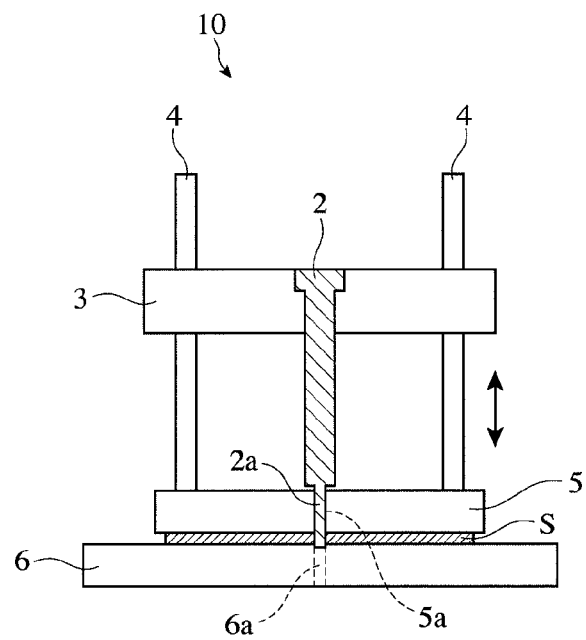
FIG. 10(b) is a schematic view showing one example of the hard-coated mold of the present invention, in which a punch is at a lower position.

FIGS. 10(a) and 10(b) show one example of the hard-coated molds 10 of the present invention. This hard-coated mold 10 comprises a punch 2, a horizontal member 3 to which the punch 2 is fixed, a pair of guide pins 4, 4 for moving the horizontal member 3 up and down at a predetermined speed with high precision, an upper mold 5 comprising a center hole 5a having a diameter of 0.15 mm, into which a tip end portion 2a of the punch 2 penetrates, and a lower mold 6 comprising a center hole 6a having a diameter of 0.15 mm, which a tip end portion 2a of the punch 2 enters. A substrate for the punch 2 was formed by the same cemented carbide as in Example 1, and the cemented carbide punch substrate was provided with the same titanium carbonitride layer comprising the first to third layers, bonding layer and aluminum oxide layer as in Example 1.

After one punching shot comprising punching a thin plate S made of SUS304 and having a thickness of 0.2 mm, which was fixed between the upper mold 5 and the lower mold 6, by the punch 2, and moving the thin plate S by a predetermined distance in a perpendicular direction on the paper of FIG. 10(a), was continuously conducted 5000 times, the peeling of the hard coating in the tip end portion 2a of the punch 2 was observed by an optical microscope with magnification of 100 times. The results are shown in Table 17.

EXAMPLE 43

A hard-coated mold was produced in the same manner as in Example 42 except for changing a substrate of the punch 2 to high-speed steel (SKH57), and the peeling of the hard coating in a tip end portion 2a of the punch 2 was observed. The results are shown in Table 17.

COMPARATIVE EXAMPLE 10

A hard-coated mold was produced in the same manner as in Example 42 except for forming the same hard coating as in Comparative Example 1, and the peeling of the hard coating in a tip end portion 2a of the punch 2 was observed. The results are shown in Table 17.

COMPARATIVE EXAMPLE 11

A hard-coated mold was produced in the same manner as in Example 43 except for forming the same hard coating as in Comparative Example 1, and the peeling of the hard coating in a tip end portion 2a of the punch 2 was observed. The results are shown in Table 17.

TABLE 17

| No. | Substrate Material of Punch | Peeling of Hard Coating |
|---|---|---|
| Ex. 42 | Cemented Carbide | No |
| Ex. 43 | High-Speed Steel | No |
| Com. Ex. 10 | Cemented Carbide | Yes |
| Com. Ex. 11 | High-Speed Steel | Yes |

It is clear from Table 17 that the hard coating of Example 1 peeled neither from the cemented carbide punch substrate (Example 42) nor from the high-speed steel punch substrate (Example 43), and that the hard coating of Comparative Example 1 peeled from both of the cemented carbide punch substrate (Comparative Example 10) and the high-speed steel punch substrate (Comparative Example 11).

EXAMPLE 44

With the same cemented carbide insert substrate with honed cutting edges as in Example 1 disposed in the CVD chamber, a starting material gas at 900° C. and 16 kPa, which comprised 0.5% by volume of a $TiCl_4$ gas, 33.0% by volume of an $N_2$ gas, and 66.5% by volume of an $H_2$ gas, was supplied to the CVD chamber at a flow rate of 6300 ml/minute, to form a TiN layer having an average thickness of 0.03 μm on the insert substrate. Continuously, a titanium carbonitride layer comprising the first to third layers, a bonding layer and an oxide layer were formed on the TiN layer in the same CVD chamber in the same manner as in Example 1, to obtain a hard-coated insert. The cutting performance of this hard-coated insert was evaluated in the same manner as in Example 1. The results are shown in Table 18.

EXAMPLE 45 AND COMPARATIVE EXAMPLE 12

The hard-coated inserts of Example 45 and Comparative Example 12 were produced in the same manner as in Example 44, except that the average thickness of the TiN layer between the insert substrate made of cemented carbide and the first layer were 0.1 μm and 0.5 μm, respectively, and their cutting performance was evaluated in the same manner as in Example 1. The results are shown in Table 18.

TABLE 18

| No. | Average Thickness of TiN Layer (μm) | Evaluation of Cutting Peeling[1] | Life[2] (minute) |
|---|---|---|---|
| Ex. 1 | 0 | No | 20 |
| Ex. 44 | 0.03 | No | 21 |
| Ex. 45 | 0.1 | No | 22 |
| Com. Ex. 12 | 0.5 | Yes | 5 |

Note:
[1]Peeled or not after cutting for 2 minutes.
[2]Tool life.

As is clear from Table 18, the hard-coated inserts of Examples 44 and 45 each having a TiN layer having an average thickness of 0.03-0.1 μm between the insert substrate and the first layer had longer lives than that of the hard-coated insert of Example 1. On the other hand, the hard-coated insert of Comparative Example 12 provided with a 0.5-μm-thick TiN layer had a short life. This indicates that the formation of as thin a TiN layer as 0.03-0.1 μm under the first layer increases the adhesion of the first layer to the insert substrate, thereby increasing the life of the hard-coated insert.

EXAMPLE 46

(1) Formation of Titanium Carbonitride Layer Comprising First to Third Layers and Second Upper Layer A turning insert substrate (CNMG120412) made of cemented carbide comprising 6% by mass of Co, the balance being WC and inevitable impurities, was honed in cutting edge portions. With this insert substrate disposed in a CVD chamber, the temperature in the CVD chamber was elevated to 850° C. while flowing an $H_2$ gas. A 1-μm-thick first layer was first formed by a chemical vapor deposition method, by supplying a starting material gas at 850° C. and 10 kPa, which comprised 66.0% by volume of an $H_2$ gas, 32.2% by volume of an $N_2$ gas, 0.5% by volume of a $TiCl_4$ gas, and 1.3% by volume of a $C_2H_6$ gas, at a flow rate of 6100 ml/minute to the CVD chamber. A 3-μm-thick second layer was then continuously formed by a chemical vapor deposition method, by supplying a starting material gas at 850° C. and 8 kPa, which comprised 81.3% by volume of an $H_2$ gas, 15.0% by volume of an $N_2$ gas, 1.5% by volume of a $TiCl_4$ gas, 1.0% by volume of a $CH_3CN$ gas, and 1.2% by volume of a $C_2H_6$ gas, at a flow rate of 6700 ml/minute to the CVD chamber. Further, a 2-μm-thick third layer was continuously formed by a chemical vapor deposition method, by supplying a starting material gas at 850° C. and 8 kPa, which comprised 83.0% by volume of an $H_2$ gas, 15.0% by volume of an $N_2$ gas, 1.5% by volume of a $TiCl_4$ gas, and 0.5% by volume of a $CH_3CN$ gas, at a flow rate of 6600 ml/minute to the CVD chamber.

Next, a 3-μm-thick (TiAl)N film was formed immediately on the third layer, by supplying a starting material gas at 800° C. and 5 kPa, which comprised 48.2% by volume of an $H_2$ gas, 48.2% by volume of an $N_2$ gas, 0.6% by volume of an $NH_4$ gas, 1.0% by volume of a $TiCl_4$ gas, and 2.0% by volume of an $AlCl_3$ gas, at a flow rate of 6300 ml to the CVD chamber.

(2) Measurement of Crystal Structures, Compositions and Average Transverse Cross Section Diameters of Columnar Crystal Grains in First to Third Layers With respect to the first to third layers, their crystal structures, compositions and average transverse cross section diameters of columnar crystal grains were measured in the same manner as in Example 1, obtaining substantially the same results as in Example 1.

(3) Evaluation of Performance

Using each hard-coated insert, the peeling of the hard coating and the tool life were evaluated under the turning conditions below. The peeling of the hard coating was evaluated by observing by an optical microscope with magnification of 100 times whether or not there were peeled portions on the hard coating surface after cutting for 5 minutes. The tool life was defined as the shortest time period, among a time period until the maximum wear width of a flank exceeded 0.350 mm, a time period until the hard coating peeled, and a time period until the hard coating was chipped.
Work: SUS316L,
Machining method: Continuous turning,
Cutting speed: 150 m/minute,
Feed: 0.30 mm/revolution,
Cutting depth: 1.5 mm, and
Cutting fluid: Aqueous cutting liquid.

EXAMPLE 47

After the titanium carbonitride layer comprising the first to third layers was formed on the cemented carbide insert substrate with honed cutting edges (CNMG120412) in the same manner as in Example 46, a 3-μm-thick (TiB)N film was continuously formed by supplying a starting material gas at 900° C. and 10 kPa, which comprised 48.7% by volume of an $H_2$ gas, 48.7% by volume of an $N_2$ gas, 1.0% by volume of a $TiCl_4$ gas, and 1.6% by volume of $BCl_3$ gas, at a flow rate of 6160 ml to the CVD chamber.

EXAMPLE 48

After the titanium carbonitride layer comprising the first to third layers was formed on the cemented carbide insert substrate with honed cutting edges (CNMG120412) in the same manner as in Example 46, a 3-μm-thick (TiSi)N film was continuously formed by supplying a starting material gas at 1100° C. and 5 kPa, which comprised 48.4% by volume of an $H_2$ gas, 48.4% by volume of an $N_2$ gas, 0.6% by volume of an $NH_4$ gas, 1.0% by volume of a $TiCl_4$ gas, and 1.6% by volume of an $SiCl_4$ gas, at a flow rate of 6200 ml to the CVD chamber.

EXAMPLE 49

After the titanium carbonitride layer comprising the first to third layers was formed on the cemented carbide insert substrate with honed cutting edges (CNMG120412) in the same manner as in Example 46, a 3-μm-thick TiN film was continuously formed by supplying a starting material gas at 950° C. and 12 kPa, which comprised 49.5% by volume of an $H_2$ gas, 49.5% by volume of an $N_2$ gas, and 1.0% by volume of a $TiCl_4$ gas, at a flow rate of 6060 ml to the CVD chamber.

EXAMPLE 50

After the titanium carbonitride layer comprising the first to third layers was formed on the cemented carbide insert substrate with honed cutting edges (CNMG120412) in the same manner as in Example 46, a 3-μm-thick TiC film was continuously formed by supplying a starting material gas at 1000° C. and 9 kPa, which comprised 91.6% by volume of an $H_2$ gas, 7.4% by volume of a $CH_4$ gas, and 1.0% by volume of a $TiCl_4$ gas, at a flow rate of 5460 ml to the CVD chamber.

EXAMPLE 51

After the titanium carbonitride layer comprising the first to third layers was formed on the cemented carbide insert substrate with honed cutting edges (CNMG120412) in the same manner as in Example 46, a 3-μm-thick Ti(CN) film was continuously formed by supplying a starting material gas at 1000° C. and 12 kPa, which comprised 46.4% by volume of an $H_2$ gas, 46.4% by volume of an $N_2$ gas, 6.2% by volume of a $CH_4$ gas, and 1.0% by volume of a $TiCl_4$ gas, at a flow rate of 6460 ml to the CVD chamber.

EXAMPLE 52

After the titanium carbonitride layer comprising the first to third layers was formed on the cemented carbide insert substrate with honed cutting edges (CNMG120412) in the same manner as in Example 46, a 3-μm-thick TiZr(CN) film was continuously formed by supplying a starting material gas at 1000° C. and 12 kPa, which comprised 48.2% by volume of an $H_2$ gas, 48.1% by volume of an $N_2$ gas, 0.6% by volume of a $CH_3CN$ gas, 2.1% by volume of a $ZrCl_4$ gas, and 1.0% by volume of a $TiCl_4$ gas, at a flow rate of 6230 ml to the CVD chamber.

EXAMPLE 53

After the titanium carbonitride layer comprising the first to third layers was formed on the cemented carbide insert substrate with honed cutting edges (CNMG120412) in the same manner as in Example 46, a 3-μm-thick TiAl(CN) film was continuously formed by supplying a starting material gas at 800° C. and 5 kPa, which comprised 47.9% by volume of an $H_2$ gas, 47.8% by volume of an $N_2$ gas, 0.6% by volume of an $NH_4$ gas, 0.6% by volume of a $CH_3CN$ gas, 2.1% by volume of an $AlCl_3$ gas, and 1.0% by volume of a $TiCl_4$ gas, at a flow rate of 6270 ml to the CVD chamber.

EXAMPLE 54

After the titanium carbonitride layer comprising the first to third layers was formed on the cemented carbide insert substrate with honed cutting edges (CNMG120412) in the same manner as in Example 46, a 3-μm-thick TiSi(CN) film was continuously formed by supplying a starting material gas at 1050° C. and 5 kPa, which comprised 47.9% by volume of an $H_2$ gas, 47.8% by volume of an $N_2$ gas, 0.6% by volume of an $NH_4$ gas, 0.6% by volume of a $CH_3CN$ gas, 2.1% by volume of an $SiCl_4$ gas, and 1.0% by volume of a $TiCl_4$ gas, at a flow rate of 6400 ml to the CVD chamber.

EXAMPLE 55

After the titanium carbonitride layer comprising the first to third layers was formed on the cemented carbide insert substrate with honed cutting edges (CNMG120412) in the same manner as in Example 46, a 3-μm-thick TiB(CN) film was continuously formed by supplying a starting material gas at 850° C. and 5 kPa, which comprised 48.8% by volume of an $H_2$ gas, 47.8% by volume of an $N_2$ gas, 1.0% by volume of a $CH_3CN$ gas, 1.1% by volume of $BCl_3$ gas, and 1.3% by volume of a $TiCl_4$ gas, at a flow rate of 6160 ml to the CVD chamber.

EXAMPLE 56

After the titanium carbonitride layer comprising the first to third layers was formed on the cemented carbide insert substrate with honed cutting edges (CNMG120412) in the same manner as in Example 46, a 3-μm-thick TiAlSi(CN) film was continuously formed by supplying a starting material gas at 1050° C. and 5 kPa, which comprised 47.3% by volume of an $H_2$ gas, 47.3% by volume of an $N_2$ gas, 0.6% by volume of an $NH_4$ gas, 0.6% by volume of a $CH_3CN$ gas, 1.6% by volume of an $AlCl_3$ gas, 1.6% by volume of an $SiCl_4$ gas, and 1.0% by volume of a $TiCl_4$ gas, at a flow rate of 6340 ml to the CVD chamber.

EXAMPLE 57

After the titanium carbonitride layer comprising the first to third layers was formed on the cemented carbide insert substrate with honed cutting edges (CNMG120412) in the same manner as in Example 46, a 3-μm-thick TiCr(CN) film was continuously formed by supplying a starting material gas at 900° C. and 5 kPa, which comprised 48.6% by volume of an $H_2$ gas, 48.2% by volume of an $N_2$ gas, 0.6% by volume of a $CH_3CN$ gas, 1.6% by volume of a $CrCl_3$ gas, and 1.0% by volume of a $TiCl_4$ gas, at a flow rate of 6600 ml to the CVD chamber.

EXAMPLE 58

After the titanium carbonitride layer comprising the first to third layers was formed on the cemented carbide insert substrate with honed cutting edges (CNMG120412) in the same manner as in Example 46, a 3-μm-thick TiV(CN) film was continuously formed by supplying a starting material gas at 950° C. and 5 kPa, which comprised 48.6% by volume of an $H_2$ gas, 48.2% by volume of an $N_2$ gas, 0.6% by volume of a $CH_3CN$ gas, 1.6% by volume of $VCl_3$ gas, and 1.0% by volume of a $TiCl_4$ gas, at a flow rate of 6400 ml to the CVD chamber.

EXAMPLE 59

After the titanium carbonitride layer comprising the first to third layers was formed on the cemented carbide insert substrate with honed cutting edges (CNMG120412) in the same manner as in Example 46, a 3-μm-thick CrC film was continuously formed by supplying a starting material gas at 950° C. and 9 kPa, which comprised 91.6% by volume of an $H_2$ gas, 7.4% by volume of a $CH_4$ gas, and 1.0% by volume of $CrCl_3$ gas, at a flow rate of 6060 ml to the CVD chamber.

EXAMPLE 60

After the first layer was formed on the cemented carbide insert substrate with honed cutting edges (CNMG120412) in the same manner as in Example 46, a 3-μm-thick second layer was continuously formed by a chemical vapor deposition method by supplying a starting material gas at 850° C. and 8 kPa, which comprised 80.3% by volume of an $H_2$ gas, 15.0% by volume of an $N_2$ gas, 1.5% by volume of a $TiCl_4$ gas, 1.0% by volume of a $CH_3CN$ gas, 1.0% by volume of a $CH_4$ gas, and 1.2% by volume of a $C_2H_6$ gas, at a flow rate of 6700 ml/minute to the CVD chamber. Further, a third layer and a (TiAl)N film were continuously formed in the same manner as in Example 46.

With respect to each hard-coated insert of Examples 47-60, the evaluation of cutting was conducted in the same manner as in Example 46. The evaluation results of cutting with each hard-coated insert of Examples 46-60 are shown in Table 19.

TABLE 19

| | | Evaluation of Cutting | |
|---|---|---|---|
| No. | Second Upper Layer | Peeling[1] | Life[2] (minute) |
| Ex. 46 | (TiAl)N | No | 30 |
| Ex. 47 | (TiB)N | No | 20 |
| Ex. 48 | (TiSi)N | No | 23 |
| Ex. 49 | TiN | No | 22 |
| Ex. 50 | TiC | No | 20 |
| Ex. 51 | Ti(CN) | No | 22 |
| Ex. 52 | TiZr(CN) | No | 28 |
| Ex. 53 | TiAl(CN) | No | 28 |
| Ex. 54 | TiSi(CN) | No | 24 |
| Ex. 55 | TiB(CN) | No | 20 |
| Ex. 56 | TiAlSi(CN) | No | 28 |
| Ex. 57 | TiCr(CN) | No | 22 |
| Ex. 58 | TiV(CN) | No | 22 |
| Ex. 59 | CrC | No | 24 |
| Ex. 60 | (TiAl)N | No | 30 |

Note:
[1]Peeled or not after cutting for 5 minutes.
[2]Tool life.

As is clear from Table 19, each hard-coated insert of Examples 46-60 having the TiC film, the TiN film, the (TiAl)N film, the (TiSi)N film, the (TiB)N film, the Ti(CN) film, the TiZr(CN) film, the TiAl(CN) film, the TiSi(CN) film, the TiCr(CN) film, the TiV(CN) film, the TiAlSi(CN) film, the TiB(CN) film, or the CrC film, which was formed as the second upper layer immediately on the third layer, had a long life.

EXAMPLE 61

With the same insert substrate (CNMG120412) as shown in Example 46 disposed in the CVD chamber, a TiN layer having an average thickness of 0.04 μm was formed on the substrate, by supplying a starting material gas at 900° C. and 16 kPa, which comprised 0.5% by volume of a TiCl$_4$ gas, 33.0% by volume of an N$_2$ gas, and 66.5% by volume of an H$_2$ gas, at a flow rate of 6300 ml/minute. Successively, a titanium carbonitride layer comprising first to third layers and a (TiAl)N layer were formed on the TiN layer in the same CVD chamber in the same manner as in Example 46. The cutting performance of the resultant hard-coated insert was evaluated in the same manner as in Example 46. The results are shown in Table 20

EXAMPLE 62 AND COMPARATIVE EXAMPLE 13

The hard-coated inserts of Example 62 and Comparative Example 13 were produced in the same manner as in Example 61, except for changing the average thickness of the TiN layer between the insert substrate and the first layer to 0.1 μm and 0.4 μm, respectively, and their cutting performance was evaluated in the same manner as in Example 61. The results are shown in Table 20.

TABLE 20

| | | Evaluation of Cutting | |
|---|---|---|---|
| No. | Average Thickness of TiN Layer (μm) | Peeling[1] | Life[2] (minute) |
| Ex. 46 | 0 | No | 30 |
| Ex. 61 | 0.04 | No | 31 |
| Ex. 62 | 0.1 | No | 33 |
| Com. Ex. 13 | 0.4 | Yes | 4 |

Note:
[1]Peeled or not after cutting for 2 minutes.
[2]Tool life.

As is clear from Table 20, each hard-coated insert of Examples 61 and 62 with a TiN layer having an average thickness of 0.04-0.1 μm between the substrate and the first layer had a long life. On the other hand, the hard-coated insert of Comparative Example 13 with a TiN layer having an average thickness of 0.4 μm had a short life.

EXAMPLE 63

Using a wet-blasting apparatus, cutting edge portions of the cemented carbide insert substrate (TNMG160408) were honed by blasting an abrasive liquid containing alumina abrasive particles having an average particle size of 50 μm in a concentration of 20% by mass. Thereafter, a titanium carbonitride layer comprising first to third layers, a bonding layer and an aluminum oxide layer were formed in the same manner as in Example 1, and their properties and performance were evaluated.

TABLE 21

| No. | Substrate | Honing | TiCN Layer | d[1] (μm) | Hardness (GPa) | Peeling[3] | Life[4] (minute) |
|---|---|---|---|---|---|---|---|
| Ex. 1 | TNMG160408 | Brushing | First Layer | 0.07 | —[2] | No | 20 |
| | | | Second Layer | 0.07 | 37 | | |
| | | | Third Layer | 0.08 | 37 | | |
| Ex. 63 | TNMG160408 | Blasting | First Layer | 0.30 | —[2] | No | 16 |
| | | | Second Layer | 0.31 | 33 | | |
| | | | Third Layer | 0.31 | 35 | | |
| Com. Ex. 7 | TNMG160408 | Brushing | First Layer | 0.08 | —[2] | Yes | 2 |
| | | | — | — | — | | |
| | | | Third Layer | 0.30 | 28 | | |

Note:
[1]Average transverse cross section diameter
[2]Could not be measured.
[3]Peeled or not after cutting for 2 minutes.
[4]Tool life.

As is clear from Table 21, the first to third layers in Example 1 using brushing for honing had fine crystal grains, resulting in high hardness, and thus having a longer life than that of the hard-coated insert of Example 63, in which wet blasting was used for honing. On the other hand, the hard-coated insert of Comparative Example 7 had a short life, because of the peeling of the hard coating.

EXAMPLE 64

Figure 11A:
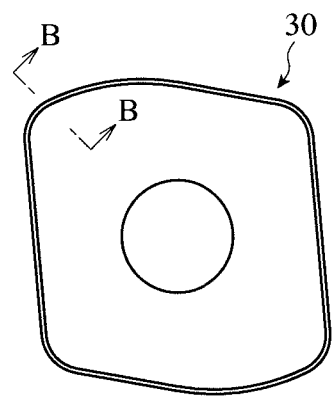
FIG. 11(a) is a plan view schematically showing a milling insert substrate.
Figure 11B:
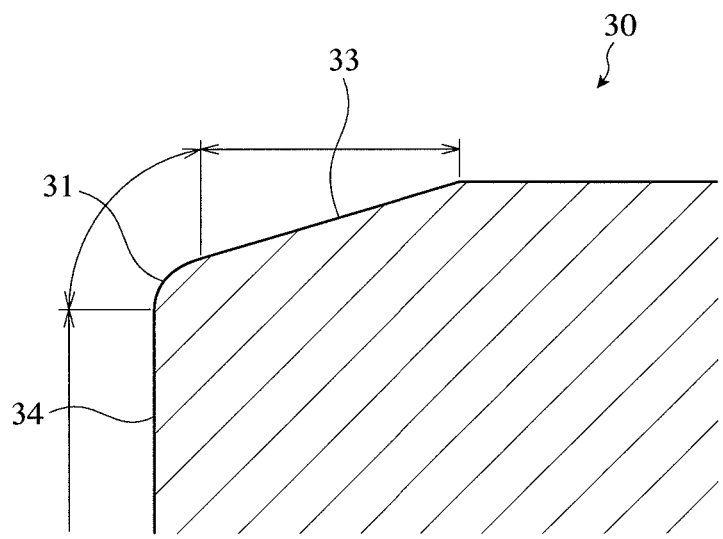
FIG. 11(b) is a cross-sectional view taken along the line B-B in FIG. 11(a).

In the milling insert substrate (EDNW15T4TN-15) 30 schematically shown in FIGS. 11(a) and 11(b), which was formed by cemented carbide comprising 11% by mass of Co and 2% by mass TaC, the balance being WC and inevitable impurities, its cutting edge portions 31 were honed by a diamond brush. Incidentally, 33 represents a land, and 34 represents a flank.

Figure 12:
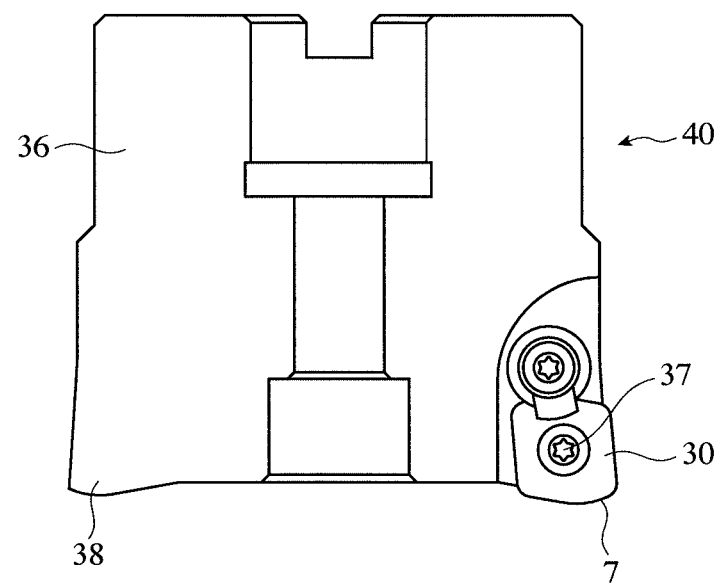
FIG. 12 is a schematic view showing a shell milling cutter (indexable rotary tool).

With this insert substrate disposed in a CVD chamber, a titanium carbonitride layer comprising a first layer, a second layer having a thickness of 4 µm and a third layer, a bonding layer and an α-aluminum oxide layer were formed under the same conditions as in Example 1. Each of five hard-coated inserts 30 with a main cutting edge 7 thus formed was attached to a tip end portion 38 of a tool body 36 of a shell milling cutter (indexable rotary tool, ASR 5080-5) 40 as shown in FIG. 12 with a setscrew 37, to evaluate the peeling of the hard coating and the tool life under the milling conditions described below. The fastening of the insert 30 can be conducted by known fastening means such as clamping wedges, etc. The peeling of the hard coating was evaluated by observation by an optical microscope with magnification of 100 times as to whether or not there were peeled portions in the hard coating after cutting for 100 minutes. The tool life was defined as a time period of machining conducted until the maximum wear width of a flank exceeded 0.350 mm, until the hard coating peeled, or until the hard coating was chipped. The results are shown in Table 22.

Work: S55C (A),
Cutting speed: 160 m/minute,
Feed per one edge: 2.0 mm/tooth,
Longitudinal cutting depth: 2.0 mm,
Radial cutting depth: 60 mm, and
Cutting fluid: No (dry machining).

COMPARATIVE EXAMPLE 14

The same titanium nitride layer, titanium carbonitride layer, bonding layer and α-aluminum oxide layer as in Comparative Example 7 were formed on a honed insert substrate (EDNW15T4TN-15) 30 in the same manner as in Example 64. Each of five hard-coated inserts 30 produced was attached to a shell milling cutter (indexable rotary tool, ASR 5080-5) 40, to evaluate the peeling of the hard coating and the tool life in the same manner as in Example 64. The results are shown in Table 22.

TABLE 22

| No. | Peeling[1] | Life[2] (minute) |
| --- | --- | --- |
| Ex. 64 | No | 480 |
| Com. Ex. 14 | Yes | 150 |

Note:
[1]Peeled or not after cutting for 100 minutes.
[2]Insert life.

As is clear from Table 22, in the case of a milling insert, too, the hard-coated insert of Example 64 provided with the same titanium carbonitride layer as in Example 1 had a longer life than that of the hard-coated insert of Comparative Example 14 provided with the same titanium carbonitride layer as in Comparative Example 7.

Effect of the Invention

The hard-coated member of the present invention comprising a titanium carbonitride layer formed on a substrate of cemented carbide or high-speed steel by a chemical vapor deposition method has excellent wear resistance without the peeling of the hard coating from the substrate and the peeling of the upper layer from the titanium carbonitride layer, because the titanium carbonitride layer comprises the first layer having high adhesion to the substrate, the second layer having high hardness and wear resistance, and the third layer having high adhesion to the upper layer.

Description of Numerical References

2 Punch,
3 Horizontal member,
4, 4 Guide pins,
5 Upper mold,
5a Center hole of upper mold,
6 Lower mold,
6a Center hole of lower mold,
7 Main cutting edge of insert,
10 Mold,
S Thin plate,
20 Turning insert substrate,
21 Cutting edge portion of turning insert substrate,
23 Land of turning insert substrate,
24 Flank of turning insert substrate,
30 Milling insert,
31 Cutting edge portion of milling insert substrate,
33 Land of milling insert substrate,
34 Flank of milling insert substrate,
36 Tool body,
37 Setscrew for insert,
38 Tip end portion of insert, and
40 Shell milling cutter (indexable rotary tool).

What is claimed is:

1. A hard-coated member comprising a substrate made of cemented carbide or high-speed steel, and a hard coating formed on said substrate by a chemical vapor deposition method, said hard coating comprising a titanium carbonitride layer comprising first to third layers each having a columnar crystal structure and an upper layer in this order from the side of said substrate, and an average transverse cross section diameter of columnar crystals being 0.01-0.2 µm in any of said first to third layers, wherein a peak of X-ray diffraction of a (422) plane in said titanium carbonitride layer is in a 2θ range of 122.7-124.0°, (a) in said titanium carbonitride layer, said first layer having a carbon concentration of 13-22% by mass, said second layer having a carbon concentration of 12-21% by mass, said third layer having a carbon concentration of 9-15% by mass, the carbon concentration in said second layer being lower than the carbon concentration in said first layer by 0.1% or more by mass, and the carbon concentration in said third layer being lower than the carbon concentration in said second layer by 0.5% or more by mass;

(b) said upper layer being (i) a bonding layer formed on said third layer, and a hard oxide layer of Al and/or Cr formed on said bonding layer, or (ii) a hard layer formed on said third layer and comprising Ti and/or Cr, and C and/or N as indispensable elements, and at least one element selected from the group consisting of Al, Si, B, Zr and V as an optional element.

2. The hard-coated member according to claim 1, wherein said first layer is made of titanium carbonitride comprising 68-84.5% by mass of titanium, 13-22% by mass of carbon and 2.5-10% by mass of nitrogen; wherein said second layer is made of titanium carbonitride comprising 69-85.5% by mass of titanium, 12-21% by mass of carbon and 2.5-10% by mass of nitrogen; wherein said third layer is made of titanium carbonitride comprising 71-86% by mass of titanium, 9-15% by mass of carbon and 5-14% by mass of nitrogen.

3. The hard-coated member according to claim 2, wherein an atomic ratio C/(C +N) of the carbon concentration (C) to the total (C +N) of the carbon concentration (C) and the nitrogen concentration (N) is 0.65-0.9 in said first layer, 0.65-0.85 in said second layer, and 0.5-0.7 in said third layer, C/(C +N) in the third layer being smaller by 0.05-0.3 than C/(C +N) in the second layer.

4. The hard-coated member according to claim 1, wherein each of said second and third layers has a thickness of 1 μm or more.

5. The hard-coated member according to claim 4, wherein said first layer has a thickness of 0.01-2 μm, said second layer has a thickness of 1-20 μm, and said third layer has a thickness of 1-10 μm.

6. The hard-coated member according to claim 1, wherein part of Ti in said second layer and/or said third layer is substituted by at least one metal element selected from the group consisting of Zr, V, Cr, Si, B and Al in a proportion of 0.2-10% by mass to 100% by mass of said second or third layer.

7. The hard-coated member according to claim 1, wherein columnar crystals in at least said second layer comprise, by mass ratio, crystal grains having a composition represented by $Ti a_1(C x_1 N y_1) b_1$, wherein $a_1 = 0.55$-$0.85$, $a_1 + b_1 = 1$, $x_1 = 0.5$-$0.8$, and $x_1 + y_1 = 1$, and crystal grain boundaries having a composition represented by $Ti a_2(C x_2 N y_2) b_2$, wherein $a_2 = 0.3$-$0.6$, $a_2 + b_2 = 1$, $\dot{x}_2 = 0.6$-$0.9$, and $x_2 + y_2 = 1$, meeting $0.2 < x_1 b_1 / x_2 b_2 \leq 0.6$.

8. The hard-coated member according to claim 1, wherein said bonding layer indispensably comprises at least one element selected from the group consisting of Ti, Al, B and Zr, and at least one element selected from the group consisting of C, N and O.

9. The hard-coated member according to claim 1, wherein said hard-coated member is an insert or a mold-constituting member.

10. A method for producing a hard-coated member by a chemical vapor deposition method, said hard-coated member comprising a substrate made of cemented carbide or high-speed steel, and a hard coating formed on said substrate and comprising a titanium carbonitride layer comprising first to third layers each having a columnar crystal structure in this order from the side of said substrate, said first layer having a carbon concentration of 13-22% by mass, said second layer having a carbon concentration of 12-21% by mass, said third layer having a carbon concentration of 9-15% by mass, the carbon concentration in said second layer being lower than the carbon concentration in said first layer by 0.1% or more by mass, and the carbon concentration in said third layer being lower than the carbon concentration in said second layer by 0.5% or more by mass, and an average transverse cross section diameter of columnar crystals being 0.01-0.2 μm in any of said first to third layers, wherein a peak of X-ray diffraction of a (422) plane in said titanium carbonitride layer is in a 2θ range of 122.7-124.0°, said method comprising the steps of
(1) forming said first layer at 750-880° C. by using a starting material gas comprising 0.2-1% by volume of a $TiCl_4$ gas, 20-60% by volume of an $N_2$ gas, and 0.8-3% by volume of a $C_2$-$C_5$ hydrocarbon gas, the balance being an $H_2$ gas;
(2) forming said second layer at 750-880° C. by using a starting material gas comprising 1-3% by volume of a $TiCl_4$ gas, 10-30% by volume of an $N_2$ gas, 0.2-2% by volume of an organic cyanide gas, and 0.5-2.5% by volume of a $C_2$-$C_5$ hydrocarbon gas which may contain a $CH_4$ gas in a proportion of less than 50% by volume, the balance being an $H_2$ gas; and
(3) forming said third layer at 750-880° C. by using a starting material gas comprising 0.8-3% by volume of a $TiCl_4$ gas, 10-30% by volume of an $N_2$ gas, and 0.1-1.2% by volume of an organic cyanide gas, the amount of said organic cyanide gas being smaller than in said step (2) by 0.1% or more by volume, the balance being an $H_2$ gas.

11. The method for producing a hard-coated member according to claim 10, wherein cutting edge portions of said substrate are honed.

12. The method for producing a hard-coated member according to claim 10, wherein said organic cyanide is $CH_3CN$.

13. The method for producing a hard-coated member according to claim 10, wherein the amount of a $C_2$-$C_5$ hydrocarbon gas in said step (1) is more than in said step (2).

14. The method for producing a hard-coated member according to claim 10, wherein the reaction pressure is 5-20 kPa in said step (1), 5-10 kPa in said step (2), and 5-10 kPa in said step (3).

15. The method for producing a hard-coated member according to claim 10, wherein part of the $TiCl_4$ gas in a starting material gas for forming said second layer and/or said third layer is substituted by a chloride gas of at least one metal element selected from the group consisting of Zr, V, Cr, Si, B and Al in a proportion of 0.2-10% by volume to 100% by volume of said starting material gas.

16. An indexable rotary tool comprising a tool body and pluralities of inserts fixed to said tool body, each of said inserts comprising a substrate made of cemented carbide or high-speed steel, and a hard coating formed on said substrate by a chemical vapor deposition method, said hard coating comprising a titanium carbonitride layer comprising first to third layers each having a columnar crystal structure and an upper layer in this order from the side of said substrate, and an average transverse cross section diameter of columnar crystals being 0.01-0.2 μm in any of said first to third layers, wherein a peak of X-ray diffraction of a (422) plane in said titanium carbonitride layer is in a 2θ range of 122.7-124.0°,
(a) in said titanium carbonitride layer, said first layer having a carbon concentration of 13-22% by mass, said second layer having a carbon concentration of 12-21% by mass, said third layer having a carbon concentration of 9-15% by mass, the carbon concentration in said second layer being lower than the carbon concentration in said first layer by 0.1% or more by mass, and the carbon concentration in said third layer being lower than the carbon concentration in said second layer by 0.5% or more by mass; and
(b) said upper layer being (i) a bonding layer formed on said third layer, and a hard oxide layer of Al and/or Cr formed on said bonding layer, or (ii) a hard layer formed on said third layer and comprising Ti and/or Cr, and C and/or N as indispensable elements, and at least one element selected from the group consisting of Al, Si, B, Zr and V as an optional element.

* * * * *